United States Patent [19]

Ishida et al.

[11] Patent Number: 5,926,466
[45] Date of Patent: Jul. 20, 1999

[54] TIME DIVISION MULTIPLE ACCESS FDD WIRELESS UNIT AND TIME DIVISION MULTIPLE ACCESS FDD/TDD DUAL MODE WIRELESS UNIT

[75] Inventors: Kaoru Ishida, Shijyonawate; Hiroaki Kosugi, Hirakata; Fujio Sasaki; Yoichi Morinaga, both of Yokohama, all of Japan

[73] Assignee: Matsushita Electric Industrial Co., Ltd., Osaka, Japan

[21] Appl. No.: 08/648,416

[22] Filed: May 15, 1996

[30] Foreign Application Priority Data

| May 24, 1995 | [JP] | Japan | 7-124746 |
| May 16, 1995 | [JP] | Japan | 7-117536 |
| Jun. 6, 1995 | [JP] | Japan | 7-139075 |
| Jun. 20, 1995 | [JP] | Japan | 7-152872 |

[51] Int. Cl.$^6$ .................. H04B 1/56; H04J 4/00; H04L 5/14
[52] U.S. Cl. .................. 370/280; 370/281; 370/347
[58] Field of Search .................. 370/280, 281, 370/294, 295, 329, 330, 337, 344, 347; 331/34, 165; 455/422, 426, 450, 451

[56] References Cited

U.S. PATENT DOCUMENTS

| 4,660,002 | 4/1987 | Iijima et al. .................. 332/130 |
| 5,267,233 | 11/1993 | Bauerschmidt .................. 370/343 |
| 5,475,677 | 12/1995 | Arnold et al. .................. 370/281 |
| 5,590,173 | 12/1996 | Beasley .................. 370/281 |

FOREIGN PATENT DOCUMENTS

| 0080209 | 1/1983 | European Pat. Off. . |
| 0396123 | 11/1990 | European Pat. Off. . |
| 0641035 | 3/1995 | European Pat. Off. . |
| 2685586 | 6/1993 | France . |
| 1178957 | 10/1964 | Germany . |
| 2053852 | 5/1972 | Germany . |

OTHER PUBLICATIONS

"Digital Mobile Communication" by Shuji Kuwabara, Kagaku Shimbun–Sha, Kagaku Shinbunsha Co., Ltd., Sep. 1, 1992, pp. 62–69.

*Proceedings of the European Microwave Conference*, Folkets Hus, Sweden, Sep. 12–16, 1988, No. Conf. 18, Sep. 12, 1988, Microwave Exhibitions and Publishers Ltd., pp. 151–155, XP000185324 Gupta, R.K., et al.: "Modeling and Cad of an Ultra–Broadband Monolithic 5–Bit Digital Attenuator".

*IEEE International Solid State Circuits Conference*, vol. 37, Feb. 1, 1994, pp. 34–35, 305 XP000507050 Miyatsuji, K., et al.: "A GaAs High–Power RF Single–Pole Double–Throw Switch IC for Digital Mobile Communication System".

*Patent Abstracts of Japan*, vol. 015, No. 229 (E–1076), Jun. 11, 1991 & JP–A–03 066232 (Fujitsu Ltd.), Mar. 20, 1991.

*Primary Examiner*—Alpus H. Hsu
*Attorney, Agent, or Firm*—Smith, Gambrell & Russell; Beveridge, DeGrandi, Weilacher & Young Intellectual Property Group

[57] ABSTRACT

A time division multiple access FDD wireless unit has a first local oscillator 8 for oscillating a first frequency; a second local oscillator 12 for oscillating a second frequency; a n-times multiplier 14 for multiplying the second frequency by n; a m-times multiplier 18 for multiplying the second frequency by m; a converter 6 for transmitting frequency of difference between a reception signal and an output of the first local oscillator 8; a converter 11 for transmitting frequency of sum or difference between an output of the converter 6 and an output of the n-times multiplier 14; modulator 19 for modulating an output of the m-times multiplier 18; a converter 22 for transmitting frequency of sum of an output of the modulator 19 and the output of m-times multiplier 18.

16 Claims, 36 Drawing Sheets

FIG. I

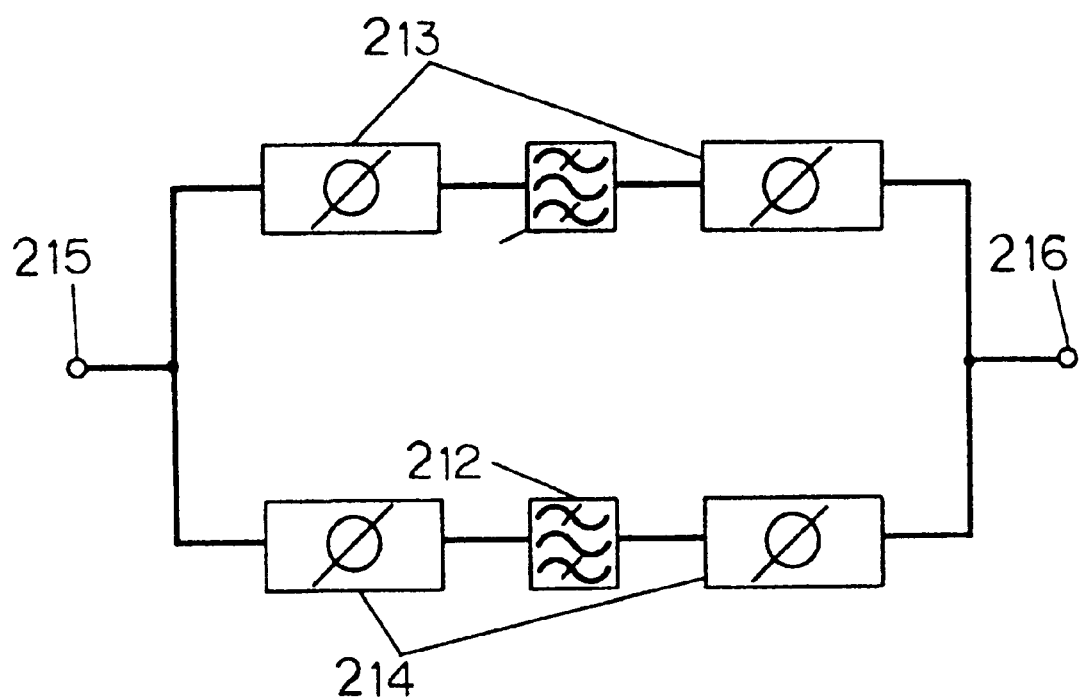
F I G. 10 input/output impedance of first band-pass filter impedance in pass band
(frequency 950 MHz)

impedance out of pass band
(frequency 1.9 GHz)

input/output impedance of second band-pass filter impedance in pass band
(frequency 1.9 GHz)

impedance out of pass band
(frequency 950 MHz)

input/output impedance of first band-pass filter
including first impedance alignment circuit impedance in pass band
(frequency 950 MHz)

impedance
out of pass band
(frequency 1.9 GHz)

input/output impedance of second band-pass filter
including second impedance alignment circuit impedance in pass band
(frequency 1.9 GHz)

impedance out of
pass band
(frequency 950 MHz)

☐ dielectric material portion
⊡ conductive portion

☐ dielectric material portion
☐ conductive portion

☐ dielectric material portion
▨ conductive portion

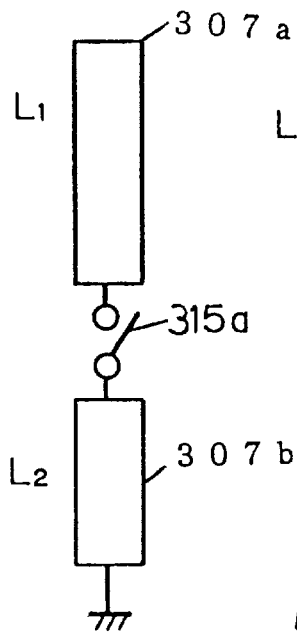
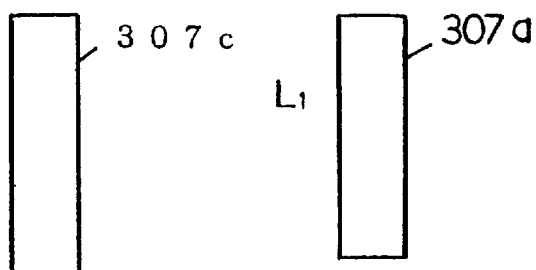
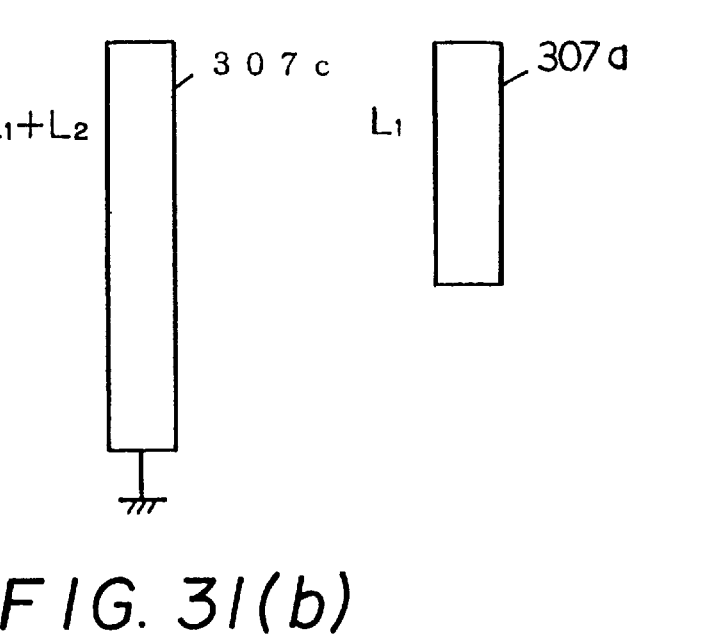
FIG. 31(a)  FIG. 31(c)
FIG. 31(b)
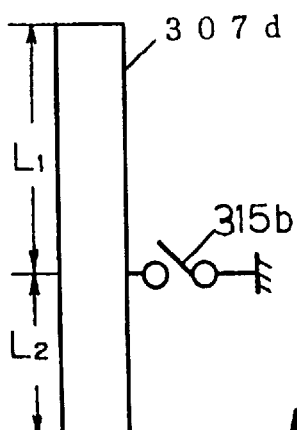
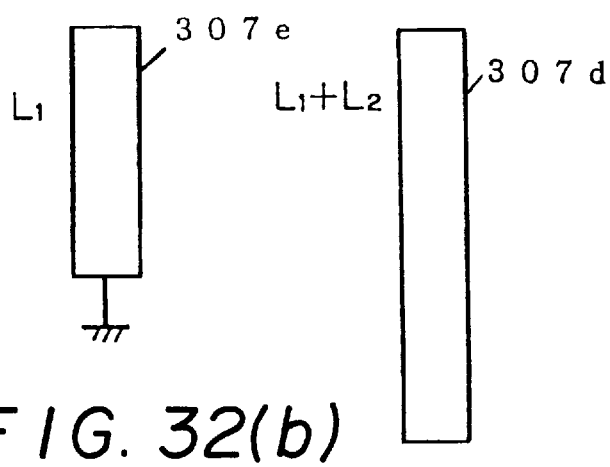
FIG. 32(a)  FIG. 32(c)
FIG. 32(b)

FIG. 38(a)
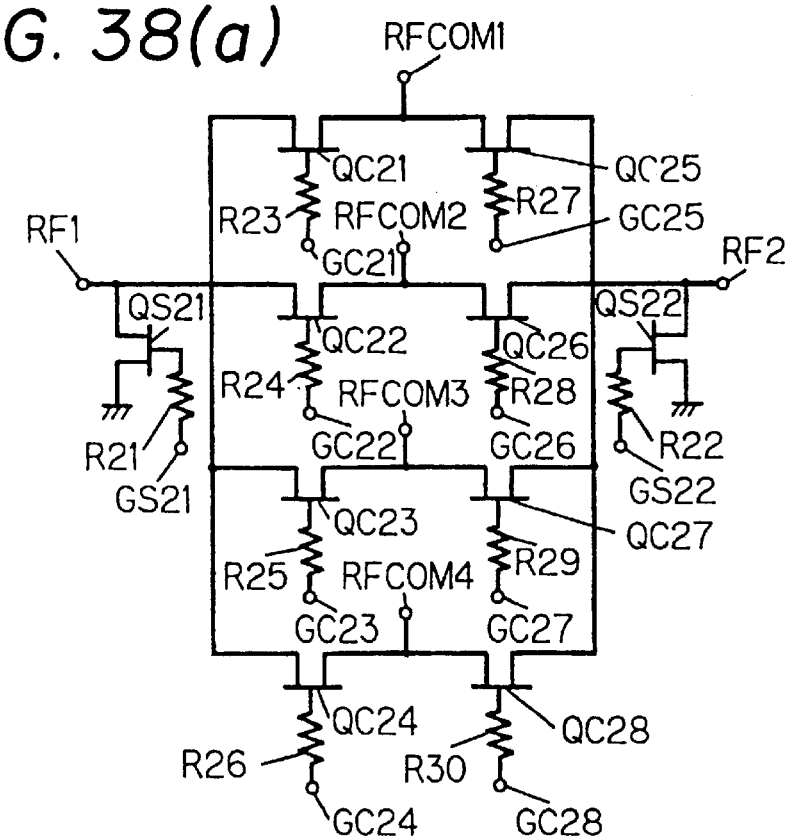
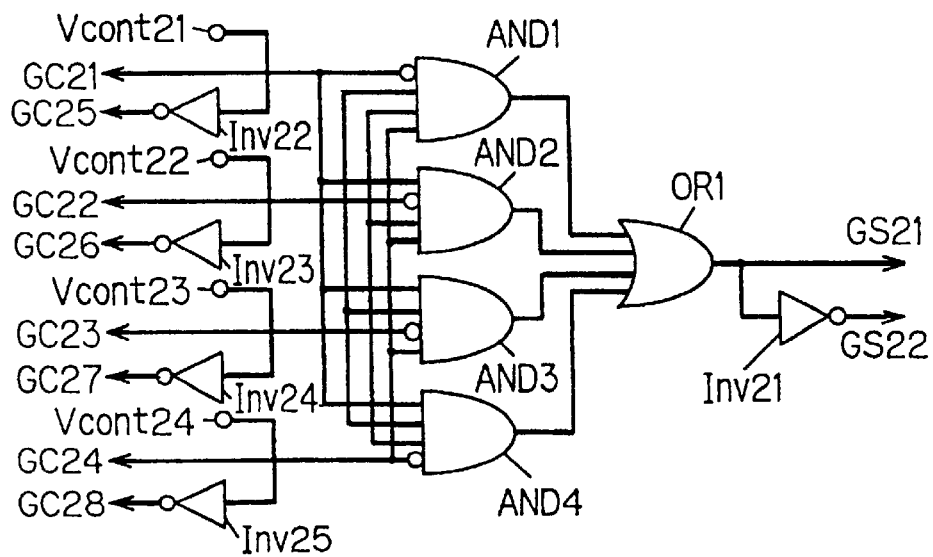
FIG. 38(b)

TIME DIVISION MULTIPLE ACCESS FDD WIRELESS UNIT AND TIME DIVISION MULTIPLE ACCESS FDD/TDD DUAL MODE WIRELESS UNIT

BACKGROUND OF THE INVENTION

1. Field of the Invention

The present invention relates a wireless unit adapted to a time division multiple access (hereinafter abbreviated as a "TDMA") for use in mobile communication, and more particularly to a TDMA wireless unit adapted to a frequency division duplex (hereinafter abbreviated to "FDD") method in which different frequencies are used in transmission and reception and to a dual mode wireless unit enabling one unit to use the FDD method and a time division duplex (hereinafter abbreviated to "TDD") method which performs separation of transmission and reception from each other by a time division manner.

Moreover, the present invention relates to a two-frequency band-pass filter, a two-frequency branching filter and a two-frequency combiner.

The present invention as well as relates to a voltage controlled oscillator with controllable frequency band capable of using at least two frequency bands by switching.

Furthermore, the present invention relates to a two-terminal to multi-common terminal matrix switch for switching flows of signals mainly in a high frequency circuit among two terminals and two or more common terminals.

2. Related Art of the Invention

In recent years mobile communication service, such as an automobile telephone, a ship telephone, an airplane telephone and a train telephone, has been desired. Thus, various communication systems have been suggested. A TDMA system, which is one of the foregoing suggested systems, is a system in which a plurality of mobile stations with respect to a base station mutually use the same frequency in a time division manner. Since the TDMA system has been disclosed in detail in, for example, "Digital Mobile Communication", issued by Kagaku Shinbunsha, supervised by Moriji Kuwahara, pp. 62 to 69, description of the TDMA system is omitted here.

A conventional TDMA wireless unit and employing the TDD system to separate transmission and reception from each other will now be described with reference to the drawing. FIG. 7 is a block diagram showing a conventional TDMA wireless unit adapted to the TDD system. Referring to FIG. 7, when a signal is received, 1895.15 MHz to 1917.95 MHz, which is the reception frequency fR for the subject station, is selected by a high-frequency band-pass filter 3, followed by being supplied to a high-frequency amplifier 4 through an antenna switch 2 connected to terminal 2r so that the received signal is amplified. Then, the selectivity of the amplified signal is further raised by a high-frequency band-pass filter 5, and then, by a converter 6, mixed with first local oscillation frequency fL1 of 1646.85 MHz to 1669.65 MHz from a first local oscillator 8 through contact 7r of a transmission/reception switch 7 so as to be converted into first intermediate frequency fR1 of 248.3 MHz. Then, the selectivity of the converted signal is raised by a first intermediate frequency band-pass filter 9, followed by being amplified by a first intermediate frequency amplifier 10. Then, the amplified signal is, by a converter 11, mixed with second local oscillation frequency fL2 of 259.1 MHz from a second local oscillator 12 so as to be converted into second intermediate frequency fR2 of 10.8 MHz. Then, the selectivity of the converted signal is raised by a second intermediate frequency band-pass filter 15, and then demodulated by a demodulator 16.

When a signal is transmitted, a carrier-wave from an oscillator 17 having a frequency of 248.3 MHz is digital-modulated with I and Q signals by a modulator 19. The modulated signal is amplified by an intermediate transmission frequency amplifier 20. Then, the selectivity of the amplified signal is raised by an intermediate transmission frequency band-pass filter 21. And then, by a converter 22, the signal is mixed with first local frequency fL1 of 1646.85 to 1669.65 MHz supplied from the first local oscillator 8 through contact 7t of the transmission/reception switch 7 so as to be converted into high-frequency signal fT which is the same frequency as that used when a signal is received. The selectivity of the high-frequency signal fT is raised by a high-frequency band-pass filter 23, and then amplified by a high-frequency amplifier 24 and a high-frequency power amplifier 25, followed by being allowed to pass through contact 2t of the antenna switch 2. Then, the selectivity of the amplified signal is raised by the high-frequency band-pass filter 3, followed by being transmitted from an antenna 1.

The reception and transmission is switched such that the antenna switch 2 and the transmission/reception switch 7 are switched at a period, which is considerably shorter than a voice signal period, so as to time-divide the transmission and reception. As a result, simultaneous transmission and reception can be performed.

A conventional TDMA wireless unit and employing the FDD system to separate transmission and reception from each other will now be described with reference to the drawings. FIG. 8 is a block diagram showing a conventional TDMA wireless unit adapted to the FDD system. Referring to FIG. 8, when a signal is received, a high-frequency signal received through an antenna 1 is allowed to pass through an antenna switch 2 connected to a terminal 2r so that reception frequency fR of 801 MHz to 826 MHz for the subject station is selected by a high-frequency band-pass filter 3, followed by being received by a high-frequency amplifier 4 so as to be amplified. Then, the selectivity of the amplified signal is further raised by a high-frequency band-pass filter 5, followed by being mixed, by a converter 6, with first local oscillation frequency fL1 of 680 MHz to 696 MHz from a first local oscillator 8 through contact 7r of a transmission/reception switch 7 so as to be converted into first intermediate frequency fR1 of 130 MHz. The selectivity of the converted signal is raised by a first intermediate frequency band-pass filter 9, and then amplified by a first intermediate amplifier 10. Then, the amplified signal is, by a converter 11, mixed with second local oscillation frequency fL2 of 129.55 MHz from a second local oscillator 12 so as to be converted into second intermediate frequency fR2 of 450 kHz, and the selectivity of the converted signal is raised by a second intermediate frequency band-pass filter 15. Then, the signal is demodulated by a demodulator 16.

When a signal is transmitted, an output from a carrier wave oscillator 17 for generating carrier wave frequency fL of 260 MHz, which is different from the first intermediate frequency fR1, is, by a modulator 19, digital-modulated with I and Q signals so that modulation wave having an intermediate transmission frequency fT1 is generated. The intermediate transmission frequency fT1 is amplified by an intermediate transmission frequency amplifier 20. The selectivity of the amplified signal is raised by an intermediate transmission frequency band-pass filter 21. And then, by a converter 22, the signal is mixed with the first local frequency fL1 supplied from the first local oscillator 8 through contact 7t of the transmission/reception switch 7 so as to be converted into a high-frequency signal having transmission frequency fT of 940 MHz to 956 MHz which is the frequency of the subject station. Then, the selectivity of the high-frequency signal is raised by a high-frequency band-pass filter 23, followed by being amplified by a high-frequency amplifier 24 and a high-frequency power amplifier 25. Then, selectivity of the amplified signal is raised by a high-frequency band-pass filter 26, followed by being allowed to pass through a contact 2t of the antenna switch 2 so as to be transmitted from the antenna 1.

Similarly to the structure shown in FIG. 7, the reception and transmission is switched such that the antenna switch 2 and the transmission/reception switch 7 are switched at a period shorter than a voice signal so as to switch the transmission and reception frequencies. As a result, simultaneous transmission and reception can be performed.

A dual mode wireless unit which integrally accommodates the TDD system shown in FIG. 7 and the FDD system shown in FIG. 8 will now be described. FIG. 9 is a block diagram showing a conventional dual mode wireless unit. Referring to FIG. 9, the block diagram of TDD system shown in FIG. 7 and that of the FDD system shown in FIG. 8 are combined to each other. Moreover, a mode switch 28 is disposed among the antenna 1 and respective antenna terminals. The same elements as those shown in FIGS. 7 and 8 are given the same reference numerals and they are omitted from detailed description. The frequencies employed in each section shown in FIG. 9 are similar to those employed in the structures shown in FIGS. 7 and 8.

However, as can be understood from the descriptions of the conventional structures, the TDD system shown in FIG. 7 and the FDD system shown in FIG. 8 must be provided with the first local oscillator 8, the second local oscillator 12 and the carrier oscillator 17. The dual mode wireless unit shown in FIG. 9 involves a complicated frequency relationship and has a structure formed by simply combining the circuits employed in the structures shown in FIGS. 7 and 8. Thus, the number of the variable oscillators is the total of all oscillators shown in FIGS. 7 and 8. As a result, there arises a problem in that the number of the oscillators is too large and the circuit structure cannot be simplified.

In recent years, research and development of mobile telephones have been performed energetically, thus resulting in systems operated in a variety of frequency bands. Accordingly, also the wireless section of a wireless unit must treat signals in a plurality of frequency bands by the same circuit thereof. Among the foregoing circuits, the band-pass filter and frequency branching filter (combiner), which are important circuit elements in the wireless circuit encounter a variety of problems in treating a plurality of frequency bands.

Referring to the drawings, a conventional two-frequency band-pass filter with two frequency pass bands will now be described. FIG. 25 is a circuit diagram showing an essential portion of the conventional two-frequency band-pass filter. Referring to FIG. 25, reference numeral 161 represents a first band-pass filter with a center frequency of 950 MHz, and 162 represents a second band-pass filter with a center frequency of 1.9 GHz. A common input terminal 164, a common output terminal 165 and input and output terminals of the foregoing filters are connected to one another by filter switches 163. By synchronizing the foregoing switches 163 and by switching to the first filter or the second filter, the overall band allowed to pass through can be switched.

A conventional two-frequency branching filter will now be described. FIG. 26 is a circuit diagram showing an essential portion of a conventional two-frequency branching filter. Referring to FIG. 26, reference numeral 171 represents a first band-pass filter with a center frequency of 950 MHz, and 172 represents a second band-pass filter with a center frequency of 1.9 GHz. By causing an output switch 173 to switch a common input terminal 174 and input terminals of the foregoing filters, a frequency component of 950 MHz can be obtained at a first output terminal 175 and a frequency component of 1.9 GHz can be obtained at a second output terminal 176. By switching input and output, a two-frequency combiner can be structured.

However, the foregoing conventional structures results in both of the two-frequency band-pass filter and the two-frequency branching filter (combiner) being required to use control signals for the switches. Moreover, there is a risk that the loss of the switch deteriorates the overall insertion loss characteristic.

In recent years a voltage controlled oscillator (hereinafter abbreviated as a "VCO") capable of arbitrarily varying the frequency by changing voltage to be applied to a varactor diode has been employed in a variety of circuits, for example, a PLL. In particular, wireless units of a type using a plurality of frequency bands have widely used a VCO with controllable frequency band which can be used across at least two frequency bands.

Referring to the drawings, a conventional VCO with controllable frequency band capable of operating two frequency bands will now be described. FIG. 34 is a block diagram showing a conventional VCO with controllable frequency band. Referring to FIG. 34, the VCO with controllable frequency band comprises a VCO 391 (VCO1) for oscillating within the range of a first frequency band and a VCO 392 (VCO2) for oscillating within the range of a second frequency band. The VCO1 and VCO2 respectively are caused to oscillate in the corresponding bands, and then either of the oscillation outputs of the frequency bands is selected by a switch 393 so as to be conducted to the output terminal.

However, the foregoing conventional VCO with controllable frequency band is required to have a VCO at each desired frequency band. Since the time division multiple access FDD/TDD dual mode wireless unit is adapted to different transmission and reception frequencies in each mode, the frequency bands of the first and second local oscillator frequencies must be changed. Thus, the time division multiple access FDD/TDD dual mode wireless unit must be provided with the VCOs for the desired frequency bands. Thus, the size of the circuit and a required space are enlarged excessively while the cost being enlarged unsatisfactorily.

In recent years, flows of signals in a high-frequency circuit have been switched by using a switch device, such as a field-effect transistor. A conventional two-terminal to two-common-terminal matrix switch for forming one signal flow between two terminals and two common terminals will now be described with reference to a circuit diagram shown in FIG. 40.

A First terminal RF1 is connected to drains of two field-effect transistors (hereinafter abbreviated as "FET") Q11 and Q13. A Second terminal RF2 is connected to drains of two FETs Q12 and Q14. Sources of the two FETs Q13 and Q14 are joined together so as to be connected sources of FETs Q23 and Q24.

The drain of the FET Q23 and that of FET Q21 are connected to a first common terminal RFCOM1. The drain of the FET Q24 and that of the FET Q22 are connected to a second common terminal RFCOM2. The source of each of transistors Q11, Q12, Q21 and Q22 is grounded. A first control terminal Vcont1 is, through resistors R32 and R33, connected to the gate of the FET Q12 and that of the FET Q13. The first control Vcont1 is, through an invertor Inv1 and resistors R31 and R34, connected to the gate of the FET Q11 and that of the FET Q14.

A second control terminal Vcont 2 is, through resistors R36 and R37, connected to the gate of the FET Q22 and that of the FET Q23. The second control terminal Vcont2 is, through an invertor Inv2 and resistors R35 and R38, connected to the gate of the FET Q21 and that of the FET Q24.

The operation of the two-terminal to two-common-terminal matrix switch having the foregoing structure will now be described with reference to FIG. 41, which is a circuit equivalent to that shown in FIG. 40 and Table 1 showing the relationship between application of control voltage and the operation of the circuit.

TABLE 1

| | Vcont1 | |
|---|---|---|
| Vcont2 | H | L |
| H | RF1 ←→ RFCOM1 | RF2 ←→ RFCOM2 |
| L | RF1 ←→ RFCOM2 | RF2 ←→ RFCOM1 |

As shown in Table 1, high level (H) or low level (L) potential is supplied from the first and second control terminals Vcont1 and Vcont2 as control voltage. In a case where both of the Vcont 1 and Vcont 2 are high level, an input signal supplied from the first terminal RF1 is, as shown in FIG. 41, conducted to the first common terminal RFCOM1 because the transistors Q13 and Q23 have been turned on because a FET is generally turned on when the potential of the gate is high and the transistors Q11, Q14, Q21 and Q24 have been turned off by the invertors Inv1 and Inv2. A signal from the second terminal RF2 is grounded because the transistor Q12 has been turned on and the transistor Q14 has been turned off and, therefore, the signal cannot be transmitted to another common terminal. When the potentials of both of the Vcont1 and Vcont2 are low, a reverse relationship to that shown in FIG. 41 is held in which the signal from the second terminal RF2 is conducted to the second control terminal RFCOM2 because the transistors Q14 and Q24 have been turned on and the transistors Q12, Q13, Q22 and Q23 have been turned off. An input signal from the first terminal RF1 is grounded because the transistor Q11 has been turned on and the transistor Q13 has been turned off. Thus, the signal cannot be transmitted to another control terminal.

Similarly, in the case where the potentials of the Vcont1 and Vcont2 are L and H and in the case where the same are H and L, the signal can be conducted as shown in Table 1. As a result, the operation as the two-terminal to two-common-terminal matrix switch is performed similar to the equivalent circuit shown in FIG. 42 in which the connection is independently established in only one set consisting of either of the two terminals and either of the two control terminals. The foregoing flow of the signal may be inverted.

However, the foregoing conventional two-terminal to two-common-terminal matrix switch having the foregoing structure requires 8 transistors arranged as shown in FIG. 40, thus causing the number of resistors to be enlarged. Thus, the structure of the circuit becomes too complicated. If the common terminals are intended to be increased, the number of the transistors increases inevitably and, therefore, control becomes too complicated. Since two FETs are, in series, disposed in a path from the input terminal to the common terminal of the output terminal, an excessive signal transmission loss takes place.

SUMMARY OF THE INVENTION

An object of the present invention is to provide a time division multiple access FDD wireless unit and a time division multiple access FDD/TDD dual mode wireless unit capable of decreasing oscillators and simplifying the structure of the circuit.

Another object of the present invention is to provide a two-frequency band-pass filter and a two-frequency branching filter (combiner) capable of satisfying the foregoing characteristic in which no switch is used, which uses a passive element, which does not need a control signal and which exhibits overall insertion loss characteristic.

Another object of the present invention is to provide a VCO with controllable frequency band having a structure such that an oscillation device of the VCO is switched so as to be used in a plurality of frequency bands while necessitating a simple structure.

Another object of the present invention is to provide a two-terminal to multi-common terminal matrix switch capable of performing a similar operation even if a small number of devices are provided, reducing transmission loss and switching to a plurality of common terminals in a case where an additional circuit is provided.

To achieve the above objects, the invention provides a two-frequency band-pass filter comprising: a first band-pass filter having a first frequency band; a first impedance matching circuit pair for transforming impedance of the first band-pass filter with respect to a second frequency band to higher impedance, the first impedance matching circuit pair having a front portion to be connected to an input of the first band-pass filter and a rear portion to be connected to an output of the first band-pass filter, the second frequency band being different from the first frequency band; a second band-pass filter having the second frequency band; a second impedance matching circuit pair for transforming impedance of the second band-pass filter with respect to the first frequency band to higher impedance, the second impedance matching circuit pair having a front portion to be connected to an input of the second band-pass filter and a rear portion to be connected to an output of the second band-pass filter; a common input terminal to be connected to an input of the front portion of the first impedance matching circuit pair and an input of the front portion of the second impedance matching circuit pair; and a common output terminal to be connected to an output of the rear portion of the first impedance matching circuit pair and an output of the rear portion of the second impedance matching circuit pair.

To achieve the above objects, the invention provides a two-frequency branching filter comprising: a first band-pass filter having a first frequency band; a first impedance matching circuit connected to an input of the first band-pass filter for transforming impedance of the first band-pass filter with respect to a second frequency band to higher impedance, the second frequency band being different from the first frequency band; a second band-pass filter having the second frequency band; a second impedance matching circuit connected to an input of the second band-pass filter for transforming impedance of the second band-pass filter with respect to the first frequency band to higher impedance; a common input terminal connected to an input of the first impedance matching circuit and an input of the second impedance matching circuit; a first output terminal connected to an output of the first band-pass filter; and a second output terminal connected to an output of the second band-pass filter.

To achieve the above objects, the invention provides a two-frequency combiner comprising: a first band-pass filter having a first frequency band; a first impedance matching circuit connected to an output of the first band-pass filter for transforming impedance of the first band-pass filter with respect to a second frequency band to higher impedance, the second frequency band being different from the first frequency band; a second band-pass filter having the second frequency band; a second impedance matching circuit connected to an output of the second band-pass filter for transforming impedance of the second band-pass filter with respect to the first frequency band to higher impedance; a common output terminal connected to an output of the first impedance matching circuit and an output of the second impedance matching circuit; a first input terminal connected to an input of the first band-pass filter; and a second input terminal connected to an input of the second band-pass filter.

To achieve the above objects, the invention provides a voltage controlled oscillator with controllable frequency band, comprising: a variable capacity device having a terminal to which input voltage is applied and another terminal which is grounded, and having capacity which is equivalently changed in accordance with the input voltage; a distributed constant line having a terminal to be AC-connected to the terminal to which the input voltage is applied; frequency band switching means having a first terminal and a second terminal, the first terminal being connected to another terminal of the distributed constant line; and feedback amplifying means further AC-connected to the terminal of the distributed constant line which is AC-connected, and having negative resistance characteristic; wherein the frequency band switching means changes at least the characteristic of the distributed constant line so that a frequency band which is a range in which frequency is varied by the input voltage is changed to another frequency band.

To achieve the above objects, the invention provides a two-terminal to multi-common terminal matrix switch comprising: a plurality of common terminals; a first short-circuiting switch connected between a first terminal and the ground for short-circuiting or AC-connecting between the first terminal and the ground; a plurality of first connecting switches for connecting between the first terminal and each of the plural common terminals; a second short-circuiting switch connected between a second terminal and the ground for short-circuiting or AC-connecting between the second terminal and the ground; a plurality of second connecting switches for connecting between the second terminal and each of the plural common terminals; and control means for conducting at least one between the first terminal and each of the plural common terminals by making the first short-circuiting switch to be non-conductive, the second short-circuiting switch to be conductive and at least one of the connecting switches to be conducted to the first terminal to be conductive, or for conducting at least one between the second terminal and each of the plural common terminals by making the first short-circuiting switch to be conductive, the second short-circuiting switch to be non-conductive and at least one of the second connecting switches to be conducted to the second terminal to be conductive.

To achieve the above objects, the invention provides a time division multiple access FDD wireless unit comprising: first oscillation means for oscillating a first frequency; first reception signal conversion means for transmitting a frequency of a difference between a reception signal and an output of the first oscillation means; second reception signal conversion means for transmitting a frequency of a sum or a difference between an output of the first reception signal conversion means and a second frequency; modulation means for modulating a third frequency; transmission signal conversion means for transmitting a frequency of a sum of an output of the modulation means and an output of the first oscillation means, wherein the frequency to be transmitted from the transmission signal conversion means is different from frequency of the reception signal, and the second frequency is oscillated by another oscillation means and the third frequency is obtained by multiplying or dividing the second frequency by a predetermined value, or the third frequency is oscillated by another oscillation means and the second frequency is obtained by multiplying or dividing the third frequency by a predetermined value.

To achieve the above objects, the invention provides a time division multiple access FDD wireless unit comprising: first oscillation means for oscillating a first frequency; second oscillation means for oscillating a second frequency; first frequency conversion means for multiplying or dividing the second frequency by n which is an integer not less than 1; second frequency conversion means for multiplying or dividing the second frequency by m which is an integer not less than 1; first reception signal conversion means for transmitting a frequency of a difference between a reception signal and an output of the first oscillation means; second reception signal conversion means for transmitting a frequency of a sum or a difference between an output of the first reception signal conversion means and an output of the first frequency conversion means; modulation means for modulating an output of the second frequency conversion means; transmission signal conversion means for transmitting a frequency of a sum of an output of the modulation means and the output of the first oscillation means, wherein the frequency to be transmitted from the transmission signal conversion means is different from frequency of the reception signal.

To achieve the above objects, the invention provides a time division multiple access FDD/TDD dual mode wireless unit comprising: first oscillation means for oscillating a first frequency; third oscillation means for oscillating a third frequency; first FDD reception signal conversion means for transmitting a frequency of a difference between a reception signal and an output of the first oscillation means; second FDD reception signal conversion means for transmitting a frequency of a sum or a difference between an output of the first FDD reception signal conversion means and a second frequency; first TDD reception signal conversion means for transmitting a frequency of a difference between the reception signal and an output of the third oscillation means; second TDD reception signal conversion means for transmitting a frequency of a sum or a difference between an output of the first TDD reception signal conversion means and a fourth frequency; modulation means for modulating the fourth frequency; selection means for selecting either of the output of the first oscillation means or the output of the third oscillation means to be adaptable to an FDD method or a TDD method; transmission signal conversion means for transmitting a frequency of a sum of the selected output and an output of the modulation means; and system switching means for switching the reception signal to the first FDD reception signal conversion means in case of the FDD method, and for switching the reception signal to the first TDD reception signal conversion means in case of the TDD method, wherein the second frequency is oscillated by a second oscillation means and the third frequency is obtained by multiplying or dividing the second frequency by a predetermined value, or the fourth frequency is oscillated by a fourth oscillation means and the second frequency is obtained by multiplying or dividing the fourth frequency by a predetermined value.

To achieve the above objects, the invention provides a time division multiple access FDD/TDD dual mode wireless unit comprising: 2-band frequency synthesizer for switching and transmitting a first frequency and a third frequency; first FDD reception signal conversion means for transmitting a frequency of a difference between a reception signal and the first frequency; second FDD reception signal conversion means for transmitting a frequency of a sum or a difference between an output of the first FDD reception signal conversion means and a second frequency; first TDD reception signal conversion means for transmitting a frequency of a difference between the reception signal and the third frequency; second TDD reception signal conversion means for transmitting a frequency of a sum or a difference between an output of the first TDD reception signal conversion means and a fourth frequency; modulation means for modulating the fourth frequency; selection means for selecting either of the first frequency or the third frequency to be adaptable to an FDD method or a TDD method; transmission signal conversion means for transmitting a frequency of a sum of the selected output and an output of the modulation means; and system switching means for switching the reception signal to the first FDD reception signal conversion means in case of the FDD method, and for switching the reception signal to the first TDD reception signal conversion means in case of the TDD method.

To achieve the above objects, the invention provides a time division multiple access FDD/TDD dual mode wireless unit comprising: first oscillation means for oscillating a first frequency; second oscillation means for oscillating a second frequency; first frequency conversion means for multiplying or dividing the second frequency by n which is an integer not less than 1; second frequency conversion means for multiplying or dividing the second frequency by m which is an integer not less than 1; third oscillation means for oscillating a third frequency; first FDD reception signal conversion means for transmitting a frequency of a difference between a reception signal and an output of the first oscillation means; second FDD reception signal conversion means for transmitting a frequency of a sum or a difference between an output of the first FDD reception signal conversion means and the output of the first frequency conversion means; first TDD reception signal conversion means for transmitting a frequency of a difference between the reception signal and an output of the third oscillation means; second TDD reception signal conversion means for transmitting a frequency of a sum or a difference between an output of the first TDD reception signal conversion means and an output of the second frequency conversion means; modulation means for modulating the output of the second frequency conversion means; selection means for selecting either of the output of the first oscillation means or the output of the third oscillation means to be adaptable to an FDD method or a TDD method; transmission signal conversion means for transmitting a frequency of a sum of the selected output and an output of the modulation means; and system switching means for switching the reception signal to the first FDD reception signal conversion means in case of the FDD method, and switching the reception signal to the first TDD reception signal conversion means in case of the TDD method.

BRIEF DESCRIPTION OF THE DRAWINGS

These and other objects, advantages, features, and uses will become more apparent as the description proceeds, when considered with the accompanying drawings in which:

FIG. 10 is a block diagram showing an essential portion of a first embodiment of a two-frequency band-pass filter according to the present invention;

FIG. 31 is a view of explanatory showing combination of distributed constant lines according to a third embodiment of the multi-frequency band VCO;

FIG. 32 is a view of explanatory showing combination of distributed constant lines according to a fourth embodiment of the multi-frequency band VCO;

FIG. 38 is a circuit diagram showing a third embodiment of the two-terminal to multi-common terminal matrix switch according to the present invention;

DESCRIPTION OF THE PREFERRED EMBODIMENTS

Figure 1:
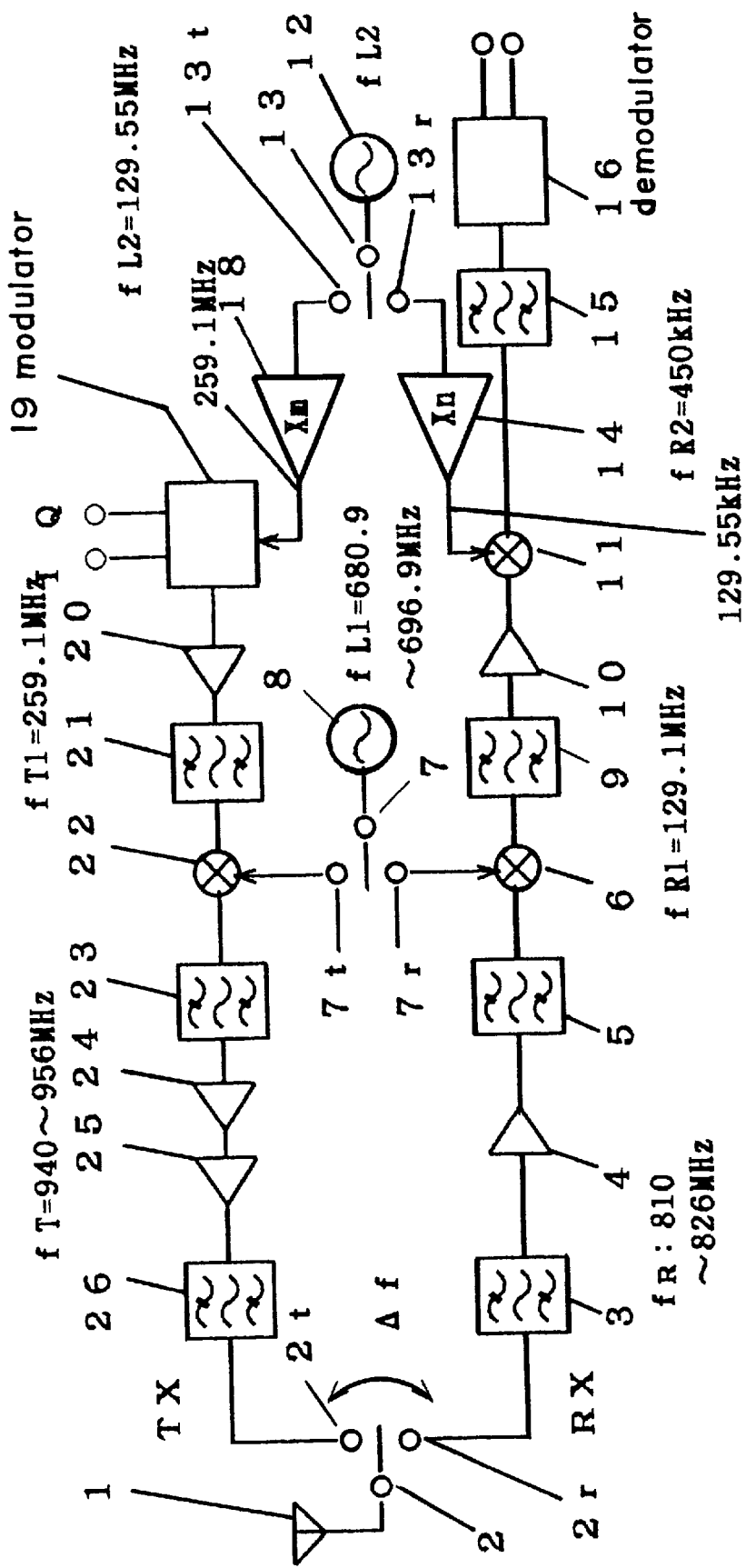
FIG. 1 is a block diagram showing an embodiment of a time division multiple access FDD wireless unit according to the present invention.

FIG. 1 is a block diagram showing an embodiment of a time division multiple access FDD wireless unit according to the present invention. In a receiving circuit shown in FIG. 1, an antenna switch 2, which is transmission/reception switching means, is connected to an antenna 1, which is a scanning antenna. High-frequency amplifying means, comprising filters 3 and 5 and a high-frequency amplifier 4, is connected to a contact $2r$, which is a receiving input terminal of the antenna switch 2. A converter 6, which is first received-signal conversion means, is connected to an output from the high-frequency amplifying means, the converter 6 being allowed to pass through a contact $7r$ of a transmission/reception switch 7, which is first switching means which is a portion of transmission/reception switching means, and then connected to an output of a first local oscillator 8, which is first oscillation means. First intermediate frequency amplifying means, comprising a first intermediate frequency band-pass filter 9 and a first intermediate frequency amplifier 10, is connected to the output of the converter 6. A converter 11, which is second received signal conversion means, is connected to the rear end of the first intermediate frequency amplifying means. A second local oscillator 12, which is second oscillation means, is connected to the converter 11 through an n-times multiplier 14, which is n-times multiplying means. Moreover, the converter 11 is, through a second intermediate frequency band-pass filter 15, connected to a demodulator 16, which is demodulation means.

The transmission circuit is structured such that an output from the second local oscillator 12 is connected to an input of an m-times multiplier 18, which is m-times multiplying means. The output of the m-times multiplier 18 is connected to a modulator 19, which is modulating means. The output of the modulator 19 is connected to intermediate transmission frequency amplifying means, comprising an intermediate transmission frequency amplifier 20 and an intermediate transmission frequency band-pass filter 21, followed by being connected to a converter 22, which is transmission signal conversion means. The first local oscillator 8 is, through a contact $7t$ of the transmission/reception switch 7, connected to the converter 22. The output of the converter 22 is connected to a contact $2t$ of the antenna switch 2, which is a output terminal, through a transmission power amplifying means, comprising high-frequency band-pass filters 23 and 26, a high-frequency amplifier 24 and a high-frequency power amplifier 25.

The operation of the time division multiple access FDD wireless unit according to this embodiment will now be described with reference to the drawings.

When a signal is received, a high-frequency signal received through the antenna 1 is allowed to pass through the antenna switch 2 connected to the contact $2r$. Then, the high-frequency band-pass filter 3 selects reception frequency fR of 810 MHz to 826 MHz for the subject station and supplies the signal to the high-frequency amplifier 4 so as to be amplified. Then, the selectivity of the amplified signal is further raised by the high-frequency band-pass filter 5, followed by being supplied to the converter 6, in which the frequency of the signal is mixed with first local oscillation frequency fL1 of 680.9 MHz to 696.9 MHz supplied from the first local oscillator 8 through the contact $7r$ of the transmission/reception switch 7 so as to be converted into first intermediate frequency fR1 of 129.1 MHz. Then, the selectivity of the signal is raised by the first intermediate frequency band-pass filter 9, followed by being amplified by the first intermediate frequency amplifier 10. Then, the frequency is, by the converter 11, mixed with a second local oscillation frequency, supplied from the second local oscillator 12, which oscillates second local oscillation frequency fL2 of 129.55 MHz, through the contact $13r$ of the transmission/reception switch 13, followed by being multiplied by n (n=1 in the foregoing case) in the n-times multiplier 14 so as to be converted into second intermediate frequency fR2 of 450 kHz. Then, the selectivity of the frequency is raised by the second intermediate frequency band-pass filter 15, followed by being demodulated by the demodulator 16 so that a reception output is obtained.

When a signal is transmitted, second local oscillation frequency fL2 of the second local oscillator 12 of 129.55 MHz is allowed to pass through the contact 13t of the transmission/reception switch 13 followed by being multiplied by m (m=2 in the foregoing case) by a m-times multiplier 18 so as formed into an output of 259.1 MHz. The output is then digital-modulated with I and Q signals by the modulator 19. Intermediate transmission frequency fT1 of the digital-modulated frequency is amplified by the intermediate transmission frequency amplifier 20. Then, the selectivity of the amplified frequency is raised by the intermediate transmission frequency band-pass filter 21. And then, the signal is mixed with first local oscillation frequency fL1 of 680.9 MHz to 696.9 MHz supplied from the first local oscillator 8 through the contact 7t of the transmission/reception switch 7 so as to be converted into a high frequency signal having transmission frequency fT of 940 MHz to 956 MHz, which is the transmission frequency of the subject station. Then, the selectivity of the frequency is raised by the high-frequency band-pass filter 23, and then amplified by the high-frequency amplifier 24 and the high-frequency power amplifier 25. Then, the selectivity of the amplified frequency is raised by the high-frequency band-pass filter 26 so as to be transmitted from the antenna 1 through the contact 2t of the antenna switch 2.

Figure 8:
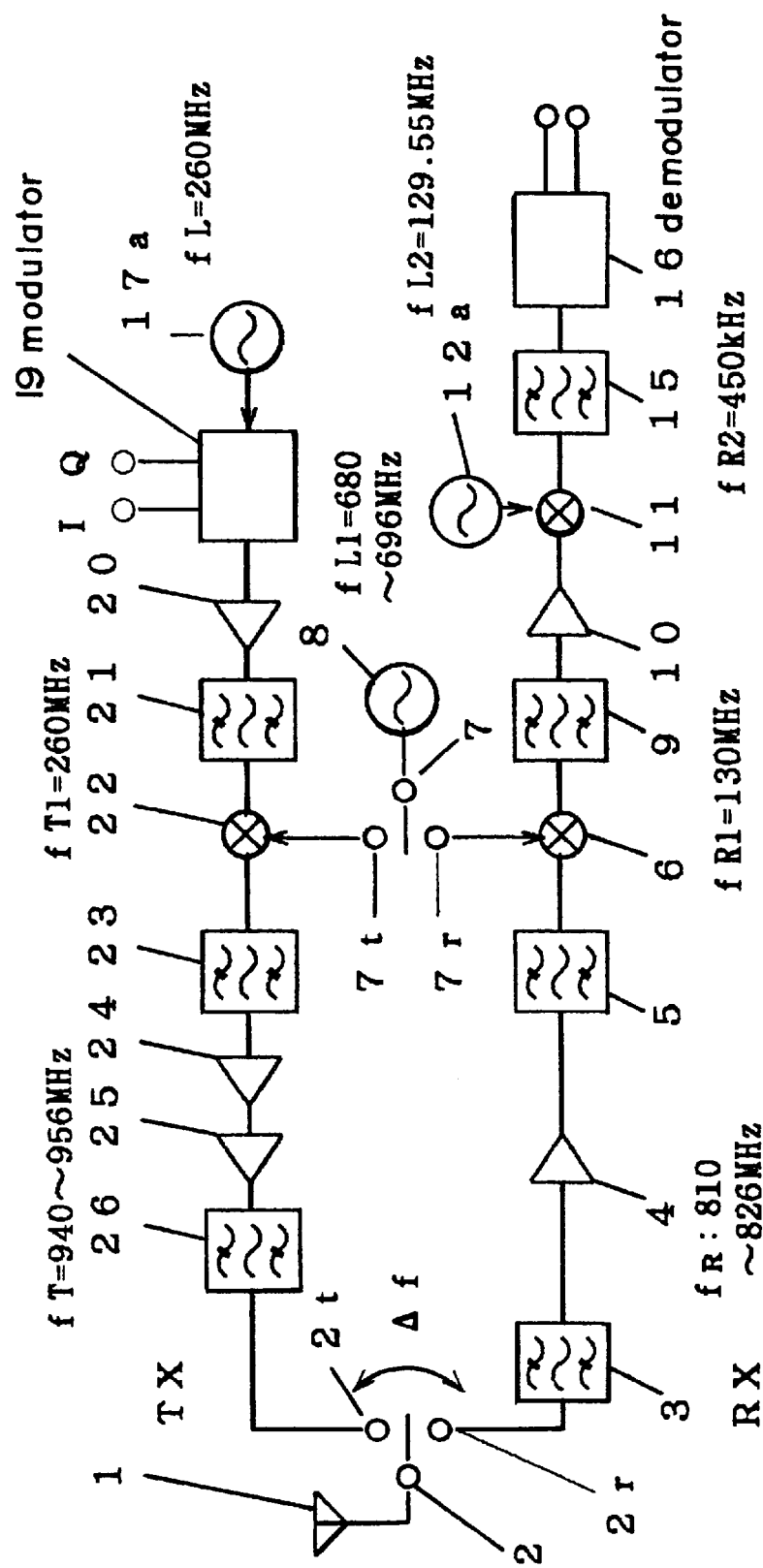
FIG. 8 is a block diagram showing a conventional time division multiple access FDD wireless unit.

Similarly to the structure shown in FIG. 8, the reception and transmission is switched such that the antenna switch 2 and the transmission/reception switch 7 are switched at a period shorter than a voice signal period so that simultaneous transmission and reception can be performed. In the case of the FDD system, assuming that one frame is made of 20 mS, an arrangement is employed such that 20/3 mS is assigned to transmission, 1 mS is assigned to a space, 20/3 mS is assigned to reception and the residual period is assigned to idling.

An isolator may be disposed between the high-frequency power amplifier 25 and the high-frequency band-pass filter 26 if necessary, the isolator being disposed to prevent counterflow of the high-frequency signal from the antenna.

Assuming that the difference between the transmission frequency and the reception frequency is $\Delta f$, the second local oscillation frequency is fL2 and the second intermediate reception frequency is fR2, the multiplication ratio m of the m-times multiplier or the division ratio m of the m-divider and the multiplication ratio n of the multiplier or the division ratio n (m and n are each an integer not less than 1) of the n-divider are set to satisfy the following equations:

$$fR2 = |(m-n)fL2 - \Delta f| \quad (1)$$

or $$fR2 = |\{(1/m)-(1/n)\}fL2 - \Delta f| \quad (2)$$

Moreover, the first and second intermediate frequencies are set arbitrarily so that the transmission frequency fT and the reception frequency fR are set arbitrarily.

As described above, this embodiment has the structure such that the oscillation frequency of the second local oscillator 12 is multiplied by n by the n-times multiplier 14 and is multiplied by m by the m-times multiplier 18 when a signal is transmitted. Then, Equation (1) is used to set the values of m and n so that one carrier oscillator 17 shown in FIG. 8 is decreased to be adaptable to the transmission frequency fT and the reception frequency fR.

As described above, when a signal is received, a high-frequency signal of reception frequency received through the reception input terminal is selectively amplified, and then the amplified signal is supplied to the first received signal conversion means from which the difference from the frequency of the output of the first local oscillator is, as the first intermediate frequency, transmitted. The transmitted output is supplied to the second signal conversion means in which it is mixed with a frequency obtained by multiplying the oscillation frequency from the second local oscillator by n by the n-times multiplier (or with a frequency obtained by dividing by n by the n-divider). Thus, a frequency, which is the sum of the first intermediate frequency and the output from the n-times multiplier (or the n-divider) or the difference between the same, is transmitted as the second intermediate frequency.

When a signal is transmitted, the output obtained by multiplying the output from the second local oscillator by m by the m-times multiplier (or the output obtained by dividing the same by m by the m-divider) is modulated by the modulator. A transmission frequency is generated which is the sum of the output obtained by selectively amplifying the foregoing output and the output from the first local oscillator and which is different from the reception frequency.

Since the m-times multiplier (or the m-divider) and the n-times multiplier (or the n-divider) are provided, one second local oscillator is sufficient to perform transmission and reception. As a result, the number of the oscillators can be decreased and, therefore, the structure of the circuit can be simplified.

Although the description has been made about the structure comprising the n-times multiplier 14 capable of multiplying the frequency by n and the m-times multiplier 18 capable of multiplying the frequency by m, Equation (2) may be used to arrange the structure comprising the n-divider capable of dividing the frequency by n and the m-divider capable of dividing the frequency by m. The multiplier and the divider may be combined. The foregoing structures may similarly be adapted to the following embodiments.

Figure 2:
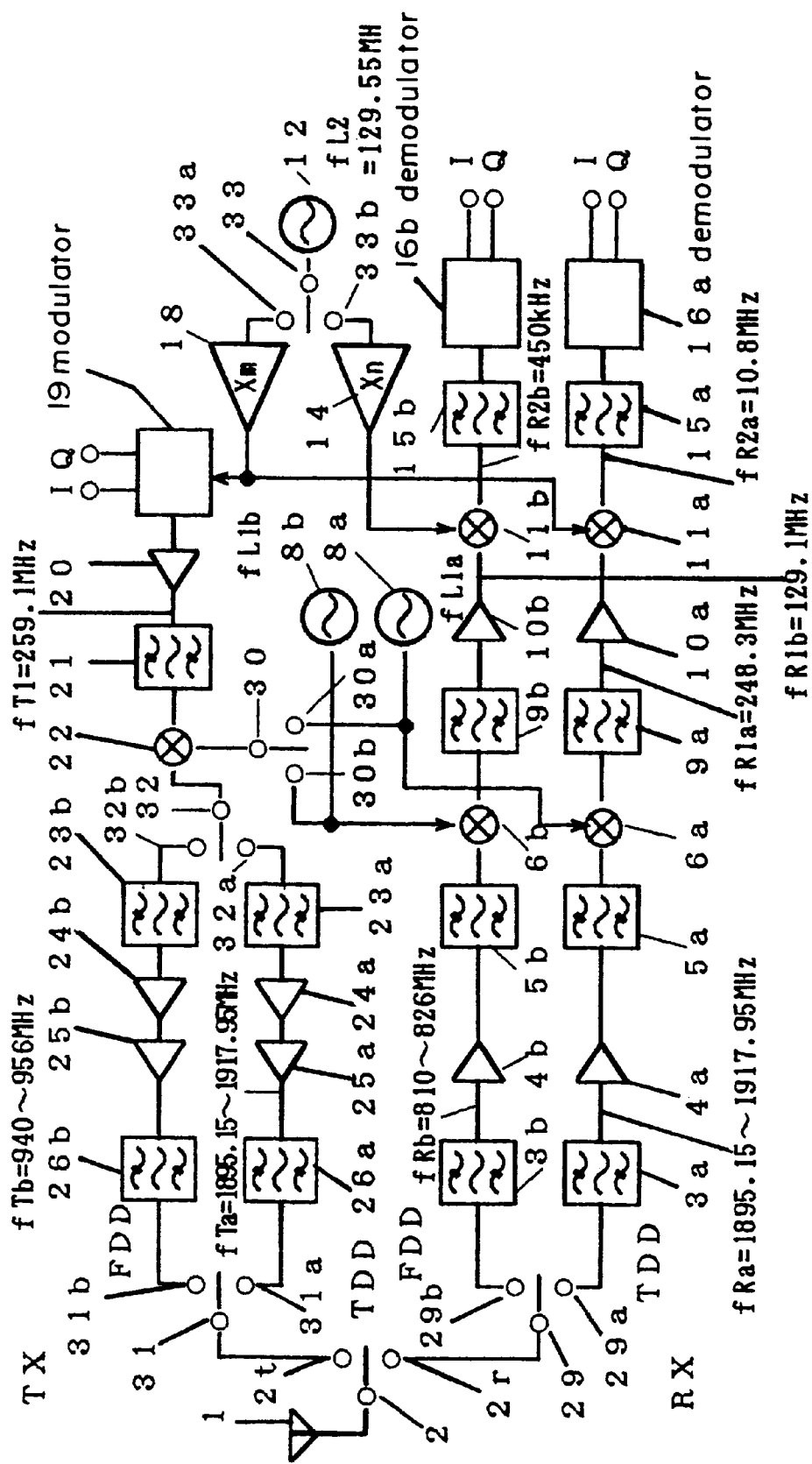
FIG. 2 is a block diagram showing a first embodiment of a time division multiple access FDD/TDD dual mode wireless unit according to the present invention.
Figure 9:
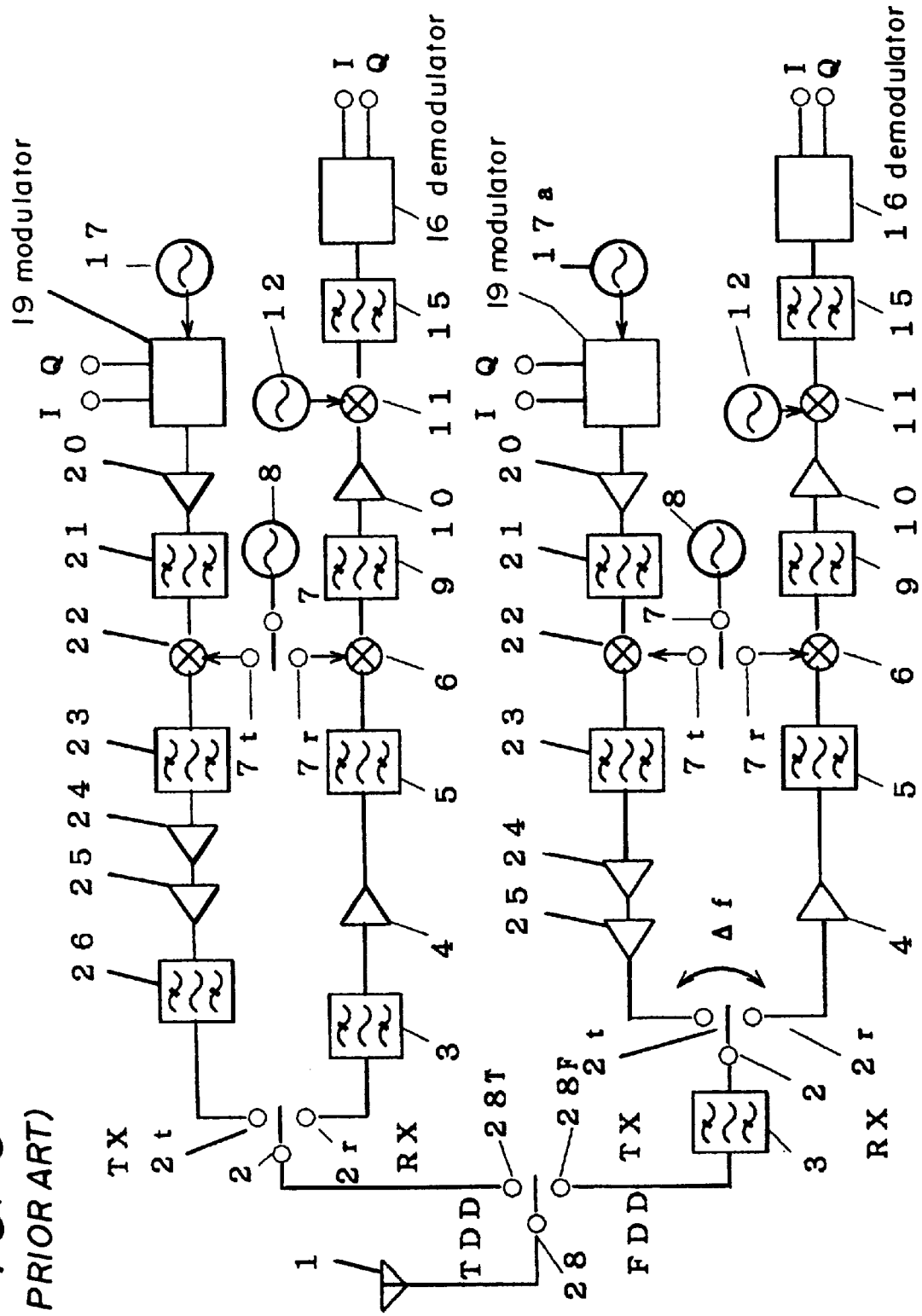
FIG. 9 is a block diagram showing a conventional time division multiple access FDD/TDD dual mode wireless unit.

Referring to FIG. 2, there is shown therein a block diagram of a first embodiment of a time division multiple access FDD/TDD dual mode wireless unit according to the present invention. A main difference of this embodiment from the conventional structure shown in FIG. 9 is that the transmission portion for the FDD system and that for the TDD system are integrated into one unit, the receiving portion for the FDD system and that for the TDD system are integrated into one unit, two first local oscillation circuits are provided so as to be adaptable to the FDD system and the TDD system, and one second local oscillation circuit is provided similar to the structure of the embodiment of the time division multiple access FDD wireless unit. Since the elements, combinations and connections are similar to those according to the structure shown in FIG. 1, they are omitted from detailed description.

A first local oscillator 8b for the FDD system constitutes a first oscillation means, a first local oscillator 8a for the TDD system constitutes a third oscillation means, a mode switch 30 constitutes a selection means and a mode switch 29 constitutes a system switching means.

The operation of this embodiment will now be described. In the TDD mode, mode switches 29, 30, 31 and 32 are switched to contacts 29a, 30a, 31a and 32a, while a mode/transmission/reception switch 33 is switched to a contact 33a.

When a signal is received, a high-frequency signal received through the antenna 1 is allowed to pass through the antenna switch 2 connected to the contact 2r and a contact 29a of the mode switch 29. Then, the high-frequency band-pass filter 3a selects reception frequency fRa of 1895.15 to 1917.95 MHz for the subject station and supplies the signal to the high-frequency amplifier 4a so as to be amplified. Then, the selectivity of the amplified signal is further raised by the high-frequency band-pass filter 5a, followed by being supplied to the converter 6, in which the frequency of the signal is mixed with first local oscillation frequency fL1a of 1646.85 MHz to 1669.65 MHz supplied from the first local oscillator 8a so as to be converted into first intermediate frequency fR1a of 248.3 MHz. Then, the selectivity of the signal is raised by the first intermediate frequency band-pass filter 9a, followed by being amplified by the first intermediate frequency amplifier 10a. Then, the frequency is, by the converter 11a, mixed with a second local oscillation frequency of 259.1 MHz, supplied from the second local oscillator 12 through a contact 33a of the mode/transmission/reception switch 33, and multiplied by m (in this case m=2) by the m-times multiplier 18 so as to be converted into second intermediate frequency fR2 of 10.8 MHz. Then, the selectivity of the frequency is raised by the second intermediate frequency band-pass filter 15a, followed by being demodulated by a demodulator 16a so that a reception output is obtained.

When a signal is transmitted, second local oscillation frequency fL2 of 129.55 MHz of the second local oscillator 12 is allowed to pass through a contact 33a of the mode/transmission/reception switch 33, followed by being multiplied by m (in this case m=2) by the m-times multiplier 18 so as to be converted into 259.1 MHz. An output having the frequency is then digital-modulated with I and Q signals in the modulator 19. The thus-obtained intermediate transmission frequency fT1 is amplified by the intermediate transmission frequency amplifier 20. The selectivity of the frequency is raised by the intermediate transmission frequency band-pass filter 21, and then supplied to the converter 22 which has received first local oscillation frequency fL1a (the foregoing switching operation is performed by a transmission/reception controller (not shown)) of 1636.05 MHz to 1658.85 MHz in a frequency range different from that when a signal is received. Thus, the frequency is converted into the high-frequency signal having a transmission frequency fT of 1895.15 MHz to 1917.95 MHz which is the transmission frequency for the subject station. Then, the signal is allowed to pass through the contact 32a of the mode switch 32, and then the selectivity of the high-frequency signal is raised by a high-frequency band-pass filter 23a, followed by being amplified by the high-frequency amplifier 24a and the high-frequency power amplifier 25a. Then, the selectivity is raised by the high-frequency band-pass filter 26a, followed by being allowed to pass through the contact 31a of the mode switch 31 and the contact 2t of the antenna switch 2. Then, the signal is transmitted from the antenna 1.

The reception and transmission is switched by switching the antenna switch 2 at high speed. In an example case where four wireless units use the same frequency, 1 frame composed of 5 mS is sectioned into 8 time slots each having a time of 625 μs. A wireless unit transmits a signal in the first slot, waits for in the following three slots, receives a signal in the fifth slot, and then waits for in the following three slots. During the foregoing slots, other wireless units sequentially repeat transmission and reception so that simultaneous transmission and reception is enabled. When a signal is received, the operation of each device (the amplifiers, converters and modulators) of the transmission circuit are turned off by the transmission/reception controller (not shown). When a signal is transmitted, each device in the reception circuit is turned off similarly.

The FDD mode will now be described. The mode switches 29, 30, 31 and 32 are switched to the contacts 29b, 30b, 31b and 32b. Moreover, the mode/transmission/reception switch 33 is switched to the contact 33b.

When a signal is received, a high-frequency signal supplied through the antenna 1 process such that the high-frequency band-pass filter 3b selects reception frequency fR of the subject station of 810 MHz to 826 MHz because the antenna switch 2 has been connected to the contact 2r and the mode switch 29 has been connected to the contact 29b. The selected frequency fR is supplied to the high-frequency amplifier 4b in which the frequency fR is amplified. Then, the selectivity is further raised by the high-frequency band-pass filter 5b, followed by being supplied to the converter 6b in which the frequency is mixed with first local oscillation frequency fL1b of 680.9 MHz to 696.9 MHz supplied from the first local oscillator 8b so as to be converted into first intermediate frequency fR1b of 129.1 MHz. The selectivity is raised by the first intermediate band-pass filter 9b, followed by being amplified by the first intermediate amplifier 10b. Then, the amplified frequency is, by the converter 11b, mixed with second local oscillation frequency 129.55 MHz obtained by multiplying second local oscillation frequency fL2 of 129.55 MHz oscillated by the second local oscillator 12 through the contact 33b of the mode/transmission/reception switch 33 by n (in this case n=1)by the n-times multiplier 14 so as to be converted into second intermediate frequency fR2b of 450 kHz. Then, the selectivity of the second intermediate frequency fR2b is raised by the second intermediate frequency band-pass filter 15b, followed by being demodulated by the demodulator 16b. Thus, a reception output can be obtained.

When a signal is transmitted, the mode/transmission/reception switch 33 is switched to the contact 33a. Second local oscillation frequency fL2 of 129.55 MHz oscillated by the second local oscillator 12 is allowed to pass through the contact 33a of the mode/transmission/reception switch 33, followed by multiplied by m (in this case m=2) by the m-times multiplier 18 so that an output of 259.1 MHz is obtained. The output is digital-modulated with I and Q signals by the modulator 19 so that intermediate transmission frequency fT1 is obtained. The intermediate transmission frequency fT1 is amplified by the intermediate transmission frequency amplifier 20. The selectivity of the amplified frequency is raised by the intermediate transmission frequency band-pass filter 21. Then, the frequency is, by the converter 22, mixed with first local oscillation frequency fL1b of 680.9 MHz to 696.9 MHz supplied from the first local oscillator 8b through the contact 30b of the mode switch 30 so as to be converted into a high frequency signal having transmission frequency fTb of 940 MHz to 956 MHz. Then, the high-frequency signal is allowed to pass through the contact 32b of the mode switch 32, followed by being supplied to the high-frequency band-pass filter 23b in which the selectivity of the frequency is raised. Then, the frequency is amplified by the high-frequency amplifier 24b and a high-frequency power amplifier 25b. Then, the selectivity of the frequency is raised by the high-frequency band-pass filter 26b, followed by being allowed to pass through the contact 31b of the mode switch 31 and the contact 2t of the antenna switch 2. Thus, the signal is transmitted from the antenna 1.

The foregoing reception and transmission is switched by switching the antenna switch 2 and the mode/transmission/ reception switch 33 at a period shorter than the voice signal similarly to the embodiment shown in FIG. 1. Thus, simultaneous transmission and reception can be performed.

Also this embodiment is enabled to perform similar operation to that of the embodiment shown in FIG. 1 by using Equation (1) or Equation (2) such that the multiplication ratio of the m-times multiplier 18 and n-times multiplier 14 for determining the frequency for use in transmission and reception in the FDD method or the division ratio of the dividers. As described above, the TDMA wireless unit has the structure such that the transmission portion for the FDD system and that for the TDD system are integrally formed, a receiving portion for the FDD system and that for the TDD system are integrally formed and two first local oscillation circuits are provided such that one of the first local oscillation circuits is used for transmission and reception by the TDD method and another circuit is used for transmission and reception by the FDD method. As for the second local oscillation circuit, the structure similar to that according to the embodiment shown in FIG. 1 is employed. Moreover, the m-times multiplier is used to perform transmission and reception by the TDD method. The m-times multiplier is used to perform transmission by the FDD method, while the n-times multiplier is used to perform reception. Thus, three carrier oscillators can be decreased as compared with the conventional dual mode wireless unit. As described above, the number of oscillators can be decreased.

Figure 3:
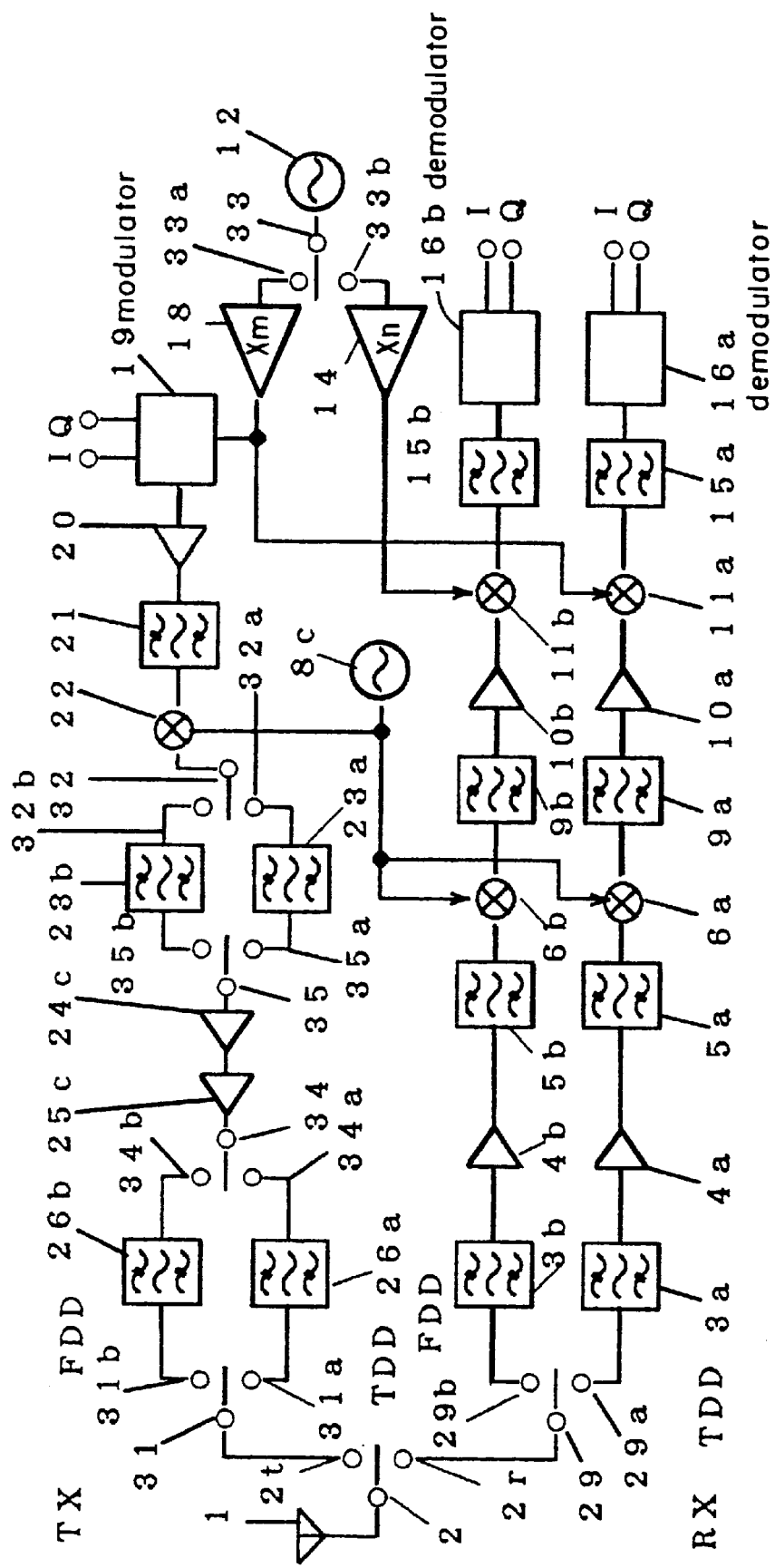
FIG. 3 is a block diagram showing a second embodiment of a time division multiple access FDD/TDD dual mode wireless unit according to the present invention.

Referring to FIG. 3, there is shown therein a block diagram of a second embodiment of the time division multiple access FDD/TDD dual mode wireless unit according to the present invention. This embodiment is different from the first embodiment shown in FIG. 2 in that mode switches 34 and 35 are added to unify the high-frequency amplifiers 24a and 24b and high-frequency power amplifiers 25a and 25b for transmission according to the first embodiment into a high-frequency amplifier 24c and a high-frequency power amplifier 25c so that the transmission high-frequency circuit is simplified. Moreover, one 2-band frequency synthesizer 8c capable of outputting over the two frequency bands is employed in place of the two first local oscillation circuits 8a and 8b according to the first embodiment so that one first local oscillator is decreased. Note that the two-band synthesizer 8c is switched to be adaptable to the mode and transmission and reception by a controller (not shown). The other portions having the same functions as those according to the first embodiment are given the same reference numerals and they are omitted from detailed descriptions.

In this embodiment, when a signal is transmitted, in the case of the TDD method, mode switches 31, 32, 33, 34 and 35 are switched to contacts 31a, 32a, 34a and 35a, so that a circuit consisting of the converter 22, the high-frequency band-pass filter 23a, the high-frequency amplifier 24c, the high-frequency power amplifier 25c and the high-frequency band-pass filter 26a is formed. In the case of the FDD method, the mode switches 31, 32, 34 and 35 are switched to contacts 31b, 32b, 34b and 35b so that a circuit consisting of the converter 22, the high-frequency band-pass filter 23b, the high-frequency amplifier 24c, the high-frequency power amplifier 25c and the high-frequency band-pass filter 26b is formed.

The two improvements according to this embodiment may be employed simultaneously or individually. Although the description of this embodiment has been performed about the transmission portion, the structure according to this embodiment may, of course, be applied to the receiving portion if mode switches are respectively added in the rear of the high-frequency band-pass filters 3a and 3b and across the high-frequency band-pass filters 5a and 5b.

Figure 4:
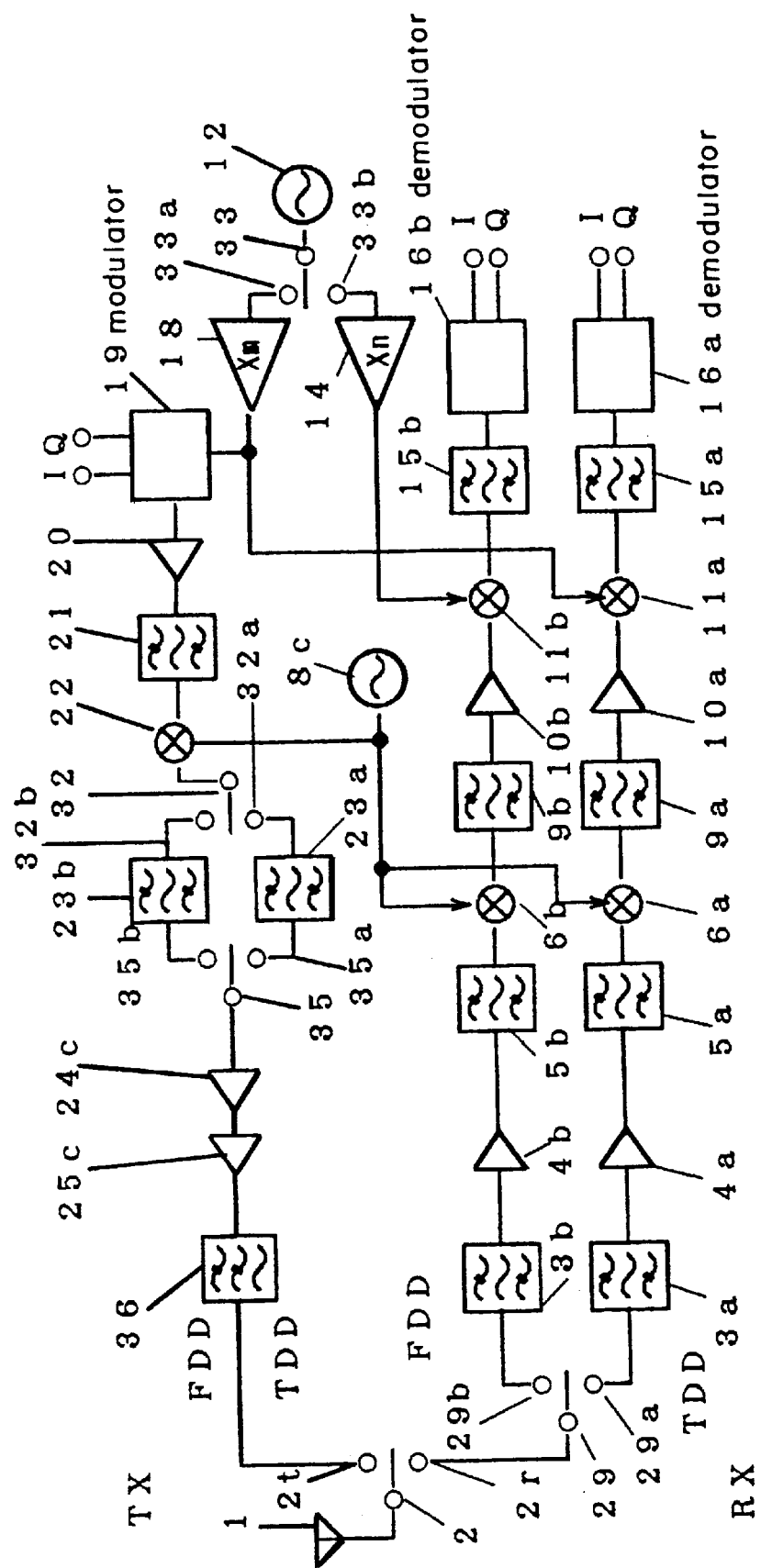
FIG. 4 is a block diagram showing a third embodiment of a time division multiple access FDD/TDD dual mode wireless unit according to the present invention.

Referring to FIG. 4, there is shown therein a block diagram of a third embodiment of the time division multiple access FDD/TDD dual mode wireless unit according to the present invention. This embodiment is different from the second embodiment shown in FIG. 3 in that the mode switches 31 and 34 are omitted a 2-band switch low-pass filter 36 is, in place of the high-frequency band-pass filters 26a and 26b, disposed between the high-frequency power amplifier 25c and the antenna switch 2. As a result, one filter can be decreased and the mode switch can be simplified. Since the other portions are similar to those according to the second embodiment shown in FIG. 3, the portions having the same functions are given the same reference numerals and they are omitted from detailed descriptions. The position of the 2-band switch low-pass filter is not limited to the foregoing position. The number of parts may be decreased by employing the 2-band low-pass filters in other portions.

Figure 5:
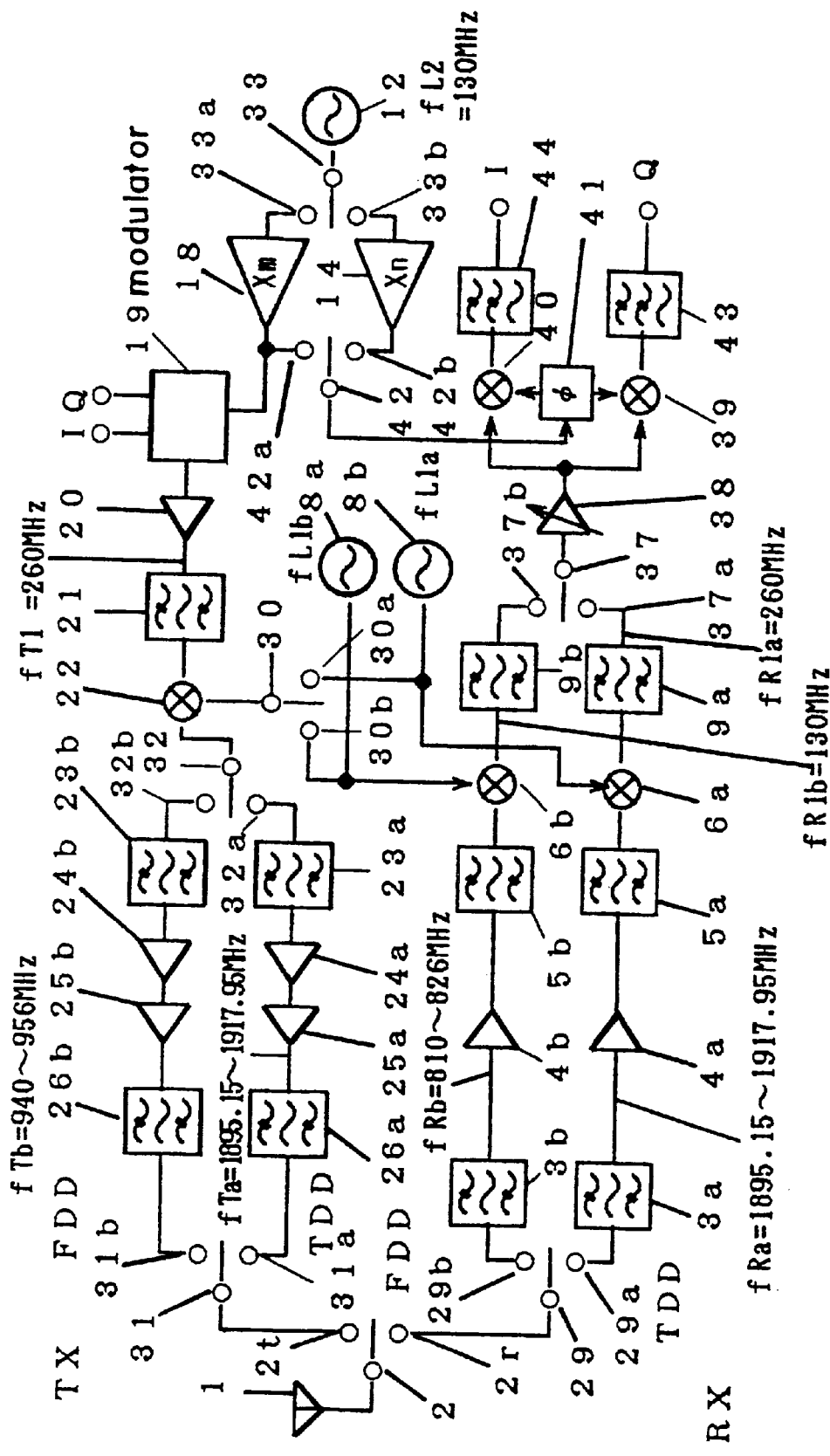
FIG. 5 is a block diagram showing a fourth embodiment of a time division multiple access FDD/TDD dual mode wireless unit according to the present invention.

Referring to FIG. 5, there is shown therein a block diagram of a fourth embodiment of the time division multiple access FDD/TDD dual mode wireless unit according to the present invention. This embodiment is different from the first embodiment shown in FIG. 2 in that a mode switch 37 is disposed in the rear of the first intermediate frequency filters 9a and 9b. In place of the following second intermediate frequency band-pass filters 15a and 15b and the demodulators 16a and 16b, a synchronous detection circuit is disposed which consists of an intermediate frequency amplifier 38, multipliers 39 and 40, 90°-phase shifter 41 and base-band low-pass filters 43 and 44. Moreover, a mode switch 42 for selectively receiving the outputs from the m-times multiplier 18 or the n-times multiplier 14 is provided for the 90°-phase shifter 41.

As a result of the foregoing structure, the second intermediate frequency circuit and the demodulator can be replaced by the synchronous detection circuit. In the foregoing case, the oscillation frequency of the second local oscillator 12 is set to be 130 MHz, the intermediate frequency of the TDD receiving circuit is set to be 260 MHz and the intermediate frequency of the FDD receiving circuit is set to be 130 MHz. Moreover, the oscillation frequencies of the first intermediate frequency oscillators 8a and 8b are required to be controlled to correspond to the mode, transmission and the reception to be adaptable to the transmission and reception frequencies in the embodiment shown in FIG. 2. The structure of the synchronous detection circuit may be varied as well as the illustrated structure. Since the synchronous detection circuit is a known technique, its detailed description is omitted here.

According to this embodiment, the synchronous detection circuit is employed in place of the second intermediate frequency circuit and the demodulator according to the first embodiment so that the structure of the circuit is simplified.

Figure 6:
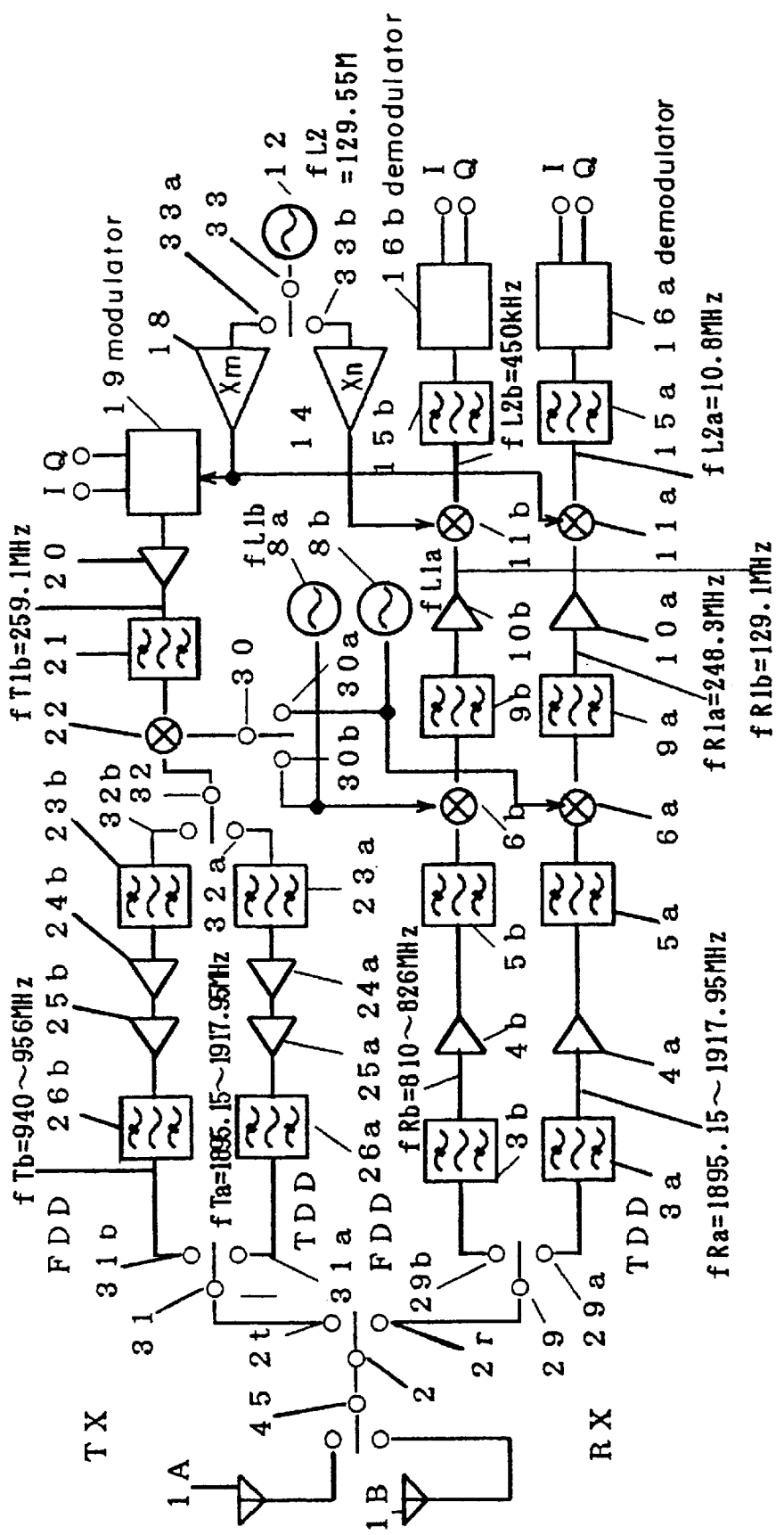
FIG. 6 is a block diagram showing a fifth embodiment of a time division multiple access FDD/TDD dual mode wireless unit according to the present invention.
Figure 7:
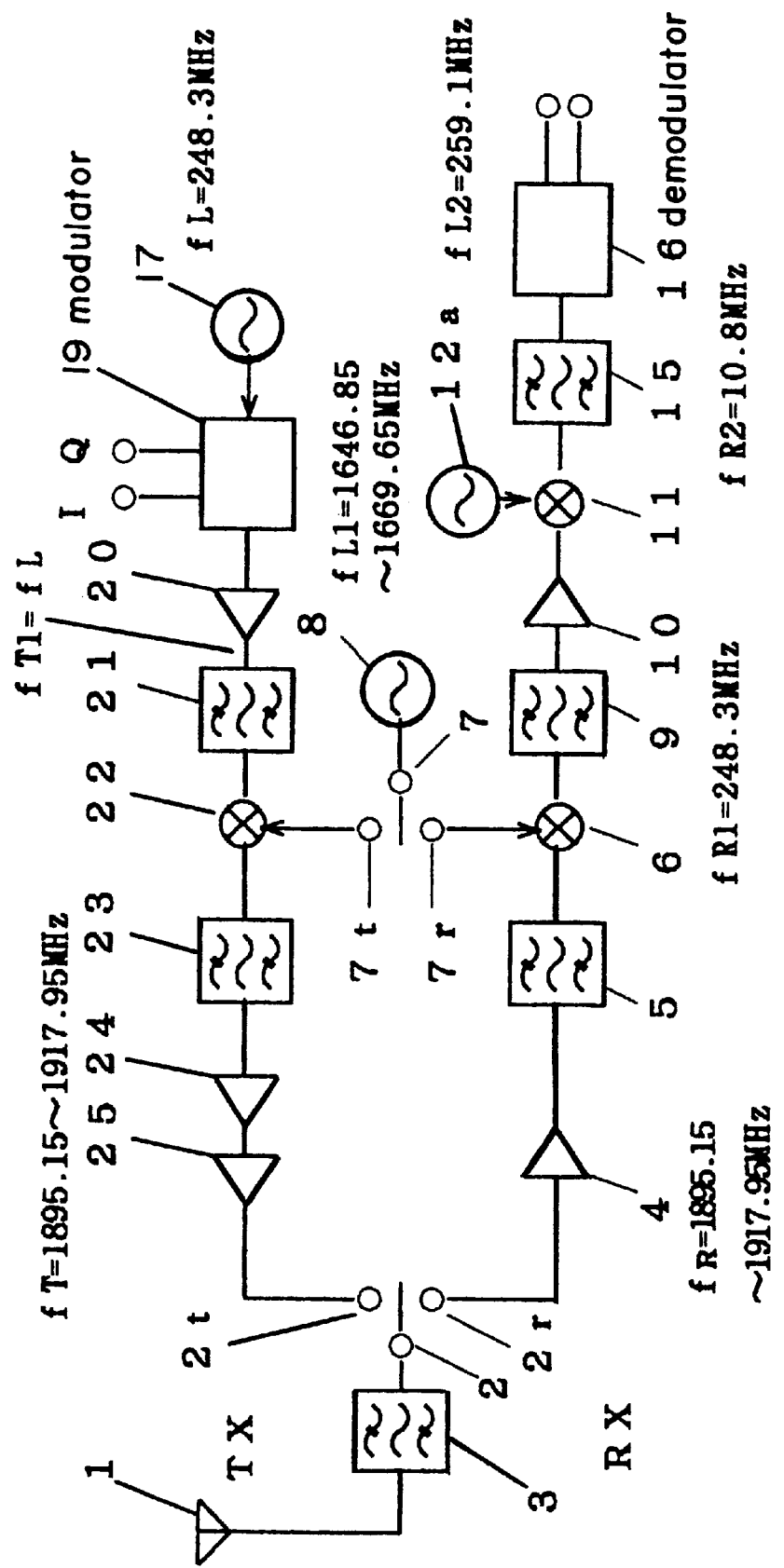
FIG. 7 is a block diagram showing a conventional time division multiple access FDD wireless unit.

Referring to FIG. 6, there is shown therein a block diagram of a fifth embodiment of the time division multiple access FDD/TDD dual mode wireless unit according to the present invention. This embodiment is different from the first embodiment shown in FIG. 2 in that antennas 1A and 1B and a diversity switch 45 are provided in place of the antenna 1. Although omitted from illustration, the reception sensitivities of the antennas 1A and 1B when a signal is received are subjected to a comparison to switch the diversity switch 45 is switched to a contact so that excellent transmission and reception sensitivities are maintained. Since the diversity technique is a known technique, its detailed description is omitted here.

As described above, the time division multiple access FDD/TDD dual mode wireless unit according to the present invention receives an output from the n-times multiplier at a second local oscillator for the TDD system when a signal is received by the TDD method. When a signal is received by the FDD method, an output from the m-times multiplier (or the m-divider) is supplied by the second local oscillator for the FDD method. When a signal is transmitted by the TDD method or FDD method, an output from the m-times multiplier (or the m-divider) is received by the modulator. Thus, the number of oscillators can further be decreased. As a result, the structure of the circuit can be simplified.

As described in the first to fifth embodiments, according to the present invention, the number of oscillators, filters and the like can be decreased and the structure of the circuit can be simplified.

The transmission and reception frequencies, the frequencies set to each section of the circuit, the values such as the multiplication ratio, the number of amplifiers and filters and the method of modulating the carrier are described as examples. They may, of course be, be changed if necessary. For example, the FDD system requires a large output, a large-output power amplifier may be added in the rear of the high-frequency power amplifier adapted to the FDD system. Among the high-frequency band-pass filters, those on the output side of the power amplifier may be replaced by low-pass filters.

The techniques according to each embodiment may be embodied solely or combined to each other. As for detailed circuit structure, it may be modified within the scope of the present invention.

As described above, the time division multiple access FDD wireless unit according to the present invention comprises the second oscillation means for oscillating the second frequency, the first multiplying/dividing means for multiplying the second frequency by n or dividing the same by n, and the second multiplying/dividing means for multiplying the second frequency by m or dividing the same by m. Therefore, advantages can be realized in that the number of oscillations can be decreased and the structure of the circuit can be simplified.

The time division multiple access FDD/TDD dual mode wireless unit according to the present invention has an advantage in that the number of the oscillators can further be decreased.

A first embodiment of a two-frequency band-pass filter according to the present invention will now be described. FIG. 10 is a block diagram of an essential portion of the first embodiment of the two-frequency band-pass filter. FIGS. 11 to 15 are diagrams for assisting the explanation of this embodiment. Referring to FIG. 10, reference numeral 211 represents a first band-pass filter permitting frequencies of 950 MHz to pass through, 212 represents a second band-pass filter permitting frequencies of 1.9 GHz to pass through, 213 represents a first phase shifter permitting phase angle φ1 to pass through, 214 represents a second phase shifter permitting phase angle φ2 to pass through, 215 represents a common input terminal, and 216 represents a common output terminal.

Figure 11A:
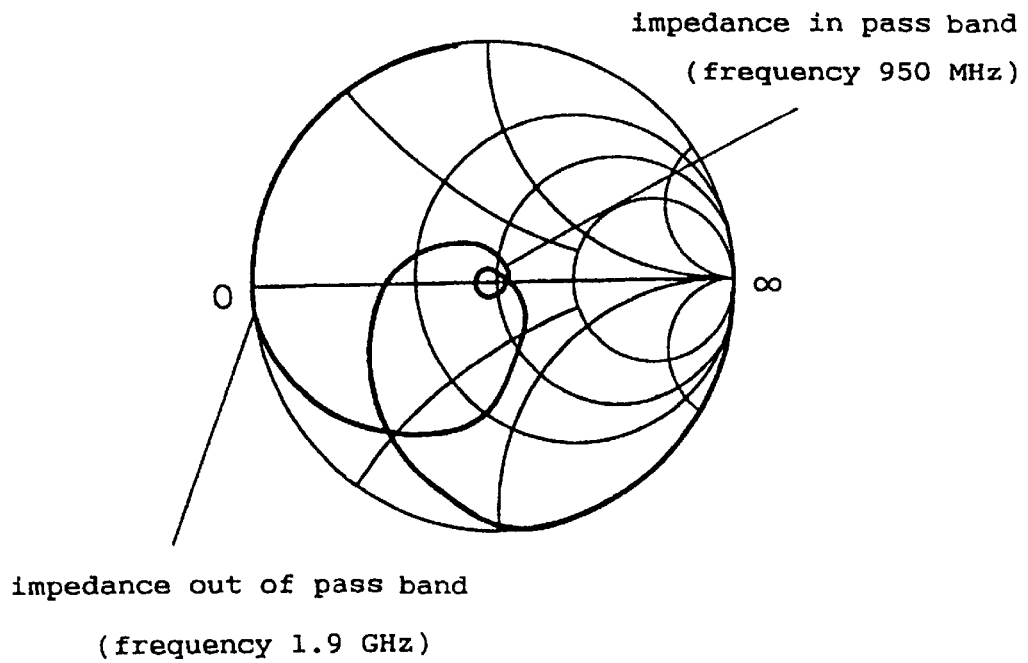
FIG. 11 shows impedance of first and second band-pass filters for explaining the operation of the first embodiment of the structure shown in FIG. 10.
Figure 11B:
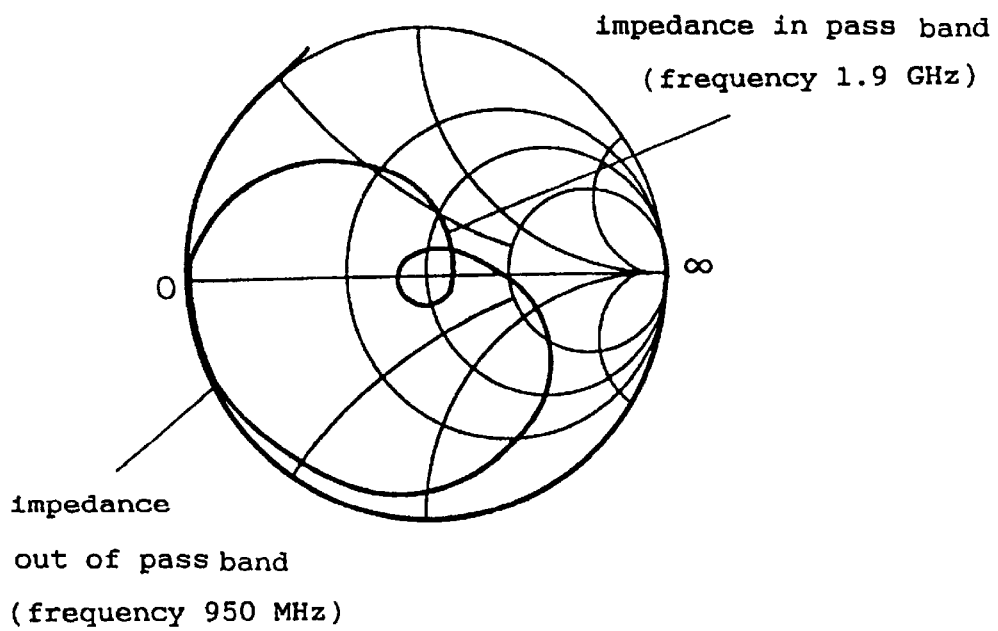

FIGS. 11(a) and 11(b) shows results of plotting input and output impedance of the first and second filters in the Smith-chart. Since a band-pass filter generally matches with the characteristic impedance in the pass band, the band-pass filter has an impedance near the center of the chart. The band-pass filter has an impedance near the outside of the chart if the frequency is out of the pass band.

Figure 12:
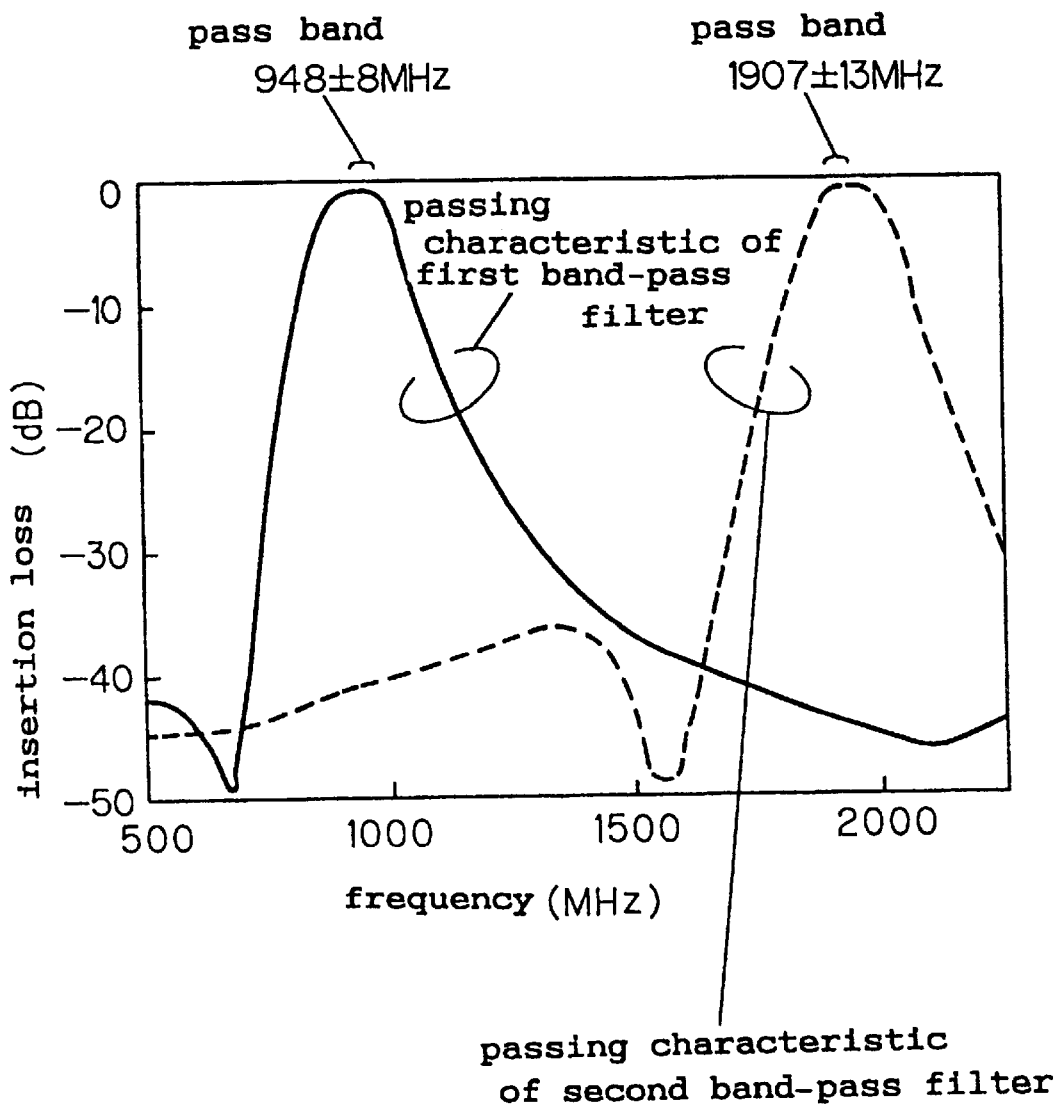
FIG. 12 is a graph showing the characteristics of the first and second band-pass filter for explaining the operation of the first embodiment shown in FIG. 10.
Figure 13:
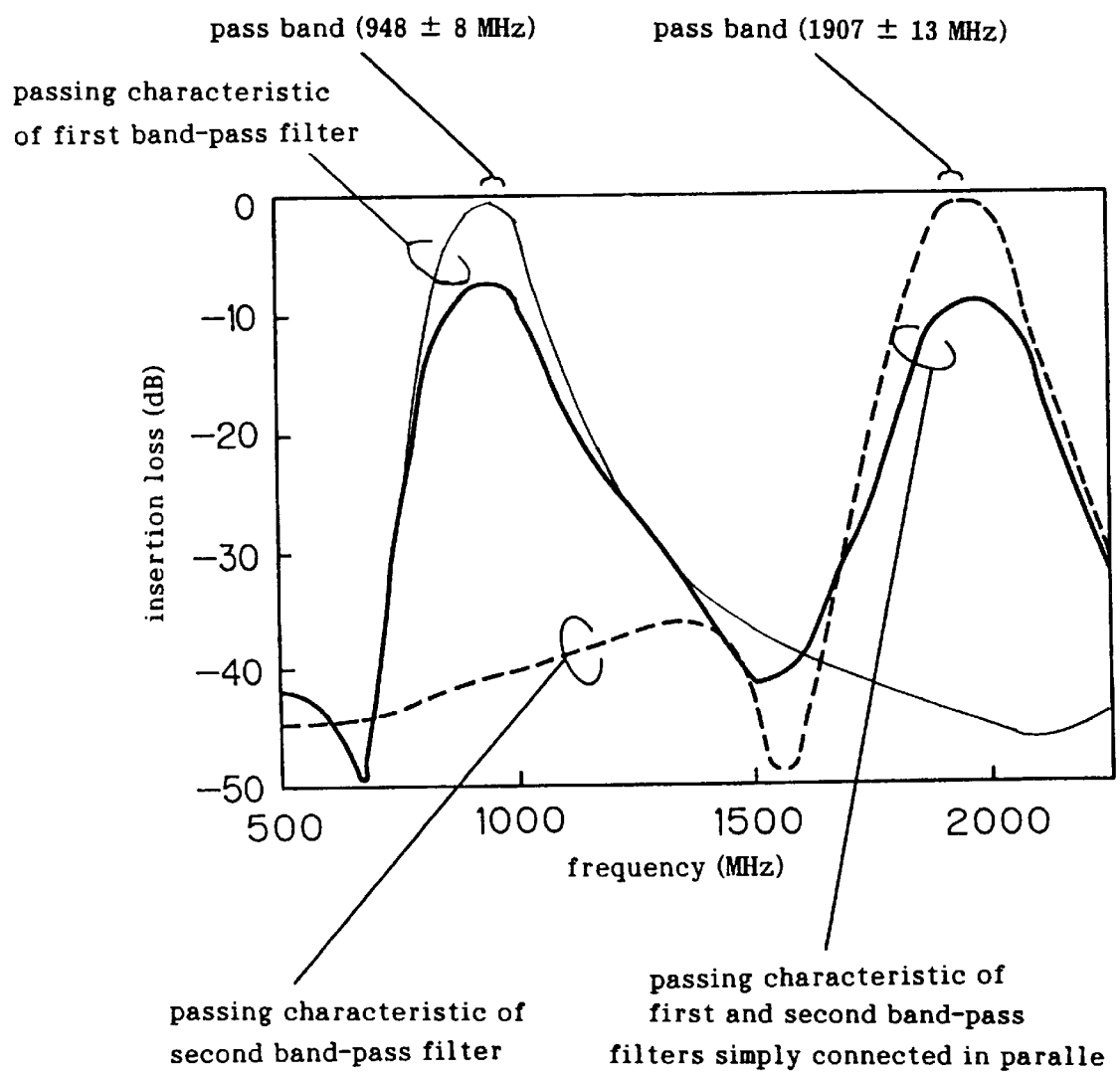
FIG. 13 is a graph showing the characteristic for explaining another operation state of the first embodiment shown in FIG. 10.
Figure 25:
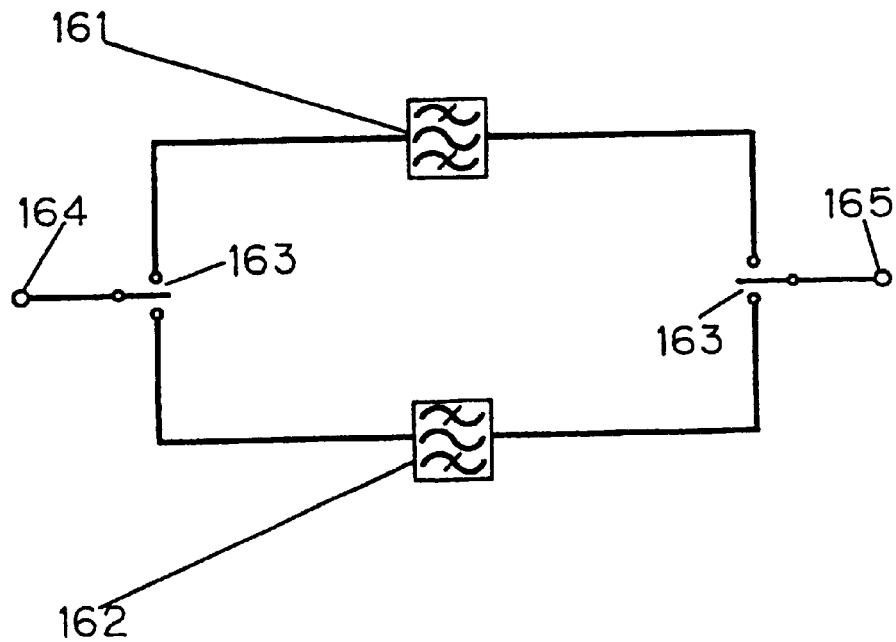
FIG. 25 is a block diagram showing an essential portion of a conventional two-frequency band-pass filter.
Figure 26:
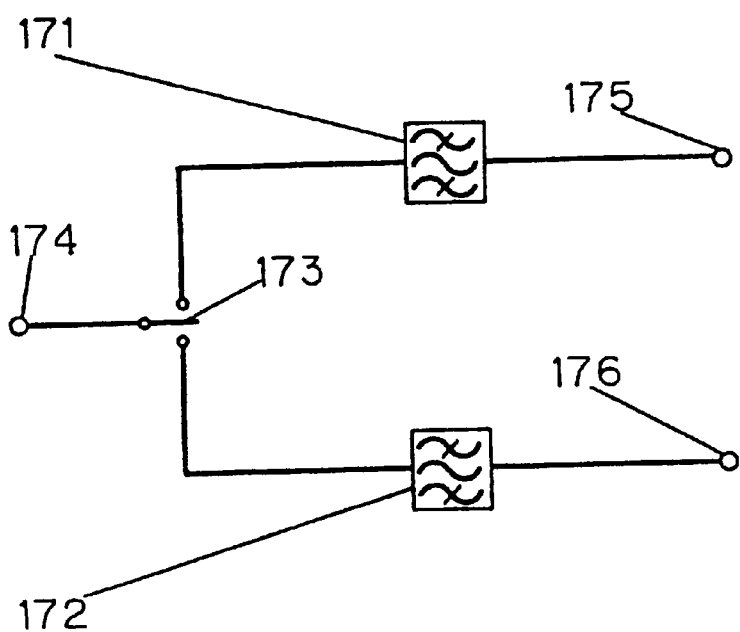
FIG. 26 is a block diagram showing an essential portion of a conventional two-frequency branching filter.

FIG. 12 shows the transmission characteristic of each of the first and second filters. When the filters are connected in parallel and the input and output terminals are commonly connected, the signal in the pass band of the first filter 211 flows to the second filter 212 because the impedance of the band of the second filter 212 is low, thus resulting a loss. In the foregoing case, a transmission characteristic shown in FIG. 13 is realized and, therefore, the insertion loss deteriorates and the filter characteristic is broken. Accordingly, a switch 163 according to a conventional structure shown in FIG. 25 has been employed to make each filter to be isolated. In this embodiment, the switch according to the conventional example, which requires a control signal, is not employed but phase shifters permitting phase angles of φ1 and φ2 to pass through are connected to the input and output terminals of the filters.

Figure 14A:
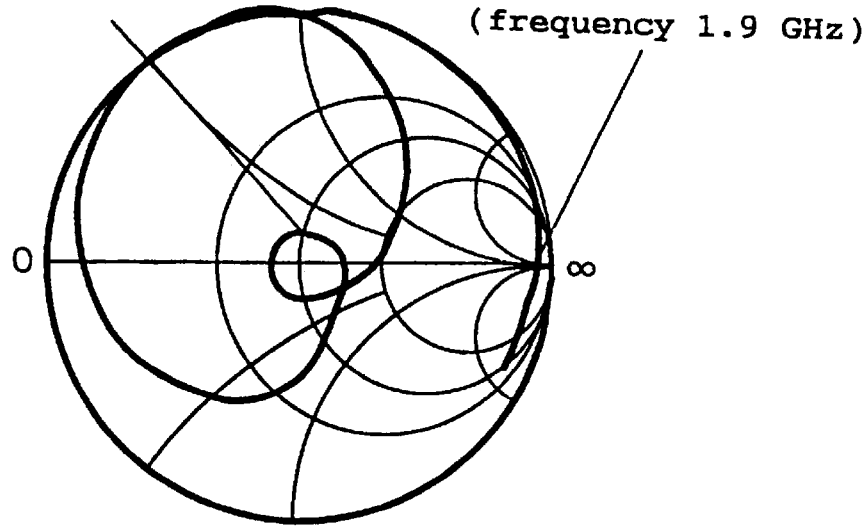
FIG. 14 is a graph showing the characteristics of the first and second band-pass filters after the impedance has been changed for explaining the operation of the first embodiment shown in FIG. 10.
Figure 14B:
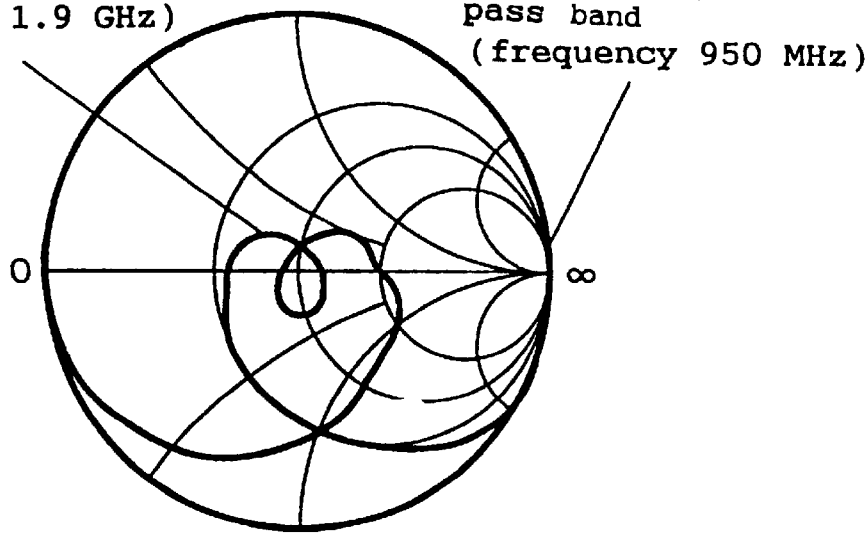
Figure 15:
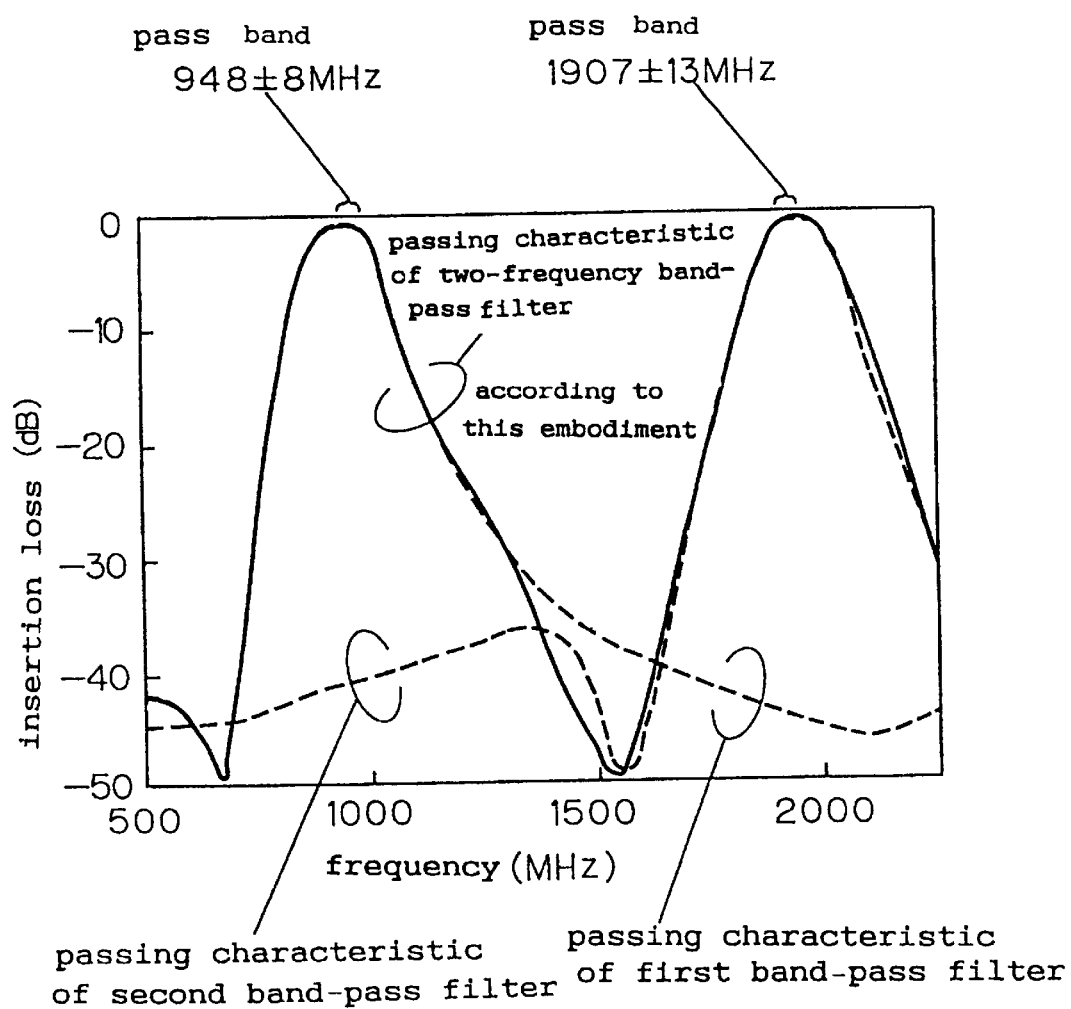
FIG. 15 is a graph showing the characteristic of a two-frequency band-pass filter according to a first embodiment shown in FIG. 10.

As shown in FIG. 14(a), in the first filter 211, the angular degree of phase angle φ1 of the first phase shifter 213 is adjusted to an appropriate value to make the impedance in the pass band (1.9 GHz) of the second filter 212 to be a high impedance value. Similarly, as shown in FIG. 14(b), in the second filter 212, the angular degree of phase angle φ2 of the second phase shifter 214 is adjusted to an appropriate value to make the impedance in the pass band (950 MHz) of the first filter 211 to be a high impedance value. The foregoing elements are connected in parallel and connected by the common input terminal 215 and the common output terminal 216. In the foregoing case, the impedance of the second filter 212 in the pass band (950 MHz) of the first filter 211 is made to be a high impedance value near open circuit. Therefore, leakage of the band component of 950 MHz to the second filter 212 can substantially be prevented. Thus, the insertion loss characteristic of the first filter 211 can be maintained. Similarly, the impedance of the first filter 211 in the pass band (1.9 GHz) of the second filter 212 is made to be a high impedance value near open circuit. Therefore, leakage of the band component of 1.9 GHz to the first filter 211 can substantially be prevented. Thus, the insertion loss characteristic of the second filter 212 can be maintained. Therefore, overall transmission characteristic as shown in FIG. 15 is realized.

Figure 16:
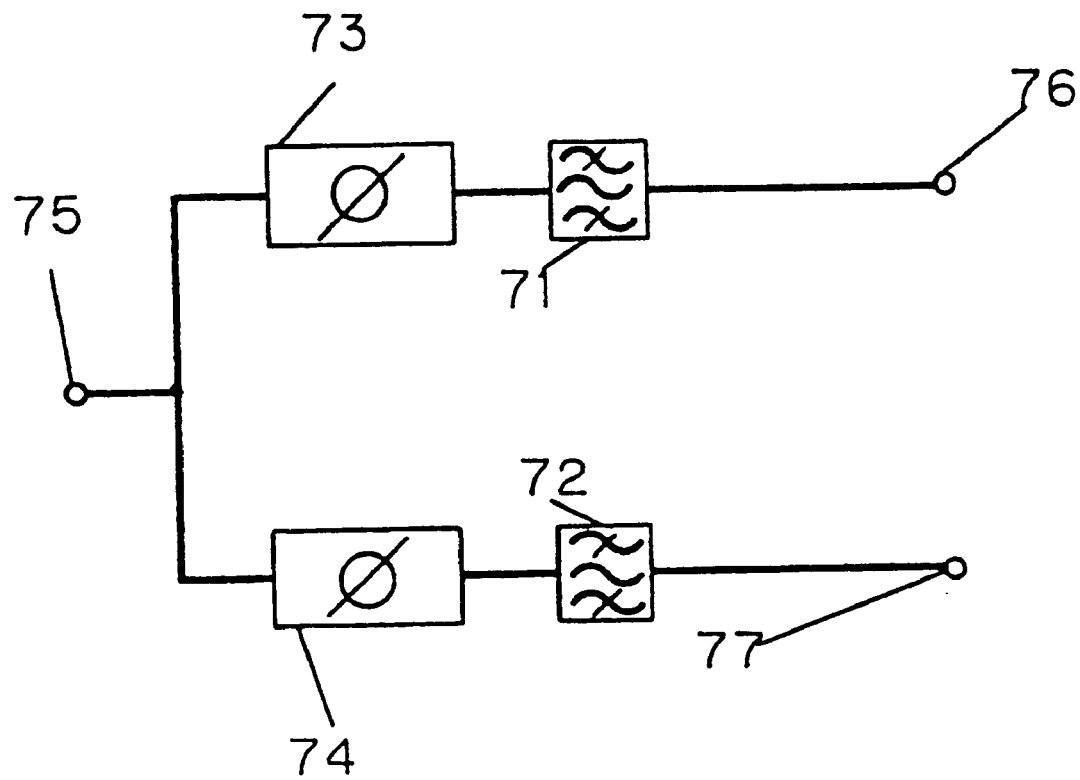
FIG. 16 is a block diagram showing an essential portion of a first embodiment of a two-frequency branching filter according to the present invention.

FIG. 16 is a block diagram showing an essential portion of the first embodiment of the two-frequency branching filter according to the present invention. Referring to FIG. 16, reference numeral 71 represents a first band-pass filter permitting frequency of 950 MHz to pass through, 72 represents a second band-pass filter permitting frequency of 1.9 GHz to pass through, 73 represents a first phase shifter passing phase angle of φ1, 74 represents a second phase shifter passing phase angle of φ2, 75 represents a common input terminal, 76 represents a first output terminal, and 77 represents a second output terminal. On the basis of the same principle as that employed in the embodiment shown in FIG. 10, in the first filter 71, the angular degree of phase angle φ1 of the first phase shifter 73 is adjusted to an appropriate value to make the impedance in the pass band (1.9 GHz) of the second filter 72 to be a high impedance value. In the second filter 72, the angular degree of phase angle φ2 of the second phase shifter 74 is adjusted to an appropriate value to make the impedance in the pass band (950 MHz) of the first filter 71 to be a high impedance value. Therefore, leakage of the band component of 1.9 GHz from the common input terminal 75 to the second filter 72 can substantially be prevented. Also leakage of the 950 MHz component to the first filter 71 can substantially be prevented. As a result, a two-frequency branching filter can be constituted in which only the 950 MHz component can be taken out at the first output terminal 76 with only the transmission loss taking place due to the first filter 71 and only the 1.9 GHz component can be taken out at the second output terminal 77 with only the transmission loss taking place due to the second filter 77.

Figure 17:
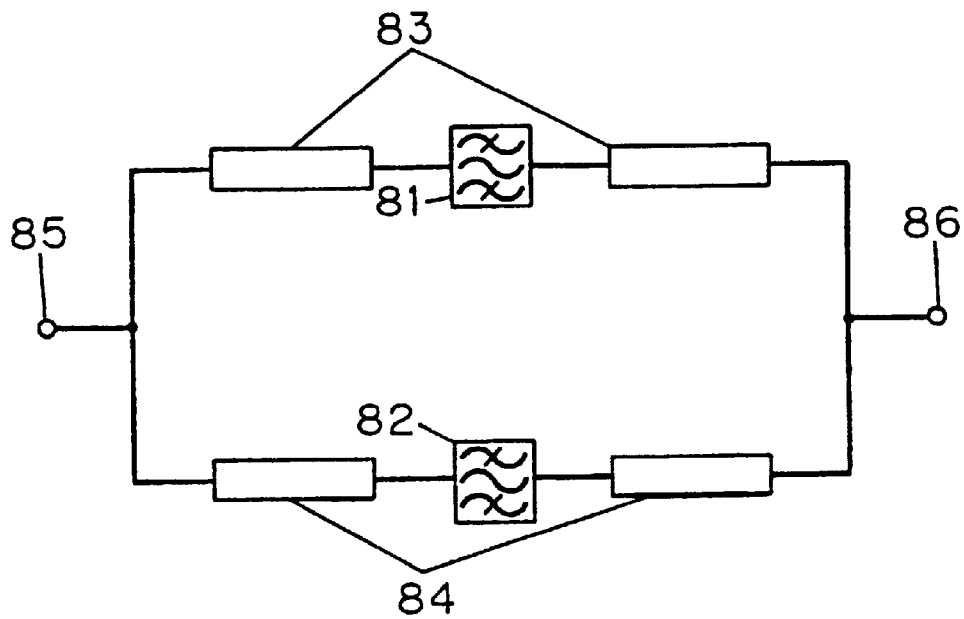
FIG. 17 is a block diagram showing an essential portion of a second embodiment of a two-frequency band-pass filter according to the present invention.

Referring to FIG. 17, there is shown therein a block diagram showing a second embodiment of the two-frequency band-pass filter according to the present invention. Reference numerals 81 and 82 represent first and second band-pass filters similar to those according to the embodiment shown in FIG. 10. Reference numeral 83 represents a transmission line having an electrical length of L1, 84 represents a second transmission line having an electrical length of L2, and 85 and 86 represent common input terminal and a common output terminal. Similarly to the embodiment shown in FIG. 10, in the first filter 81, the impedance in the 1.9 GHz band is made to be a high impedance value by making the electrical length L1 of the first transmission line to be an appropriate value. In the second filter 82, the impedance in the 950 MHz band is made to be a high impedance value by making the electrical length L2 of the second transmission line 84 to be an appropriate value. Thus, an effect similar to that obtainable from the embodiment shown in FIG. 10 can be obtained.

Figure 18:
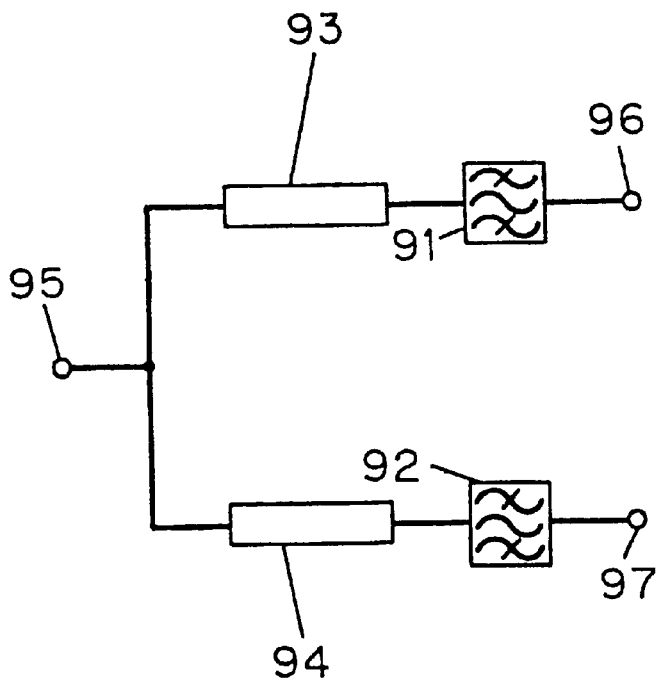
FIG. 18 is a block diagram showing an essential portion of a second embodiment of a two-frequency branching filter according to the present invention.

FIG. 18 is a block diagram showing an essential portion of a second embodiment of the two-frequency branching filter according to the present invention. This embodiment has a structure such that the phase shifter according to the embodiment shown in FIG. 16 is replaced by a transmission line. On the basis of the same principle employed in the embodiment shown in FIG. 17, an effect similar to that obtainable from the embodiment shown in FIG. 16 can be obtained.

Figure 19:
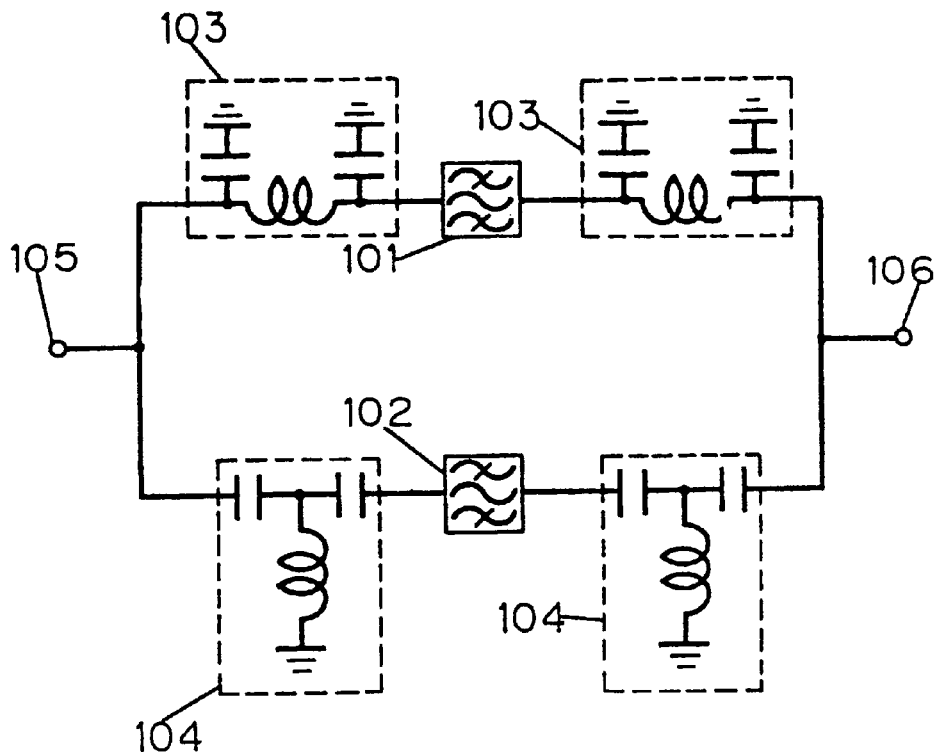
FIG. 19 is a circuit diagram showing an essential portion of a third embodiment of a two-frequency band-pass filter according to the present invention.

FIG. 19 is a block diagram of an essential portion of a third embodiment of the two-frequency band-pass filter according to the present invention. Reference numerals 101 and 102 represent first and second band-pass filters similar to those according to the embodiment shown in FIG. 10. Reference numeral 103 represents a low-pass filter permitting frequencies of 950 MHz to pass through, 104 represents a high-pass filter permitting frequencies of 1.9 GHz to pass through, and 105 and 106 represent a common input terminal and a common output terminal. Similarly to the embodiment shown in FIG. 10, in the first filter 101, the impedance in the band of 1.9 GHz is made to be a high impedance value by adjusting the values of the circuit devices, such as capacitors and coils, of the low-pass filter 103 to make the pass-angle in the band of 1.9 GHz to be an appropriate value. Also in the second filter 102, the impedance in the band of 950 MHz is made to be a high impedance value by adjusting the values of the circuit devices, such as capacitors and coils, of the high-pass filter 104 to make the pass-angle in the band of 950 MHz to be an appropriate value. Thus, an effect similar to that obtainable from the embodiment shown in FIG. 10 can be obtained.

Figure 20:
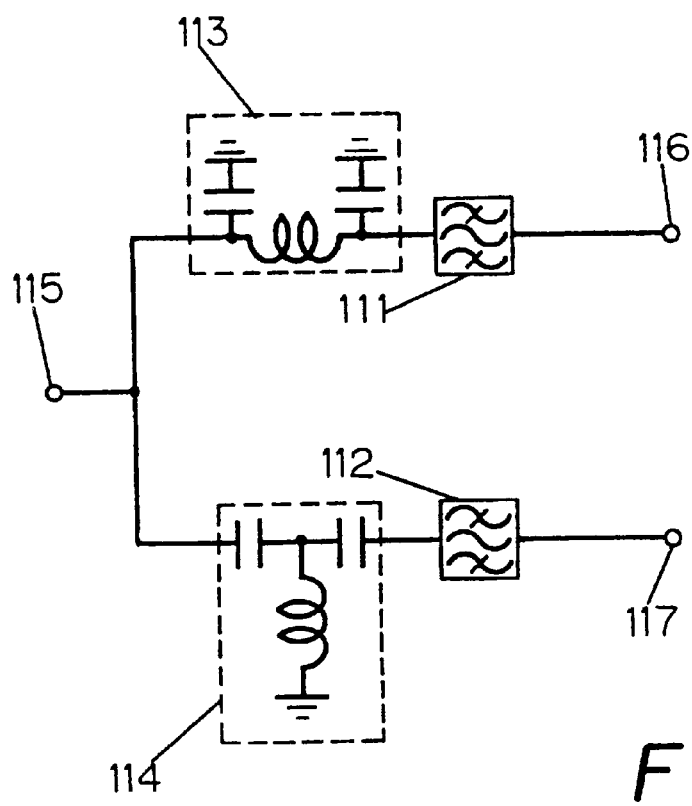
FIG. 20 is a circuit diagram showing an essential portion of a third embodiment of a two-frequency branching filter according to the present invention.

FIG. 20 is a block diagram showing an essential portion of a third embodiment of a two-frequency branching filter according to the present invention. This embodiment has a structure such that the phase shifters according to the embodiment shown in FIG. 16 are replaced by a low-pass filter and a high-pass filter. On the basis of the same principle as that employed in the embodiment shown in FIG. 19, an effect similar to that obtainable from the embodiment shown in FIG. 16 can be obtained.

Although the embodiments shown in FIGS. 19 and 20 comprise lumped element circuit devices to serve as the low-pass filter and the high-pass filter, a distributed constant line may be employed to obtain a similar effect.

Figure 21:
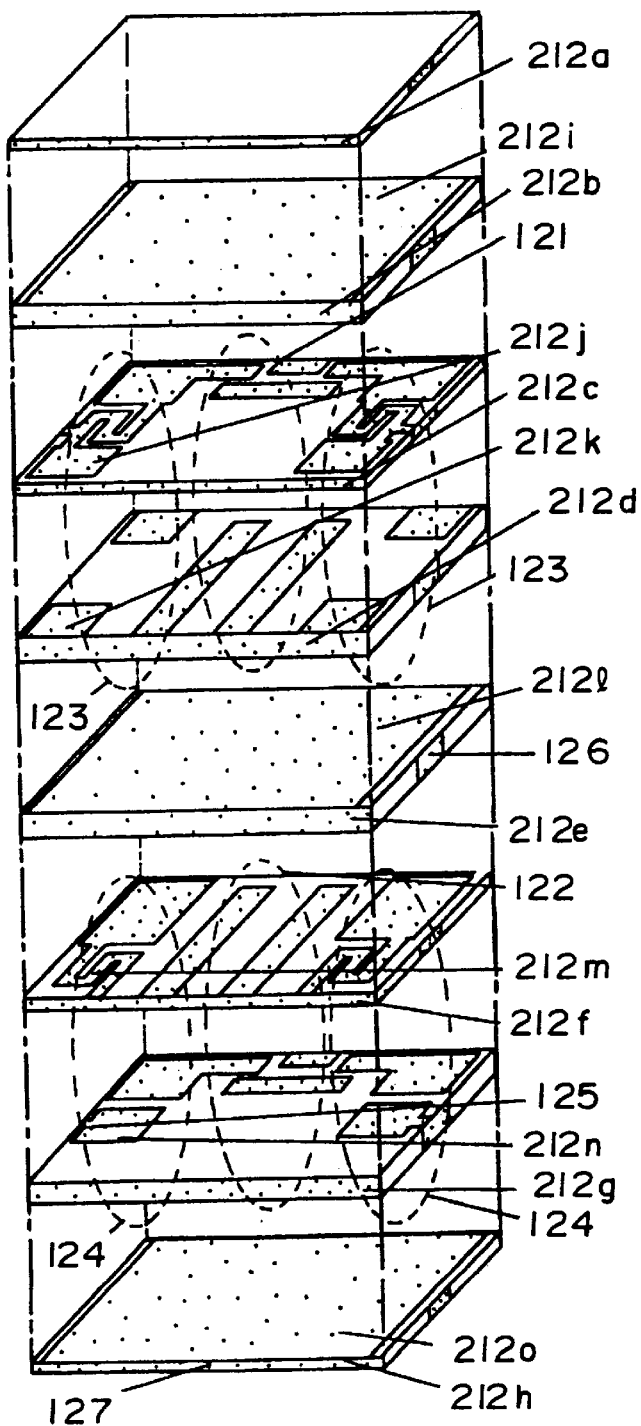
FIG. 21 is a schematic view showing a fourth embodiment of a two-frequency band-pass filter according to the present invention.

FIG. 21 is a structural view showing a fourth embodiment of the two-frequency band-pass filter according to the present invention. This embodiment has a structure such that the two-frequency band-pass filters shown in FIG. 19 are integrally formed into a dielectric multi-layered structure. FIG. 21 shows an example in which two band-pass filters are vertically laminated into one unit. Referring to FIG. 21, reference numerals 212a to 212h represent first to eighth dielectric-material layers, 212i, 212l and 212o represent first, second and third grounded shielding layers, and 212j, 212k, 212m and 212n represent first to fourth pattern layers. Reference numeral 121 represents a first band-pass filter comprising two ¼ wavelength resonators having short-circuited ends; a capacitor formed by opposite electrodes for connecting the two ¼ wavelength resonators; and the like. Reference numeral 122 represents a second band-pass filter comprising two ¼ wavelength resonators having resonance frequency different from the resonator included in the first band-pass filter 121; and a capacitor formed by opposite electrodes for connecting the ¼ wavelength resonators; and the like. Reference numeral 123 represents a low-pass filter comprising a grounded capacitor formed by opposite electrodes and a series coil formed by winding wires. Reference numeral 124 represents a high-pass filter comprising a series capacitor formed by opposite electrodes and a grounded coil formed by winding wires. Reference numeral 125 represents an input terminal, 126 represents an output terminal, and 127 represents a grounded electrode. In this embodiment, a similar effect obtainable from the embodiment shown in FIG. 19 enables a two-frequency band-pass filter can be realized. Since the integrated structure is employed, the size of the circuit can be reduced.

Figure 22:
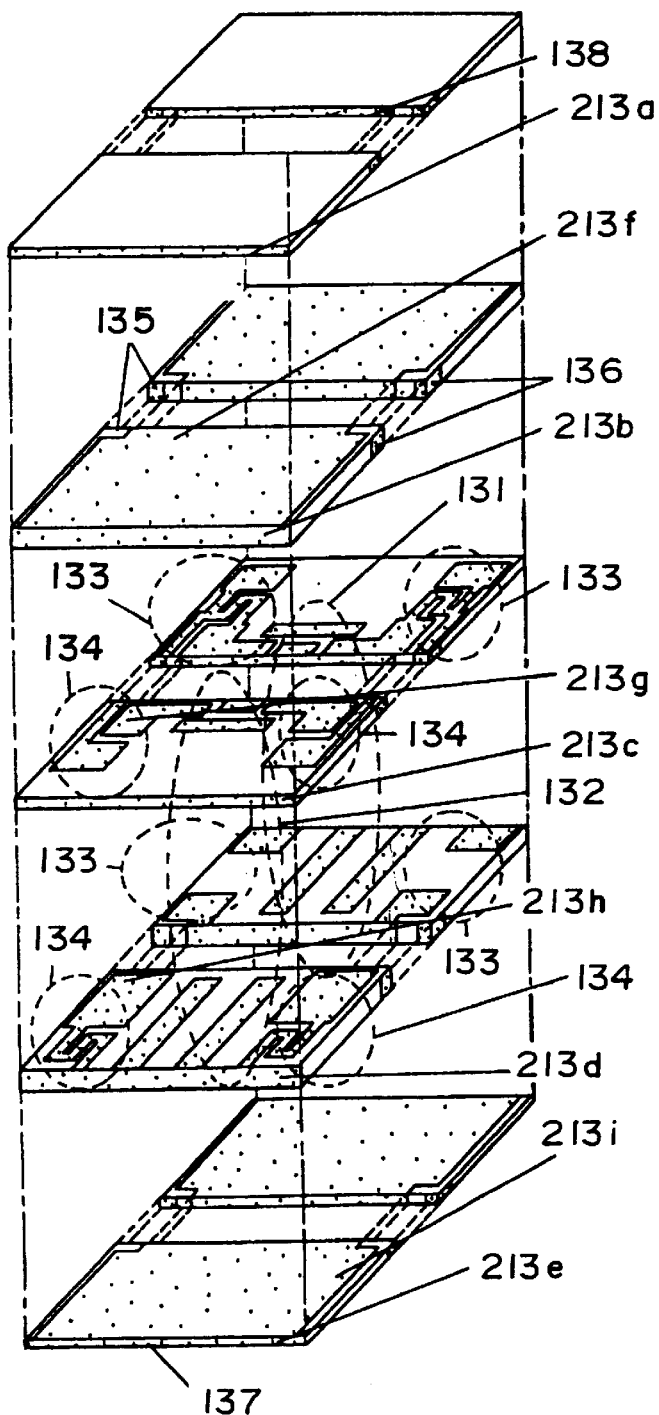
FIG. 22 is a schematic view showing a fifth embodiment of the two-frequency band-pass filter according to the present invention.

FIG. 22 is a schematic view showing a fifth embodiment of a two-frequency band-pass filter according to the present invention. This embodiment has another structure in which the dielectric-material layers of the two-frequency band-pass filter is integrally laminated. In this embodiment, two band-pass filters are disposed horizontally when they are integrally formed. Referring to FIG. 22, reference numerals 213a to 213e represent first to fifth dielectric-material layers, 213f and 213i represent first and second grounded shielding layers, and 213g and 213h represent first and second pattern layers. Reference numeral 131 represents a first band-pass filter, 132 represents a second band-pass filter, 133 represents a low-pass filter, 134 represents a high-pass filter, 135 represents an input terminal, 136 represents an output terminal, 137 represents a grounded electrode, and 138 represents an internal shielded electrode. Also this embodiment is able to realize a two-frequency band-pass filter due to an effect similar to that obtainable from the embodiment shown in FIG. 19. Moreover, the size of the circuit can be reduced similarly to the embodiment shown in FIG. 21. Although the surface area is enlarged as compared with the embodiment shown in FIG. 21, the height can be shortened. A portable unit for use in mobile communication is usually required to have a short size rather than the reduced surface area. Therefore, this embodiment is effective in the foregoing case.

Figure 23:
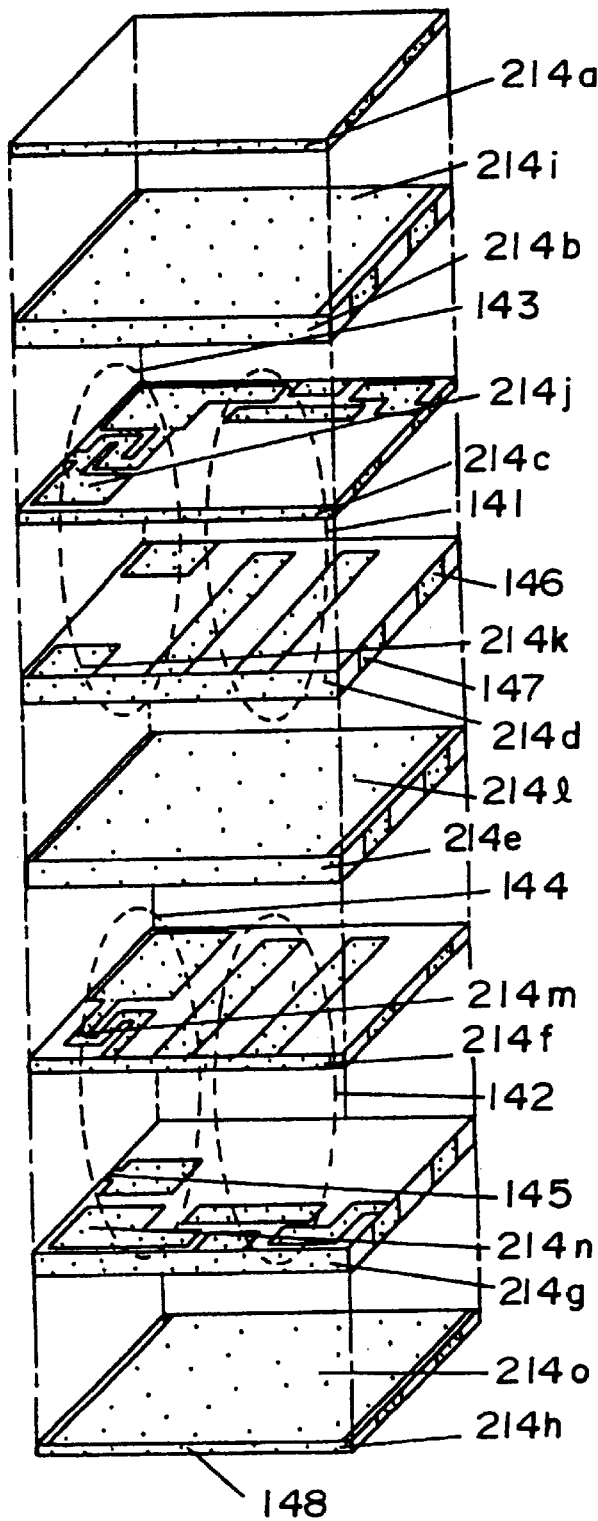
FIG. 23 is a schematic view showing a fourth embodiment of a two-frequency branching filter according to the present invention.

FIG. 23 is a schematic view showing a fourth embodiment of the two-frequency branching filter according to the present invention. This embodiment has a structure such that the two-frequency branching filter shown in FIG. 20 is formed by integrally forming dielectric-material layers. Referring to FIG. 23, reference numerals 214a to 214h represents first to eighth dielectric-material layers, 214i, 214l and 214o represent first, second and third grounded shielding layers, 214j, 214k, 214m and 214n represent first to fourth pattern layers. Reference numeral 141 represents a first band-pass filter, 142 represents a second band-pass filter, 143 represents a low-pass filter, 144 represents a high-pass filter, 145 represents an input terminal, 146 represents a first output terminal, 147 represents a second output terminal, and 148 represents a grounded electrode. As a result of the structure according to this embodiment, a similar effect to that obtainable from the embodiment shown in FIG. 20 enables a two-frequency branching filter to be realized. Since the structure formed integrally is employed, the size of the circuit can be reduced.

Figure 24:
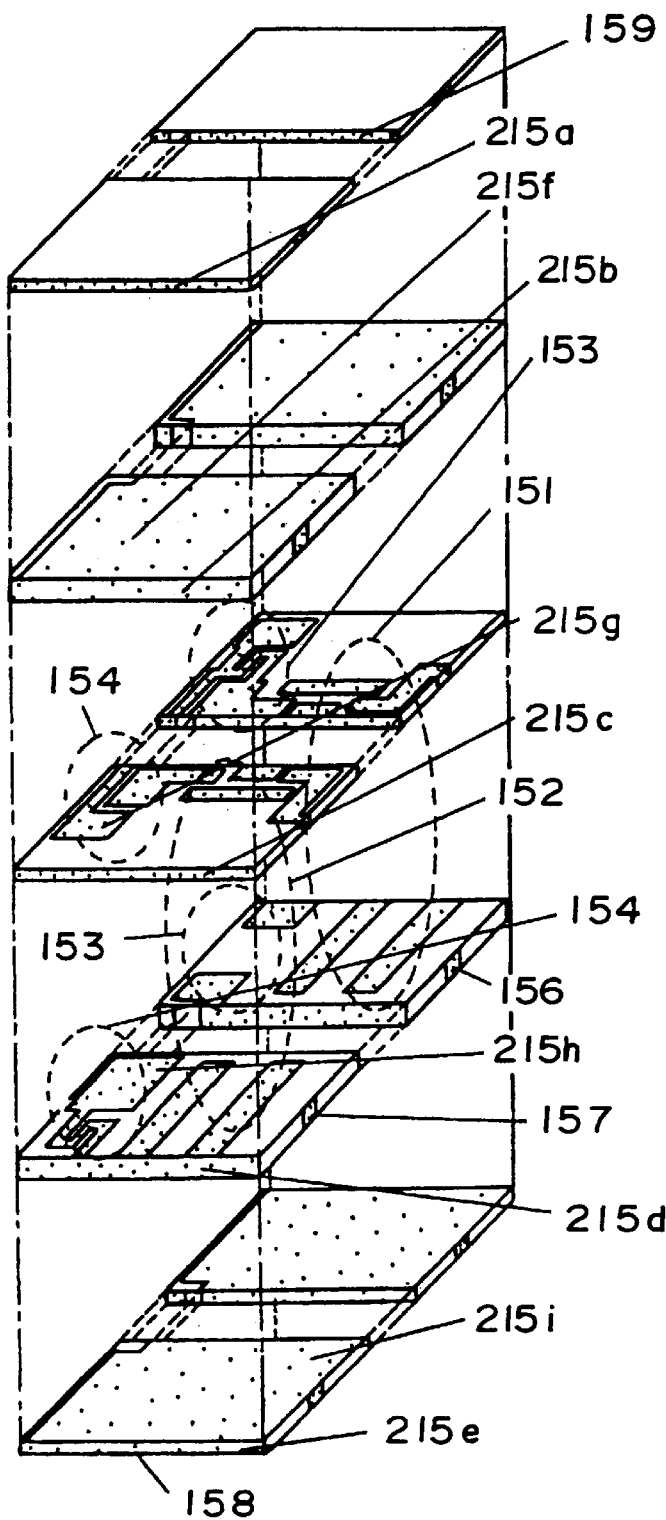
FIG. 24 is a schematic view showing a fifth embodiment of the two-frequency branching filter according to the present invention.

FIG. 24 is a schematic view showing a fifth embodiment of a two-frequency branching filter according to the present invention. This embodiment is different from the embodiment shown in FIG. 23, which has a structure such that the two-frequency branching filter shown in FIG. 20 is formed by integrally forming dielectric-material layers. In this embodiment two band-pass filters are horizontally arranged when they are formed integrally. The structure according to this embodiment is substantially the same as that according to the embodiment shown in FIG. 22. Reference numerals 215a to 215e represent first to fifth dielectric-material layers, 215f and 215i represent first and second grounded shielding layers, and 215g and 215h represent first and second pattern layers. Reference numeral 151 represents a first band-pass filter, 152 represents a second band-pass filter, 153 represents a low-pass filter, 154 represents a high-pass filter, 155 represents and input terminal. Reference numeral 156 represents a first output terminal, and 157 represents a second output terminal and 158 represents an internal shielded electrode. Also the structure according to this embodiment is able to obtain an effect similar to that obtainable from the embodiment shown in FIG. 20 so that a two-frequency branching filter is realized. Since the integrated structure is employed, the size of the circuit can be reduced. Although the surface area is enlarged as compared with the embodiment shown in FIG. 23, the height can be shortened advantageously when employed in a portable telephone or the like.

Although the embodiments shown in FIGS. 21 to 24 comprise the band-pass filter formed by two ¼ wavelength resonators having two short-circuited ends, three or more resonators may be provided. Another structure in which no resonator is provided may be employed to obtain a similar effect.

Although each of the embodiments shown in FIGS. 16, 18, 20, 23 and 24 comprises the branching filter, a frequency combiner can, of course, be obtained by interchanging the input and the output.

Although each of the embodiments shown in FIGS. 10 to 24 has the structure such that the first and second band-pass filters permit 950 MHz band and 1.9 GHz band to pass through to simplify the descriptions, any combination of two frequencies may, of course, be employed if the first filter permits, to pass through, the frequency higher than that permitted by the second filter to pass through as well as the conditions for the frequency are satisfied.

Although each of the embodiments shown in FIGS. 10 to 24 comprises the two-frequency band-pass filter, branching filter and the frequency combiner, similar technique enables multi-frequency band-pass filter, multi-frequency branching filter and multi-frequency combiner can be constituted which are adaptable to a multiplicity of frequencies including three frequencies.

As described above, according to the present invention, the two-frequency band-pass filter requiring no control signal and capable of reducing overall insertion loss can be realized.

Moreover, according to the present invention, the two-frequency branching filter (combiner) requiring no control signal and capable of reducing overall insertion loss can be realized.

Figure 27:
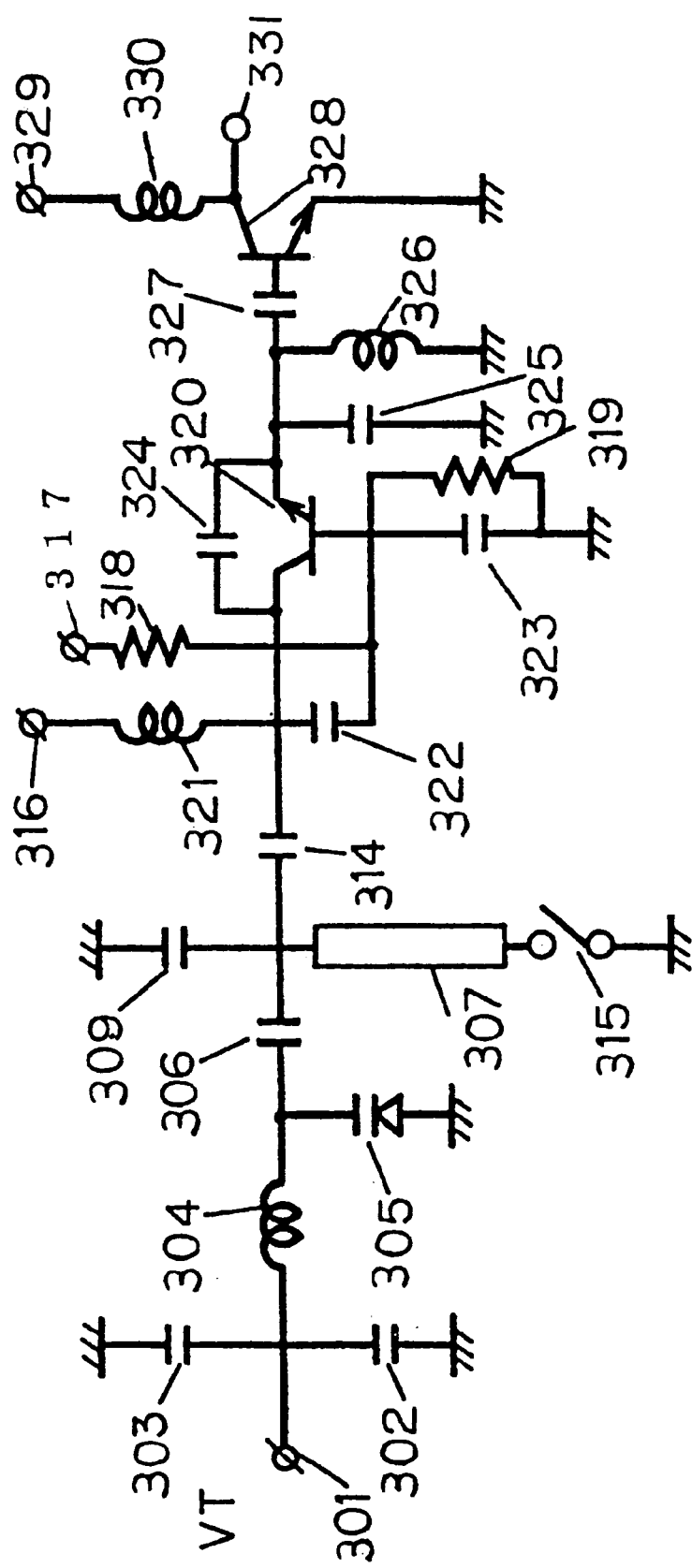
FIG. 27 is a circuit diagram showing an essential portion of a first embodiment of a multi-frequency band VCO according to the present invention.

FIG. 27 is a circuit diagram showing an essential portion of a first embodiment of a VCO with controllable frequency band. Voltage VT for varying frequency is applied to a voltage terminal 301. Then, the VT is bypassed by capacitors 302 and 303, followed by being applied to the cathode of a varactor diode 305 through a coil 304. The cathode of the varactor diode 305 is, through a capacitor 306, connected to a distributed constant line 307 and a capacitor 309 for resonance. While the anode of the same is grounded. Another end of the distributed constant line 307 is grounded through a band switch 15. The capacitor 309 for resonance frequency adjustment, the varactor diode 305 and the distributed constant line 307 form a resonance circuit. The other ends of the capacitors 302, 303 and 309 are grounded.

The connection point between the distributed constant line 307 and the capacitor 309 is connected to the collector of a resonation transistor 320 through a capacitor 314. Power supply voltage is supplied to the foregoing collector from a power supply terminal 316 through a choke coil 321. Power supply voltage is, while being divided, by a resistors 318 and 319, supplied to the base of the oscillating transistor 320 from a power supply terminal 317. The foregoing connection point is grounded through a capacitor 323 for cutting DC component. A capacitor 322 is connected between the collector and the base of the oscillating transistor 320. A capacitor 324 is connected between the collector and the emitter of the oscillating transistor 320. A capacitor 325 and a choke coil 326 are connected in parallel to the emitter of the transistor 320, and the another ends are grounded. The emitter of the transistor 320 is further connected to the base of a buffer transistor 328 through a capacitor 327. The emitter of the transistor 328 is grounded, and the collector is connected to a power source 329 through a coil 330 and further connected to an output terminal 331.

The operation of the foregoing structure will now be described. Initially, a band switch 315 is short-circuited to determine the oscillation frequency band. As a result, the resonance circuit including the distributed constant line 307 is brought into a state where an end of the distributed constant line 307 is grounded. Thus, the resonance circuit is resonated with a frequency band basically including wavelength $\lambda_1$ satisfying $\lambda_1=4L$, that is, $L=\lambda_1/4$ assuming that the length of the distributed constant line 307 is L. (hereinafter called as a "¼-wavelength model"). As a result, a oscillation circuit including the transistor 320 oscillates. Similarly, the voltage VT for varying frequency supplied to the voltage terminal 301 for varying frequency is applied to the varactor diode 305 so that the equivalent capacity of the varactor diode 305 is changed. Thus, the oscillation frequency can precisely be adjusted. The oscillation output transmitted due to oscillation of the oscillation circuit including the transistor 320 is transmitted from a buffer circuit due to the transistor 328 through the output terminal 331.

Then, the band switch 315 is opened to change the oscillation frequency band. As a result, the resonance circuit including the distributed constant line 307 resonates with a frequency band basically including wavelength $\lambda_2$ satisfying $\lambda_2=2L$, that is, $L=\lambda_2/2$ assuming that the length of the distributed constant line 307 is L (hereinafter called a "½ wavelength mode"). Thus, the oscillation circuit including the transistor 320 oscillates. Since the voltage VT for varying frequency applied to the voltage terminal 301 for varying frequency is applied to the cathode of the varactor diode 305, the equivalent capacity of the varactor diode 305 is changed. Thus, the oscillation frequency is precisely adjusted.

At this time, the resonance frequencies $f_1$ and $f_2$ are as follows:

$$f_1 = k/\lambda_1, \quad f_2 = k/\lambda_2$$

where k is a constant which is determined by the distributed constant line structure.

Therefore, $$f_1 = k/4L, \quad f_2 = k/2L$$

Thus, when the band switch 315 is opened, that is, when the leading ends of the distributed constant line 307 are opened to cause resonation to take place with the ½ wavelength mode, resonation takes place at a frequency range which is high by two times, compared with the case when the ends is short-circuited.

Figure 28:
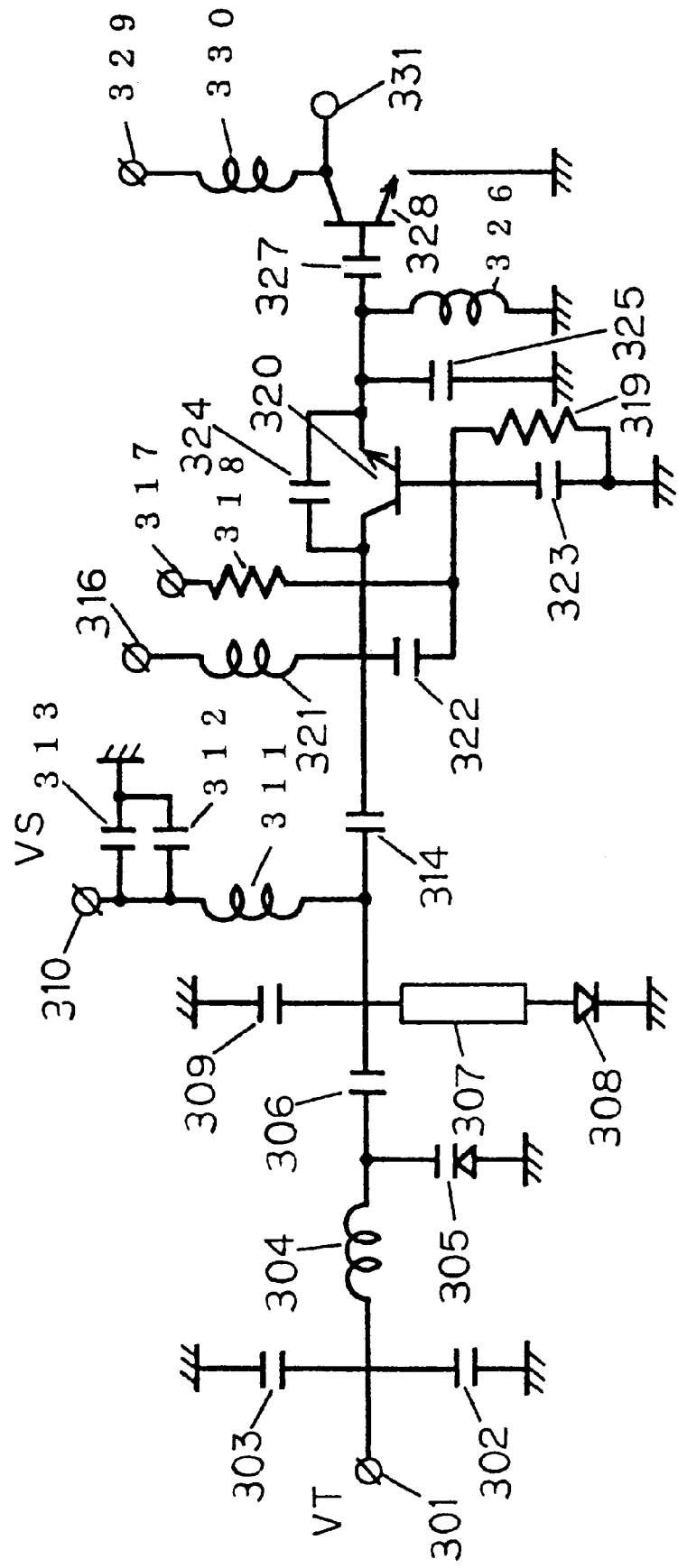
FIG. 28 is a circuit diagram showing an essential portion of a second embodiment of the multi-frequency band VCO according to the present invention.
Figure 29:
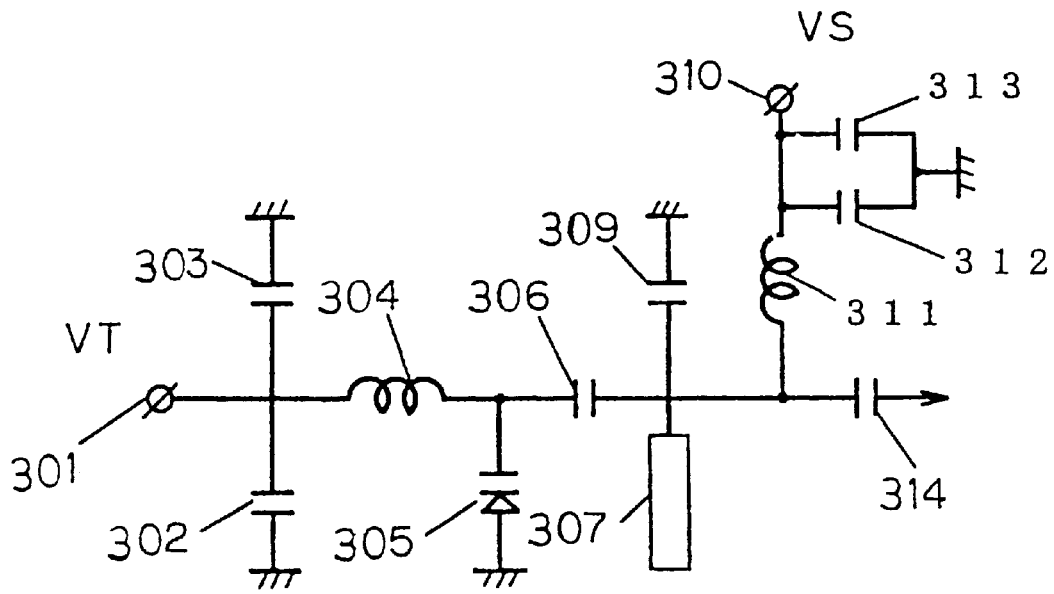
FIG. 29 is a circuit diagram showing an essential portion of a oscillation circuit shown in FIG. 28 in a predetermined operation state.
Figure 30:
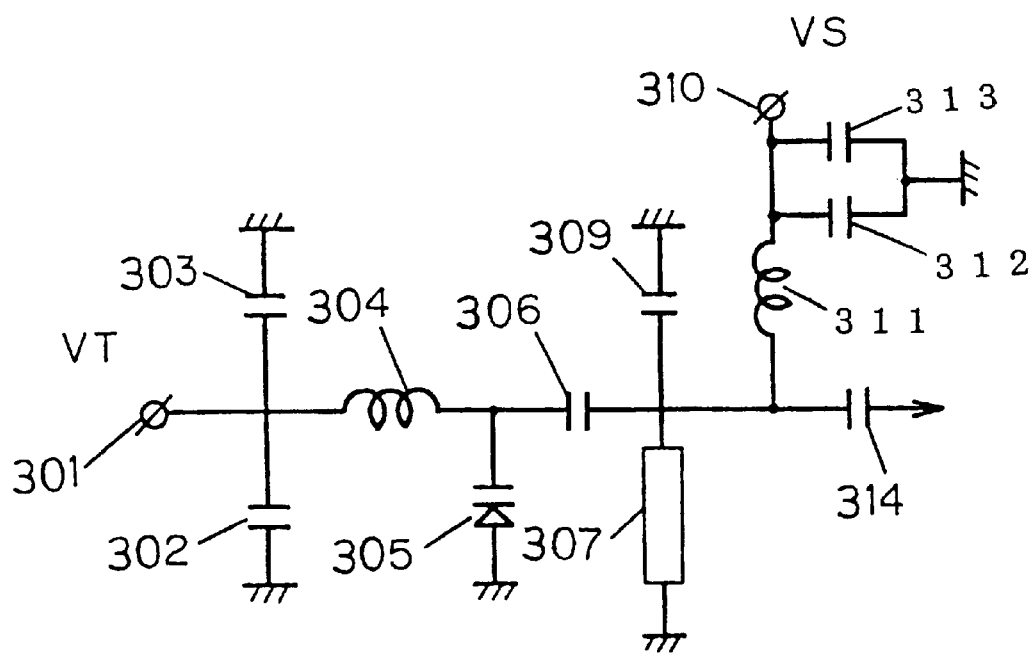
FIG. 30 is a circuit diagram showing the oscillation circuit in another operation state.

FIG. 28 is a circuit diagram showing an essential portion of a second embodiment of a VCO with controllable frequency band according to the present invention. FIG. 29 is a circuit diagram showing an essential portion of a resonance circuit when an end of the distributed constant line is opened. FIG. 30 is a circuit diagram showing an essential portion of the resonance circuit when an end of the distributed constant line is grounded. Portion having the same functions as those according to the embodiment shown in FIG. 27 are given the same reference numerals and they are omitted from description. Although the voltage VT for varying frequency is, as the first voltage, applied to the voltage terminal 301 for varying frequency similarly to the embodiment shown in FIG. 28, different from the embodiment shown in FIG. 27 is that the anode of a switching diode 308, which is a switching device, is connected in place of the band switch 315 disposed at the other end of the distributed constant line 307, the cathode of the switching diode 308 being grounded. A coil 311 is connected to a connection point between the capacitor 309 for resonance frequency adjustment and the distributed constant line 307. Another end of the coil 311 is connected to a frequency band switching power supply terminal 310 to which frequency band switching voltage VS, which is a second voltage, is supplied. Grounding is establishing from the foregoing point through capacitors 312 and 313. The capacitors 312 and 313, similarly to the capacitors 302 and 303, comprise capacitors having different characteristics so as to completely establish a bypass to prevent outward leakage of the high-frequency component and prevent mixture of noise from outside.

The operation of the foregoing structure of FIG. 28 will now be described. When a grounded potential or negative potential is, as the voltage VS for switching the frequency band, applied to the power supply terminal 310 for switching the frequency band to determine the oscillation frequency band, the switching diode 308 is not electrically conducted. Therefore, the other end of the distributed constant line 307 is equivalently opened. As a result, the resonance circuit including the distributed constant line 307 resonates at high frequency band, similarly to the embodiment shown in FIG. 27, basically in the ½ wavelength mode because the end of the distributed constant line 307 has been opened. Thus, the oscillation circuit including the transistor 302 resonates. When the voltage VT for varying frequency applied to the voltage terminal 301 for varying frequency is applied to the varactor diode 305, which is the varactor device, so that the oscillation frequency is precisely adjusted. The oscillation output oscillated by the oscillation circuit including the transistor 320 is transmitted from the buffer circuit due to the transistor 328 through the output terminal 331.

Then, frequency band switching voltage VS for turning on the switching diode 308 is applied to the frequency band switching power supply terminal 310. The switching diode 308, which has been turned on with the voltage VS for switching the frequency band allowed to pass through the distributed constant line 307, causes the other end of the distributed constant line 307 to be grounded. Since another end of the distributed constant line 307 is grounded, the resonance circuit including the distributed constant line 307 resonates a low frequency band which is half basically relative to the ¼ wavelength mode. The oscillation circuit including the transistor 320 oscillates. When the voltage VT for varying frequency applied to the frequency-varying voltage terminal 301 is applied to the varactor diode 305 similarly to the foregoing structure, the equivalent capacity of the varactor diode 305 is changed. Thus, the oscillation frequency is precisely adjusted. In this embodiment, the capacitor 309 can be omitted if the resonance frequency can be determined by the varactor diode 305 and the distributed constant line 307.

Note that the switching diode 308 may be replaced by another switching device capable of acting equivalently, for example, a FET. In the foregoing case, the voltage for controlling the switching of the frequency band is not allowed to pass through the distributed constant line but is applied to the gate terminal.

FIG. 31 shows a third embodiment of a VCO with controllable frequency band according to the present invention, which is a view of explanatory showing the combination of distributed constant lines. In FIG. 31(a), the distributed constant line is sectioned into portions 307a and 307b having different lengths. A switch 315a is disposed between the portions 307a and 307b. Another end is, in an AC manner, grounded. When the switch 315a is switched on, a distributed constant line is formed which has a grounded end and which resonates in the ¼ wavelength mode in such a manner that the length is $L_1+L_2$, as shown in FIG. 31(b). When the switch 315a is switched off, a distributed constant line is formed which resonates in the ½ wavelength mode in such a manner that the length is $L_1$ as shown in FIG. 31(c). When the circuit shown in FIG. 31(a) is connected in place of the distributed constant line 307 in the circuit shown in FIG. 27 to select appropriate lengths $L_1$ and $L_2$, the frequency band is not limited to 1:2. The freedom of the resonance frequency band can be raised.

In the structure shown in FIG. 31(a), one switch is connected between two distributed constant lines. If the number of division of the distributed constant line and that of the switches are increased, three or more frequency bands can be selected. In the foregoing case, the other end of the distributed constant line is not required to be grounded.

If the circuit shown in FIG. 31(a) is employed as the distributed constant line for the circuit shown in FIG. 28 and a diode 308 is provided in place of the switch 315a, the foregoing operation can be realized in the circuit shown in FIG. 28. In the foregoing case, since the diode is able to select only two frequency bands, a switching device, such as an FET, is employed to be capable of selecting three or more frequency bands.

FIG. 32 shows a fourth embodiment of a VCO with controllable frequency band according to the present invention, which is a view of explanatory showing combination of distributed constant lines. Referring to FIG. 32(a), the structure is arranged in such a manner that the length is $L_1+L_2$ and ground can be established at a position of length $L_1$ from an end by a switch 315b. When the switch 315b is switched on, a distributed constant line having a length of $L_1$ and resonating in the ¼ wavelength mode is formed as shown in FIG. 32(b). When the switch 315a is switched off, a distributed constant line is formed which has a length of $L_1+L_2$ and which resonates in the ½ wavelength mode as shown in FIG. 32(c). If the circuit shown in FIG. 32(a) is connected in place of the distributed constant line 307 in the circuit shown in FIG. 27 to appropriately select the lengths of $L_1$ and $L_2$, the frequency band is not limited to 1:2, but freedom of the resonance frequency band to which switching can be performed is improved.

If the circuit shown in FIG. 32(a) is employed as the distributed constant line for the circuit shown in FIG. 28 and a diode 308 is provided in place of the switch 315a, the foregoing operation can be realized in the circuit shown in FIG. 28.

Although the structure shown in FIG. 32(a) comprises one switch connected at an intermediate position in one distributed constant line, increase in the number of switches so as to be alternately switched on enables three or more frequencies to be selected. In the foregoing case, a combination in which the other end of the distributed constant line is grounded is not required. Since the diode is able to select only two frequency bands, a switching device, such as an FET, is employed to enable three or more frequency bands to be selected.

Although one switch is connected at an intermediate position of one distributed constant line in the structure shown in FIG. 32(a), one switch may be connected at an intermediate position between two distributed constant lines to obtain a similar effect.

Figure 33:
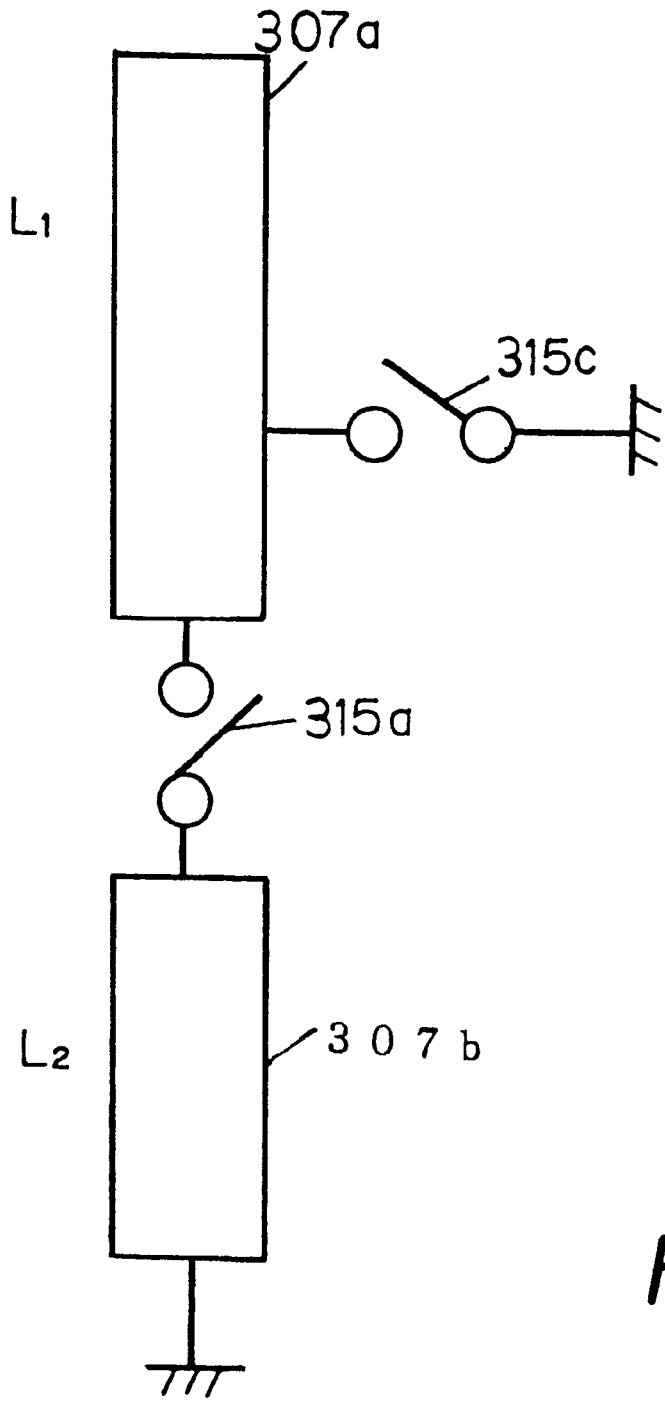
FIG. 33 is a view of explanatory showing combination of distributed constant lines according to a fifth embodiment of the multi-frequency band VCO.
Figure 34:
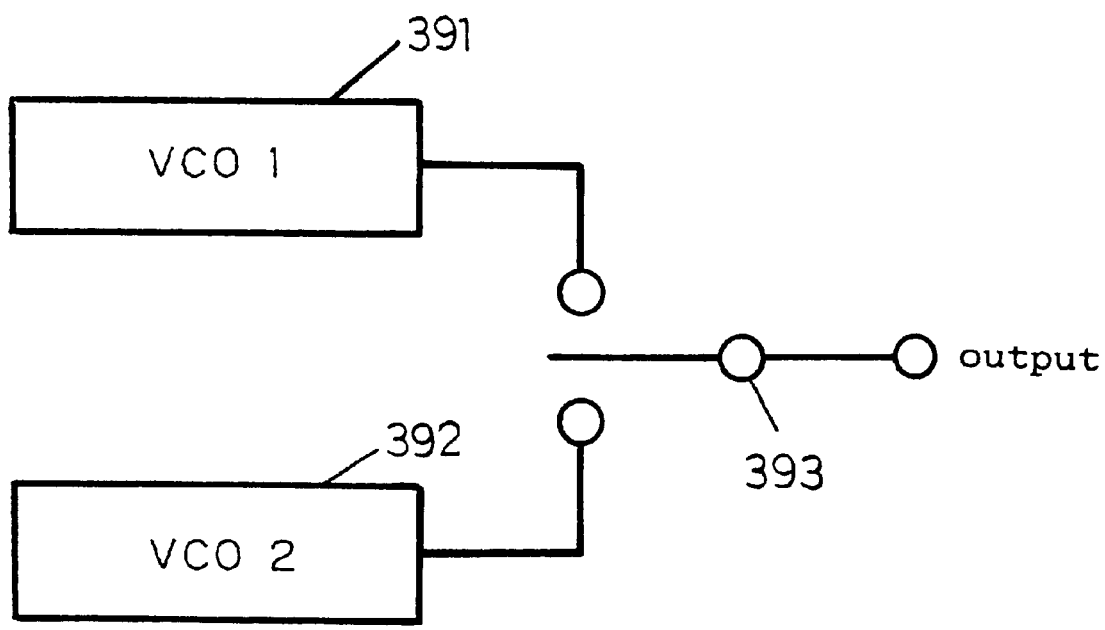
FIG. 34 is a block diagram showing a conventional multi-frequency band VCO.

FIG. 33 shows a fifth embodiment of a VCO with controllable frequency band according to the present invention, which is a view of explanatory showing combination of distributed constant lines. Referring to FIG. 33, the structure is arranged in such a manner that ground can be established from an intermediate position of the distributed constant line 307a or 307b shown in FIG. 31(a) by a switch 315c. When both of the switches 315a and 315c are turned off or either of the switch 315a or the switch 315c is turned on, switching to three frequency bands can be performed. By further increasing the switches, the number of frequency bands to which switch is permitted can be increased. The foregoing advantage can be obtained by increasing the number of the switches in the circuit shown in FIG. 32(a).

Note that a switching device, such as an FET, may be employed in place of the switch 315a or 315c according to this embodiment. By controlling the gate potential of these transistors, connection, disconnection, grounding, opening of the distributed constant lines can arbitrarily be switched.

According to each of the embodiments shown in FIGS. 27 and 28, the switch or the switching diode disposed at the other end of the distributed constant line is switched on or off to switch the resonance mode of the distributed constant line from ½ wavelength to ¼ wavelength. Thus, the VCO with controllable frequency band can be realized while necessitating a simple structure.

According to each of the embodiments shown in FIGS. 31 and 32, when the switch or the switching diode disposed between distributed constant line divided into at least two sections is switched on and off, or when the switch or the switching diode disposed so as to be grounded from an intermediate position of one distributed constant line is switched on or off, the length of the distributed constant line can be changed and the resonant mode can be switched from ½ wavelength to ¼ wavelength while necessitating a simple structure. Thus, the VCO with controllable frequency band exhibiting improved freedom in setting the frequency band can be realized.

According to the embodiment shown in FIG. 33, by combining the embodiments shown in FIGS. 31 and 32 with each other or by switching on or off two or more switches, the VCO capable of switching three or more frequency bands can be realized.

The structures of the portions including the resonance circuits, the oscillation circuits and surrounding circuits shown in FIGS. 27 and 28 are not limited to the illustrated structures. Modifications and combinations within the scope of the predetermined may be permitted. Although the description has been made about the structure in which the capacitor, the varactor diode and the switching diode are directly grounded, they may, of course, be grounded in an AC manner.

The varactor diode and the switching diode may be replaced by other devices performing equivalent operations. For example, the switching diode 308 may be replaced by a FET. In the foregoing case, the frequency band switching control voltage is applied without being allowed to pass through the distributed constant line.

Although the foregoing embodiments have been described about the structure in which both of the first local oscillation circuit and the second local oscillation circuit are the VCO capable of switching two-frequency bands, a VCO capable of switching three or more frequency bands may be employed in the case where the number of frequency bands intended to be used is large.

As described above, the VCO with controllable frequency band according to the present invention enables the size of the circuit, the required space, the cost to be reduced. Thus, the VCO with controllable frequency band can be manufactured with low cost.

Figure 35:
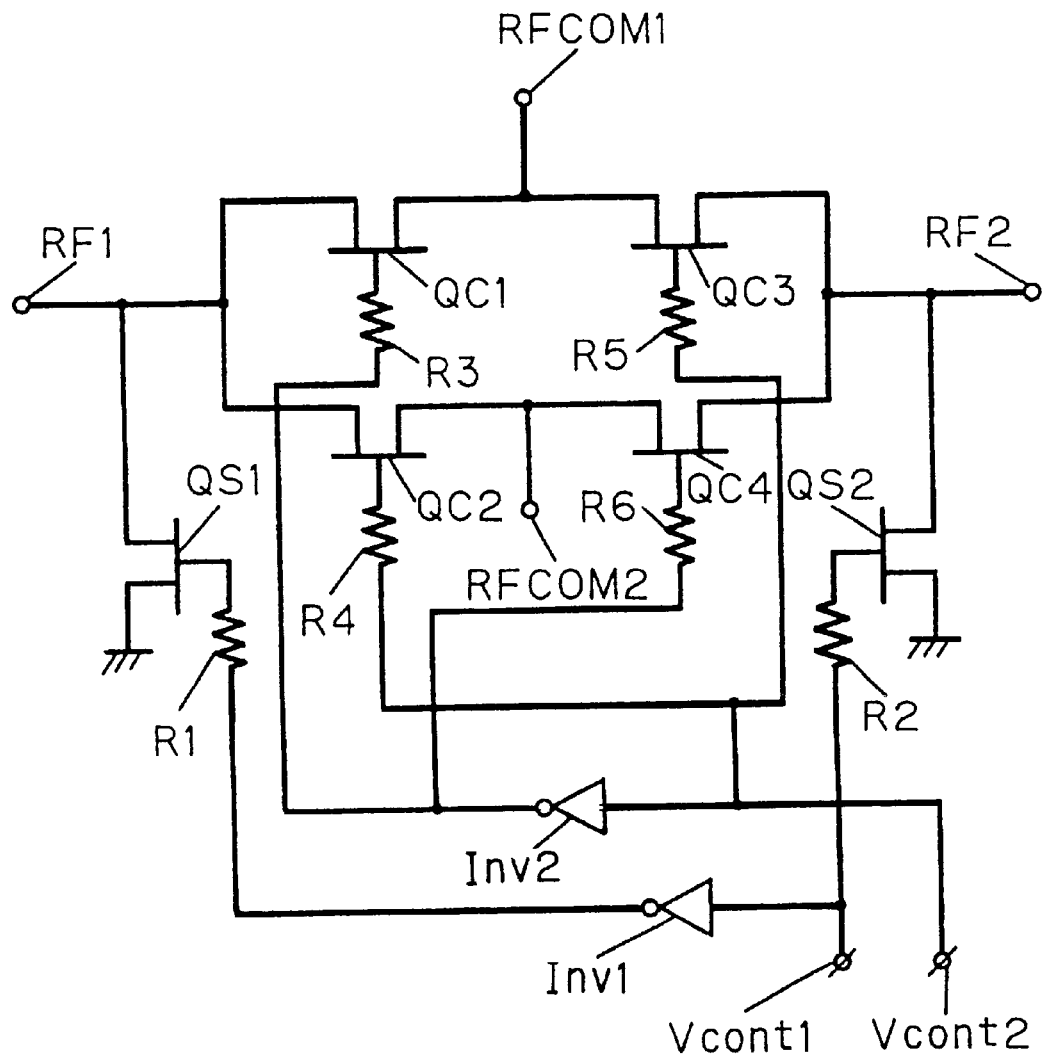
FIG. 35 is a circuit diagram showing a first embodiment of a two-terminal to multi-common terminal matrix switch according to the present invention.

FIG. 35 is a circuit diagram showing a first embodiment of a two-terminal to multi-common terminal matrix switch according to the present invention. In FIG. 35, every transistor is a FET. A first terminal RF1 is connected to the drains of a first short-circuiting transistor QS1, a first connecting transistor QC1 and a second connecting transistor QC2. A second terminal RF2 is connected to the drains of a second short-circuiting transistor QS2, a third connecting transistor QC3 and a fourth connecting transistor QC4. The sources of the transistor QC1 and QC3 are connected to a common terminal RFCOM1. The sources of the transistor QC2 and QC4 are connected to a second common terminal RFCOM2. The sources of the transistors QS1 and QS2 are grounded.

A first control terminal Vcont1 is connected the gate of the transistor QS2 through a resistor R2 and the gate of the transistor QS1 through an invertor Inv1 and a resistor R1. A second control terminal Vcont2 is connected to the gate of the transistor QC2 through a resistor R4, the gate of transistor QC3 through a resistor R5, the gate of transistor QC1 through an invertor Inv2 and a resistor R3, and the gate of the transistor QC4 through the invertor Inv2 and a resistor R6.

The foregoing connection will be described in a different manner. The first and second short-circuiting transistors QS1 and QS2 are disposed between the ground and each of the first and second input terminals RF1 and RF2. Between the first terminal RF1 and the first common terminal RFCOM1, between the first terminal RF1 and the second common terminal RFCOM2, between the second terminal RF2 and the first common terminal RFCOM1, and between the second terminal RF2 and the second common terminal RFCOM2, the first connecting transistors QC1 to the fourth connecting transistors QC4 are connected in the form of a bridge, respectively.

The first control terminal Vcont1 is connected to the gate of either of the first and second short-circuiting transistors QS1 and QS2. In this case, the first control terminal Vcont1 is connected to the transistor QS2 and connected to the other transistor QS1 through the invertor Inv1. The second control terminal Vcont2 is connected to, for example, the gates of transistors QC2 and QC3 among the first to fourth connecting transistors disposed at opposite ends of the bridge. The second control terminal Vcont2 is, through invertor Inv2, connected to the gates of the transistors QC1 and QC4 disposed at other opposite ends of the bridge.

The operation of the foregoing structure will now be described with reference to FIG. 36, which is an equivalent circuit to that shown in FIG. 35, and to Table 2 showing application of control voltage and the operation of the circuit.

TABLE 2

|  | Vcont1 | |
|---|---|---|
| Vcont2 | H | L |
| H | RF1 ←→ RFCOM2 | RF2 ←→ RFCOM1 |
| L | RF1 ←→ RFCOM1 | RF2 ←→ RFCOM2 |

Through first and second control terminals Vcont1 and Vcont2, high (H) or low (L) level potential is applied as control voltage.

If high level potentials are applied to the first control terminal Vcont1 and second control terminal Vcont2, the transistor QS2 is turned on due to the high potential applied to the first control terminal Vcont1 because the FET is turned on when the gate has high potential. The transistor QS1 is turned off by the invertor Inv1. The low potential applied to the second control terminal Vcont2 causes the transistors QC2 and QC3 to be turned on. Since the polarity is inverted due to passing through the invertor Inv2, the transistors QC1 and QC4 are turned off. As a result, a state of the equivalent circuit shown in FIG. 36 is realized so that a signal received through the first terminal FR1 is connected to only the second common terminal RFCOM2 so as to be transmitted from the second common terminal RFCOM2. A signal received through the second terminal RF2 is grounded because the transistor QS2 has been turned on so that transmission of the signal to another common terminal is inhibited.

Figure 36:
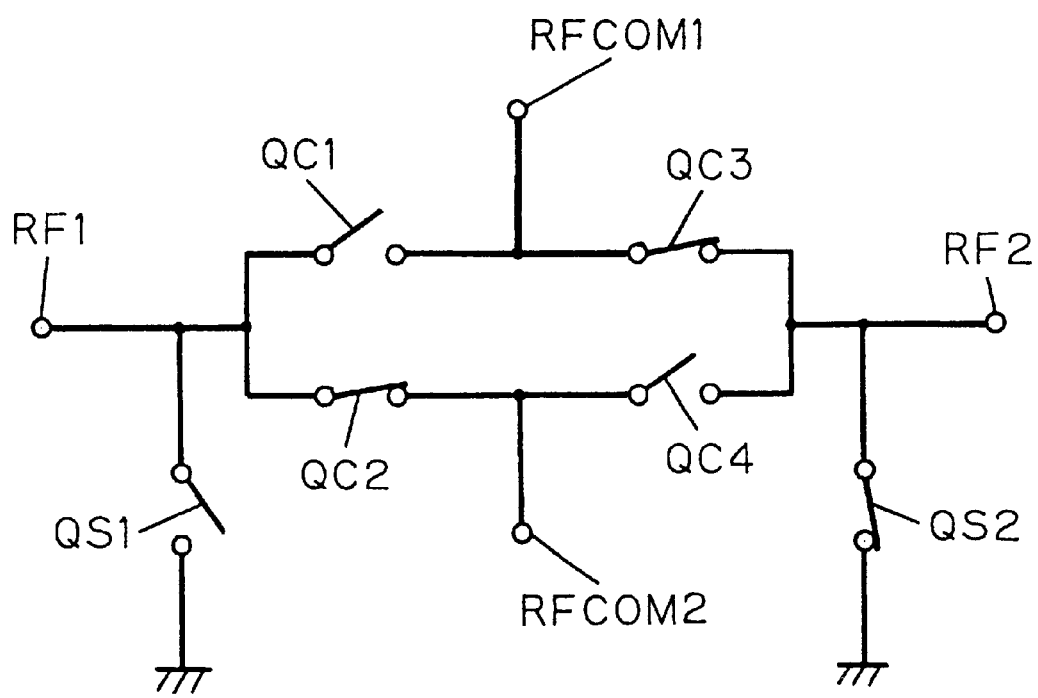
FIG. 36 is an equivalent circuit diagram of FIG. 35.

When low potentials are applied to both the first control terminal Vcont1 and the second control terminal Vcont2, all FETs are brought to states opposite to those shown in FIG. 36 because an a FET is turned off when the gate is has low potential. Thus, a signal received through the second terminal RF2 is connected to only the second common terminal RFCOM2 so as to be transmitted from the second common terminal RFCOM2. A signal received through the first terminal FR1 is grounded because the transistor QS1 has been turned on so that transmission of the signal to another common terminal is inhibited.

Figure 42:
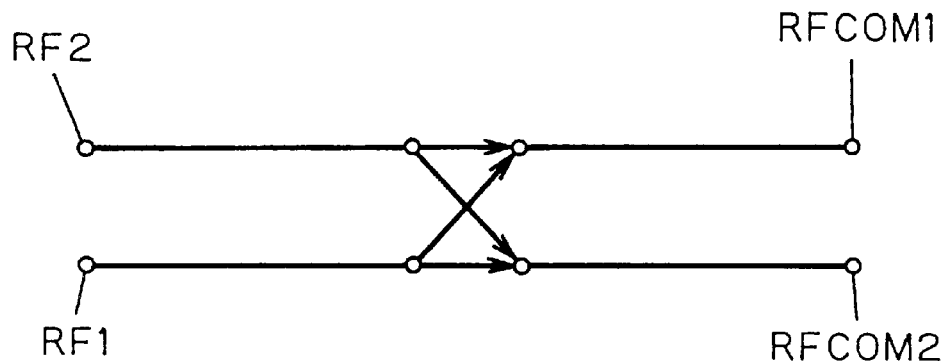
FIG. 42 is an equivalent circuit diagram of the matrix switch shown in FIG. 40.

When potentials to be applied to the first and second control terminals Vcont1 and Vcont2 are set to be L and H or H and L, conduction as shown in Table 2 is performed. As a result, the operation as a two-terminal to two common terminal matrix switch can be performed in which the connection between any one of the terminals (RF1, RF2) and any one of the two common terminals (RFCOM1, RFCOM2) are individually established by one pair only, as is performed in the equivalent circuit shown in FIG. 42. The foregoing flow of the signal may be inverted.

The general FET has been employed in the description. In a case where a gallium arsenide FET GaAsFet is employed as the FET, grounded potential is applied as the high potential and negative potential sufficient to pinch off the channel is applied as the low potential. In a case where a metal oxide FET (MOSFET) is used, grounded potential is applied as the low potential and a positive potential capable of sufficiently forming the channel is applied as the high potential. As a result, the foregoing effect can be obtained.

Figure 40:
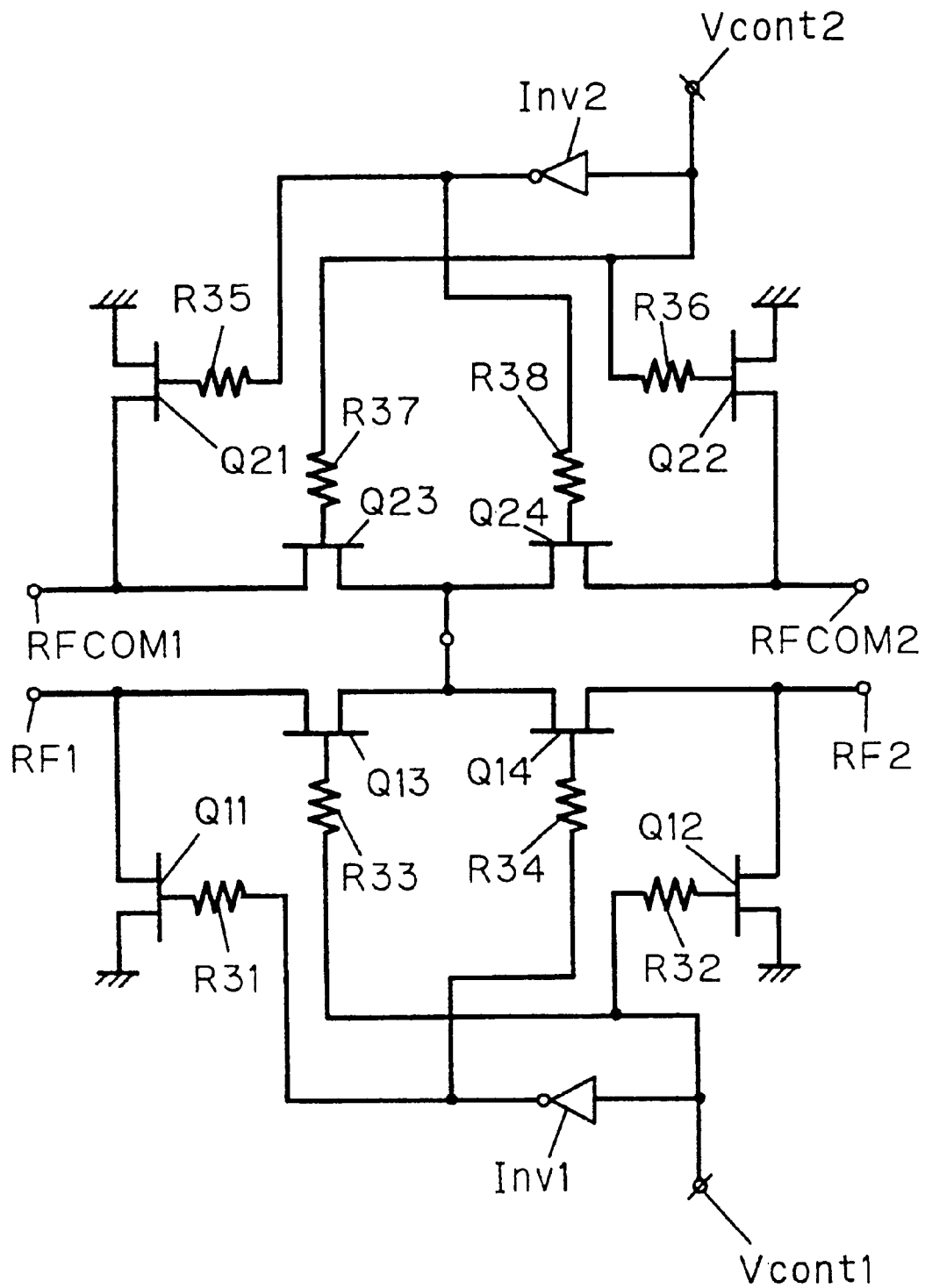
FIG. 40 is a circuit diagram showing a conventional two-terminal to two common terminal matrix switch.
Figure 41:
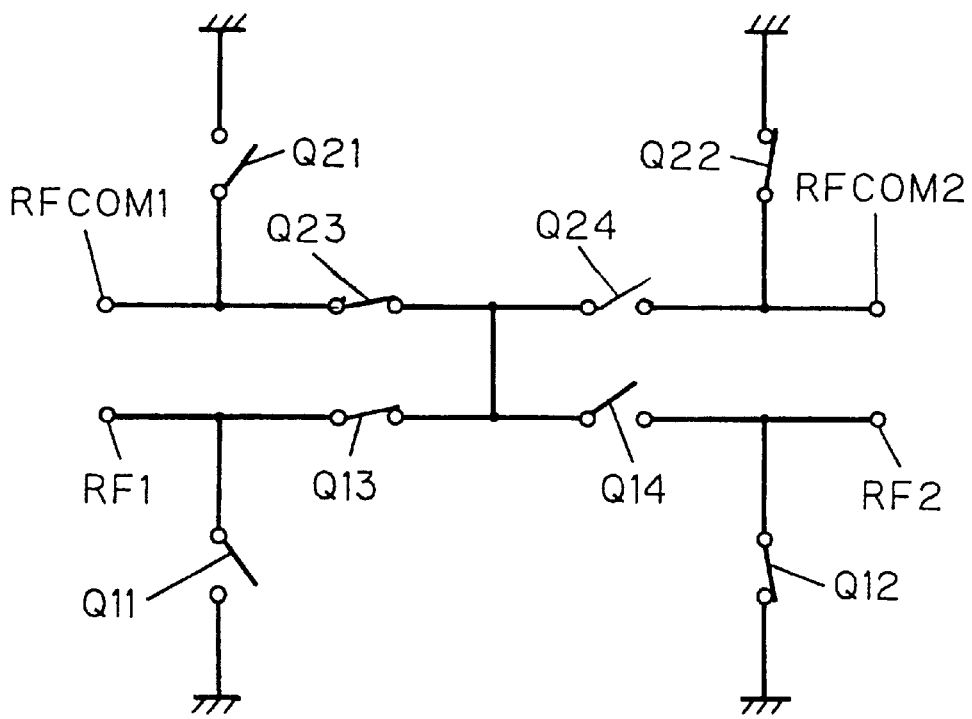
FIG. 41 is an equivalent circuit diagram of FIG. 40.

As described above, since this embodiment has the structure as shown in FIG. 35, two transistors and two resistors can be decreased as compared with the conventional structure shown in FIG. 40. Thus, the structure of the circuit can be simplified.

A second embodiment of a two-terminal to multi-common terminal matrix switch according to the present invention will now be described with reference to FIG. 37, which is a circuit diagram and Table 3 which shows the operation of each section of the circuit with respect to the control potential of the control terminal.

TABLE 3

| Vcont 11 INPUT | Vcont 12 INPUT | Vcont 13 INPUT | AND1 OUTPUT | AND2 OUTPUT | AND3 OUTPUT | GS 11 | GS 12 | GC 11 | GC 12 | GC 13 | GC 14 | GC 15 | GC 16 | "ON" TERMINAL |
|---|---|---|---|---|---|---|---|---|---|---|---|---|---|---|
| L | H | H | H | L | L | H | L | L | H | H | H | L | L | RF2-RFCOM1 |
| H | L | H | L | H | L | H | L | H | L | H | L | H | L | RF2-RFCOM2 |
| H | H | L | L | L | H | H | L | H | H | L | L | L | H | RF2-RFCOM3 |
| H | L | L | L | L | L | L | H | H | L | L | L | H | H | RF1-RFCOM1 |
| L | H | L | L | L | L | L | H | L | H | L | H | L | H | RF1-RFCOM2 |
| L | L | H | L | L | L | L | H | L | L | H | H | H | L | RF1-RFCOM3 |

Figure 37A:
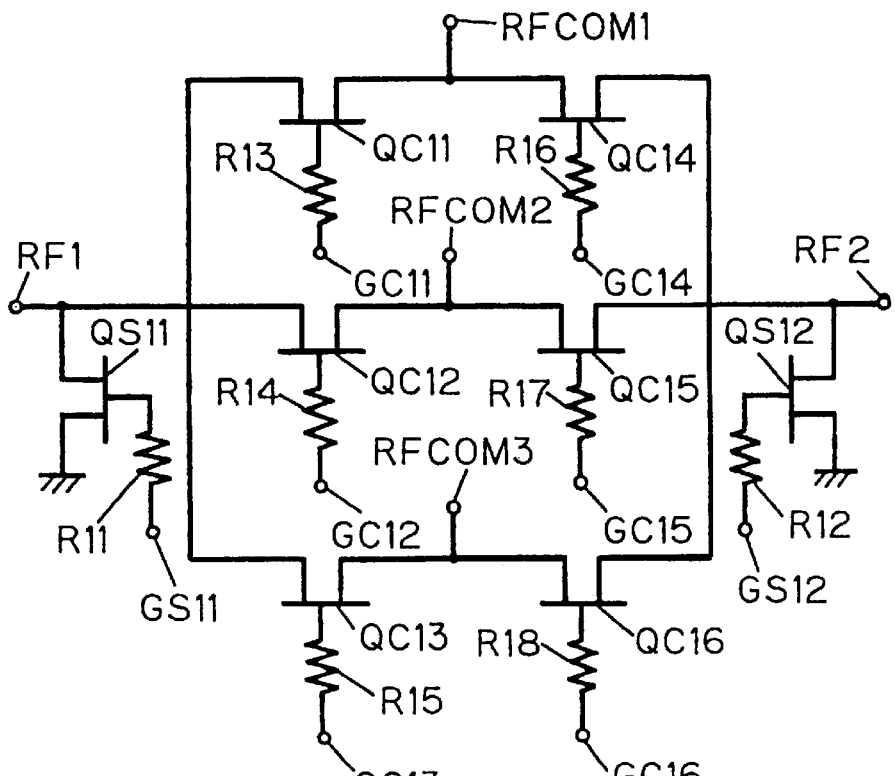
FIG. 37 is a circuit diagram showing a second embodiment of the two-terminal to multi-common terminal matrix switch according to the present invention.
Figure 37B:
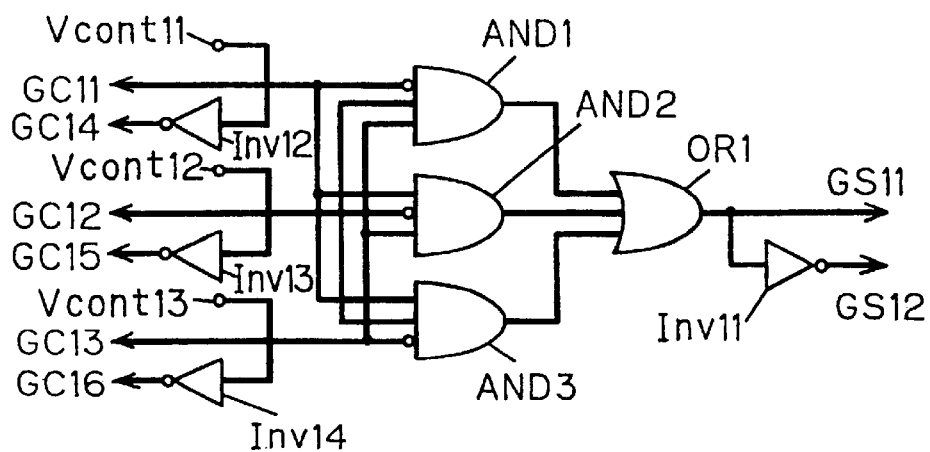

FIG. 37(a) shows a transistor matrix portion, and FIG. 37(b) shows a control circuit portion. In FIG. 37(a), all of the transistors are FETs similarly to the embodiment shown in FIG. 35. Referring to FIG. 37(a), a first terminal RF1 is connected to the drains of a first short-circuiting transistor QS11, a first connecting transistor QC11, a second connecting transistor QC12 and a third connecting transistor QC13. A second terminal RF2 is connected to the drains of a second short-circuiting transistor QS12, a fourth connecting transistor QC14, a fifth connecting transistor QC15 and a sixth connecting transistor QC16. The sources of the transistors QC11 and QC14 are connected to a first common terminal RFCOM1. The sources of the transistors QC12 and QC15 are connected to a second common terminal RFCOM2. The sources of the transistors QC13 and QC16 are connected to third common terminal RFCOM3. The sources of the transistor QS11 and QS12 are grounded, respectively. The gates of the transistors QS11 and QS12 are, through resistors R11 and R12, connected to terminals GS11 and GS12. The gates of the transistors QC11 to QC16 are, through resistors R13 to R18, connected to terminals G11 to GC16.

Referring to FIG. 37(b), each of three AND circuits AND1, AND2 and AND3 has three inputs including an inversion input. A first control terminal Vcont11 is connected to the inversion input of the AND circuit AND1, the inputs of AND2 and AND3, a terminal GC11, and a terminal GC14 through an invertor Inv12. A second control terminal Vcont12 is connected to the inversion input of the AND circuit AND2, the inputs of the AND1 and AND3, a terminal GC12, and a terminal GC15 through an invertor Inv13, as illustrated. A third control terminal Vcont13 is connected to the inversion input of the AND circuit AND3, the inputs of AND1 and AND2, a terminal GC13, and a terminal GC16 through an invertor Inv14. The outputs from the AND circuit AND1 to AND3 are supplied to an OR circuit OR1. The output from the OR circuit OR1 is connected to the terminal GS11 and to the terminal GS12 through an invertor Inv11.

of sufficiently pinching off the channel is applied as the low potential. When a MOSFET is employed, grounded potential is applied as the low potential and positive potential capable of sufficiently forming a channel is applied. Thus, the foregoing effect can be obtained.

A third embodiment of a two-terminal to multi-common terminal matrix switch according to the present invention will now be described with reference to FIG. 38, which is a circuit diagram, and to Table 4 showing the operation of each section of the circuit with respect to the control potential of the control terminal.

TABLE 4

| Vcont 21 INPUT | Vcont 22 INPUT | Vcont 23 INPUT | Vcont 24 INPUT | AND1 OUT- PUT | AND2 OUT- PUT | AND3 OUT- PUT | AND4 OUT- PUT | GS 21 | GS 22 | GC 21 | GC 22 | GC 23 | GC 24 | GC 25 | GC 26 | GC 27 | GC 28 | "ON" TERMINAL |
|---|---|---|---|---|---|---|---|---|---|---|---|---|---|---|---|---|---|---|
| L | H | H | H | H | L | L | L | H | L | L | H | H | H | H | L | L | L | RF2-RFCOM1 |
| H | L | H | H | L | H | L | L | H | L | H | L | H | H | L | H | L | L | RF2-RFCOM2 |
| H | H | L | H | L | L | H | L | H | L | H | H | L | H | L | L | H | L | RF2-RFCOM3 |
| H | H | H | L | L | L | L | H | H | L | H | H | H | L | L | L | L | H | RF2-RFCOM4 |
| H | L | L | L | L | L | L | L | L | H | H | L | L | L | L | H | H | H | RF1-RFCOM1 |
| L | H | L | L | L | L | L | L | L | H | L | H | L | L | H | L | H | H | RF1-RFCOM2 |
| L | L | H | L | L | L | L | L | L | H | L | L | H | L | H | H | L | H | RF1-RFCOM3 |
| L | L | L | H | L | L | L | L | L | H | L | L | L | H | H | H | H | L | RF1-RFCOM4 |

The operation of the foregoing structure will now be described. When low, high and high potentials are applied to the control terminals Vcont11 to Vcont13 as shown in Table 3, only the high potential output can be obtained from the AND circuit AND1. Low potential outputs are obtained from the AND circuits AND2 and AND3. Thus, the terminal GS11 is made to be high potential and the terminal GS12 is made to be low potential. As a result, the transistor QS11 is conducted so that the input from the first terminal RF1 is grounded. The transistor QS12 is made to be non-conductive so that the input from the second terminal RF2 is received. The terminal GC14 is made to be high potential and the transistor QC14 is turned on so that the second terminal RF2 and the first common terminal RFCOM1 are connected to each other. Since the terminals GC15 and GC16 have low potentials, the transistors QC15 and QC16 are turned off so that no connection is established to the other common terminals. The terminals GC12 and GC13 are made to have high potentials so that the transistors QC12 and QC13 are turned on. Since the first terminal RF1 has been grounded as described above, no signal is transmitted to the second and third common terminals.

As described above, only one of the potentials to be applied to the first to third control terminals Vcont1 to Vcont3 is made to be low and the other potentials are made to be high or only one of the potentials is made to be high and the other potentials are made to be low. As a result, the potential of each section is changed as shown in Table 3 so that conduction is established as illustrated. As a result, the operation as the two-terminal to three common terminal matrix switch can be performed in which the connection between any one of the two terminals (RF1, RF2) and any one of the three common terminals (RFCOM1 to RFCOM3) is independently established by one pair only. The flow of the signal may be inverted to the foregoing description.

Similarly to the embodiment shown in FIG. 35, when a GaAaFet is employed as the FET, grounded potential is applied as the high potential, and negative potential capable FIG. 38(a) shows a transistor matrix portion, and FIG. 38(b) shows a control circuit portion. In FIG. 38(a), all of the transistors are FETs similarly to the embodiment shown in FIG. 35.

Referring to FIG. 38(a), the first and second terminals RF1 and RF2, the first to third common terminals RFCOM1 to RFCOM3, the first and second short-circuiting transistors QS21 and QS22, the first to third connecting transistors QC21 to QC23 and the fifth to seventh connecting transistors QC25 to QC27 are similar to the corresponding portions according to the embodiment shown in FIG. 37(a). The difference from the embodiment is that a fourth common terminal RFCOM4 is added and fourth and eighth connecting transistors QC24 and QC28 having sources connected to the fourth common terminal RFCOM4 are added.

The structure shown in FIG. 38(b) is different from the embodiment shown in FIG. 37(b) in that each of AND circuits AND21 to AND24 has four inputs including an inversion input and a fourth control terminal Vcont24 and an invertor Inv25 are added. The other portions are similar to those according to the embodiment shown in FIG. 37(b).

The operation of the foregoing structure will now be described. When low, high, high and high level potentials are applied to the control terminals Vcont21 to Vcont24 as shown in Table 4, high potential output can be obtained from only the AND circuit AND21 and low potential outputs are obtained from the AND circuits AND22, AND23 and AND24. Therefore, the terminal GS21 is made to be high level and the terminal GS22 is made to be low level. The transistor QS21 is conducted so that the input through the first terminal RF1 is grounded. The transistor QS22 is made to be non-conductive so that the input through the second terminal RF2 is received. The terminal GC25 is made to be high potential and the transistor QC25 is turned on so that the second terminal RF2 and the first common terminal RFCOM1 are connected to each other. Since the terminals GC26, GC27 and GC28 have low potentials, the transistors QC26, QC27 and QC28 are turned off so that no connection to another common terminal is established. The terminals GC22, GC23 and GC24 are made to be high potentials so that the transistors QC22, QC23 and QC24 are turned on. Since the first terminal RF1 is grounded as described above, no signal is transmitted to the second, third and fourth common terminals RFCOM2 to RFCOM4.

As described above, only one of the potentials to be applied to the first, second, third and fourth control terminals Vcont21 to Vcont24 is made to be low and the other potentials are made to be high or only one potential is made to be high and the other potentials are made to be low. Thus, the potential of each section is changed as shown in Table 4 so that conduction as shown in Table 4 is performed. As a result, the operation as the two-terminal to four common terminal matrix switch can be performed in which the connection between any one of the two terminals (RF1, RF2) and any one of the four common terminals (RFCOM1 to RFCOM4) is independently established by one pair only. The flow of the signal may be inverted to the foregoing description.

In the case where a GaAsFet is employed as the FET similarly to the embodiments shown in FIGS. 35 and 37, grounded potential is applied as the high potential and negative potential sufficient to pinch off the channel is applied as the low potential. In a case where a MOSFET is used, grounded potential is applied as the low potential and positive potential capable of sufficiently forming the channel is applied as the high potential. As a result, the foregoing effect can be obtained.

As described above, each of the embodiments shown in FIGS. 35 and 37 has the structure such that either of the first terminal or the second terminal is grounded by the short-circuiting transistor. A control circuit for controlling the gate of the connecting transistor to establish the connection between either of the first terminal or the second terminal, which has not been grounded, and any one of k ($1 \leq k \leq n$) common terminals so that the operation of a two-terminal to n common terminal matrix switch is performed in which the connection between any one of two terminals (RF1, RF2) and any one of n common terminals (RFCOM1 to RFCOMn) is independently established by one pair only. If n is 4 or more, the control circuits and control terminals of the control circuit are required to be increased as can be understood from the difference between the structures shown in FIGS. 37 and 38.

Figure 39:
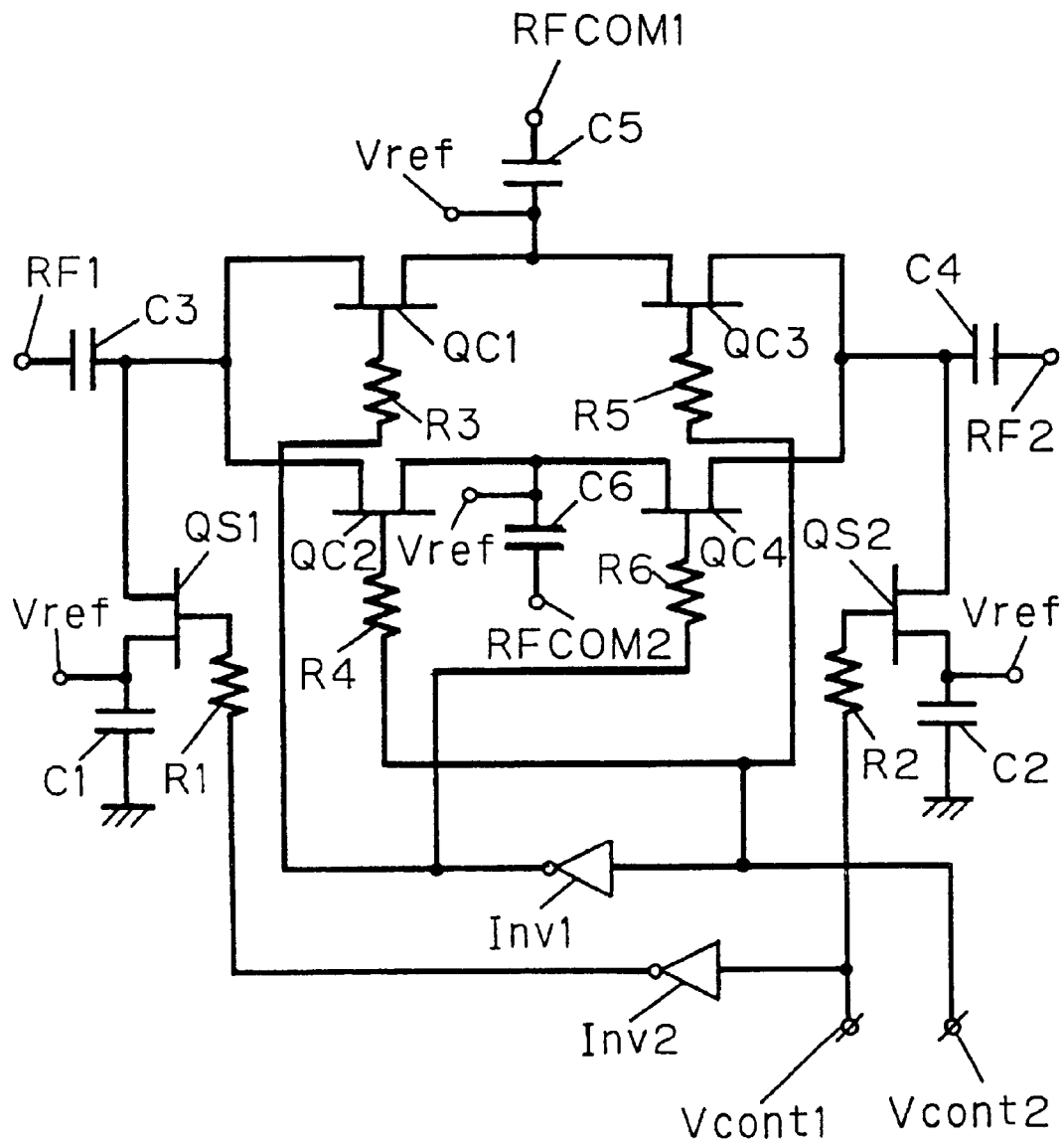
FIG. 39 is a circuit diagram showing a fourth embodiment of the two-terminal to multi-common terminal matrix switch according to the present invention.

FIG. 39 is a circuit diagram showing a third embodiment of a two-terminal to multi-common terminal matrix switch according to the present invention. The difference between the two-terminal to two-common terminal matrix switch shown in FIG. 39 and that shown in FIG. 35 is that a DC cut capacitor is disposed among each terminal, the source of each connecting transistor and the ground. Moreover, Vref for supplying reference voltage is added to the source of each connecting transistor and the source of the short-circuiting transistor.

As a result of the foregoing structure, the reference value of the gate voltage for controlling switching of the transistor can be changed relatively with the level of Vref. If a GaAsFET is employed as the FET, grounded potential is required as the high potential and negative potential is required as the low potential. If the positive portion having the same absolute value as the negative potential used as the low potential is applied as Vref in the foregoing structure, use of grounded potential as the low potential and the positive potential, which is the same as Vref, as the high potential enables a similar operation to be performed.

The foregoing structure may, of course, be applied to a two-terminal to multi-terminal matrix switch not less than three terminals.

Although the embodiment has been described about the gallium arsenide FET and the metal oxide FET, the transistor is not limited to the foregoing type. Any transistor having a desired performance may be employed regardless of the material and the structure.

The control circuit is not limited to the described control circuit. For example, a microcomputer may be employed with which similar potentials of the control signals are applied to short-circuiting and connecting transistors. In the foregoing case, control can be performed such that only one. connecting transistor is conducted in, for example, the embodiment shown in FIG. 35. Use of the microcomputer is advantageous as the number n of the common terminals increases.

As described above, according to the two-terminal to multi-common terminal matrix switch according to the present invention, the number of the devices can be reduced to perform a similar operation, the transmission loss can be reduced, and addition of additional circuits enables switching to plural common terminals.

What is claimed is:

1. A time division multiple access FDD wireless unit, comprising:

first oscillation means for producing a first reference signal at a first reference frequency;

first received signal conversion means for converting a first frequency for a received signal to a second frequency for the received signal, the second frequency for the received signal being equal to a difference between the first frequency for the received signal and the first reference frequency of the first reference signal output by said first oscillation means;

second received signal conversion means for converting the second frequency for the received signal to a third frequency for the received signal, the third frequency for the received signal being equal to a sum of or a difference between the second frequency for the received signal output by said first received signal conversion means and a second reference frequency of a second reference signal;

modulation means for modulating a transmission signal at a first frequency for the transmission signal, the first frequency for the transmission signal being equal to a third reference frequency of a third reference signal;

transmission signal conversion means for converting the first frequency for the transmission signal to a second frequency for the transmission signal, the second frequency for the transmission signal being equal to a sum of the first frequency for the transmission signal output by said modulation means and the first reference frequency of the first reference signal output by said first oscillation means, the second frequency for the transmission signal output by said transmission signal conversion means being different from the first frequency for the received signal, and the second and third reference frequencies being such that
the second reference frequency of the second reference signal is produced by a second oscillation means and the third reference frequency of the third reference signal is obtained by multiplying or dividing the second reference frequency of the second reference signal by a first predetermined value, or
the third reference frequency of the third reference signal is produced by said second oscillation means and the second reference frequency of the second reference signal is obtained by multiplying or dividing the third reference frequency of the third reference signal by a second predetermined value.

2. The time division multiple access FDD wireless unit according to claim 1, further including:

first switching means for switching the first reference signal output by said first oscillation means to said first received signal conversion means when receiving the received signal, and for switching the first reference signal output by said first oscillation means to said transmission signal conversion means when transmitting the transmission signal, and second switching means for supplying the second reference signal having the second reference frequency to said second received signal conversion means when receiving the received signal, and for supplying the third reference signal having the third reference frequency to said modulation means when transmitting the transmission signal.

3. A time division multiple access FDD wireless unit, comprising:

first oscillation means for producing a first reference signal at a first reference frequency;

second oscillation means for producing a second reference signal at a second reference frequency;

first frequency conversion means for converting the second reference frequency of the second reference signal output by said second oscillation means to a third reference frequency of the second reference signal, the third reference frequency of the second reference signal being equal to the second reference frequency of the second reference signal multiplied or divided by n, wherein n is an integer not less than 1;

second frequency conversion means for converting the second reference frequency of the second reference signal output by said second oscillation means to a fourth reference frequency of the second reference signal, the fourth reference frequency of the second reference signal being equal to the second reference frequency of the second reference signal multiplied or divided by m, wherein m is an integer not less than 1;

first received signal conversion means for converting a first frequency for a received signal to a second frequency for the received signal, the second frequency for the received signal being equal to a difference between the first frequency for the received signal and the first reference frequency of the first reference signal output by said first oscillation means;

second received signal conversion means for converting the second frequency for the received signal to a third frequency for the received signal, the third frequency for the received signal being equal to a sum of or a difference between the second frequency for the received signal output by said first received signal conversion means and the third reference frequency of the second reference signal output by said first frequency conversion means;

modulation means for modulating a transmission signal at a first frequency for the transmission signal, the first frequency for the transmission signal being equal to the fourth reference frequency of the second reference signal output by said second frequency conversion means;

transmission signal conversion means for converting the first frequency for the transmission signal to a second frequency for the transmission signal, the second frequency for the transmission signal being equal to a sum of the first frequency for the transmission signal output by said modulation means and the first reference frequency of the first reference signal output by said first oscillation means, such that the second frequency for the transmission signal output from said transmission signal conversion means is different from the first frequency for the received signal.

4. The time division multiple access FDD wireless unit according to claim 3, wherein a difference between the second frequency for the transmission signal output by said transmission signal conversion means and the first frequency for the received signal is $\Delta f$, the second reference frequency of the second reference signal output by said second oscillation means is $fL2$, the third frequency for the received signal output by said second received signal conversion means is $fR2$, and the third reference frequency of the second reference is equal to the second reference frequency of the second reference signal multiplied by n and the fourth reference frequency of the second reference signal is equal to the second reference frequency of the second reference signal multiplied by m, such that a relationship between n and m satisfies the following formula:

$$fR2=|(m-n)fL2-\Delta f|$$

or the third reference frequency of the second reference signal is equal to the second reference frequency of the second reference signal divided by n and the fourth reference frequency of the second reference signal is equal to the second reference frequency of the second reference signal divided by m, such that a relationship between n and m satisfies the following formula:

$$fR2=|\{1/m)-(1/n)\}fL2-\Delta f|.$$

5. A time division multiple access FDD/TDD dual mode wireless unit, comprising:

first oscillation means for producing a first reference signal at a first reference frequency;

third oscillation means for producing a third reference signal at a third reference frequency;

first FDD received signal conversion means for converting a first frequency for a received signal to a second frequency for the received signal, the second frequency for the received signal being equal to a difference between the first frequency for the received signal and the first reference frequency of the first reference signal output by said first oscillation means;

second FDD received signal conversion means for converting the second frequency for the received signal to a third frequency for the received signal, the third frequency for the received signal being equal to a sum of or a difference between the second frequency for the received signal produced by said first FDD received signal conversion means and a second reference frequency of a second reference signal;

first TDD received signal conversion means for converting a first frequency for the received signal to a fourth frequency for the received signal, the fourth frequency for the received signal being equal to a difference between the first frequency for the received signal and the third reference frequency of the third reference signal output by said third oscillation means;

second TDD received signal conversion means for converting the fourth frequency for the received signal to a fifth frequency for the received signal, the fifth frequency for the received signal being equal to a sum of or a difference between the fourth frequency for the received signal produced by said first TDD received signal conversion means and a fourth reference frequency of a fourth reference signal;

modulation means for modulating a transmission signal at a first frequency for the transmission signal, the first frequency for the transmission signal being equal to the fourth reference frequency of the fourth reference signal;

selection means for selecting either of the first reference signal at the first reference frequency output by said first oscillation means or the third reference signal at the third reference freguancy output by said third oscillation means;

transmission signal conversion means for converting the first frequency for the transmission signal to a second frequency for the transmission signal, the second frequency for the transmission signal being equal to a sum of the reference frequency of the selected reference signal selected by said selection means and the first frequency for the transmission signal output by said modulation means; and system switching means for switching the received signal to said first FDD received signal conversion means when the received signal is a FDD signal, and for switching said received signal to said first TDD received signal conversion means when the received signal is a TDD signal, the second and fourth reference frequencies being such that
the second reference signal at the second reference frequency is produced by a second oscillation means and the fourth reference frequency of the fourth reference signal is obtained by multiplying or dividing the second reference frequency of the second reference signal by a first predetermined value, or
the fourth reference signal at the fourth reference frequency is produced by a fourth oscillation means and the second reference frequency of the second reference signal is obtained by multiplying or dividing the fourth reference frequency of the fourth reference signal by a second predetermined value.

6. The time division multiple access FDD/TDD dual mode wireless unit according to claim 5, further including:

a synchronous detection circuit; and frequency switching means for supplying the second reference signal at the second reference frequency to said synchronous detection means when the received signal is a FDD signal, and for supplying the fourth reference signal at the fourth reference frequency to said synchronous detection means when the received signal is a TDD signal.

7. The time division multiple access FDD/TDD dual mode wireless unit according to claim 5, further including:

a plurality of scanning antennas; and diversity switching means for switching between said plurality of scanning antennas, said diversity switching means being connected to said system switching means.

8. A time division multiple access FDD/TDD dual mode wireless unit, comprising:

first FDD received signal conversion means for converting a first frequency for a received signal to a second frequency for the received signal, the second frequency for the received signal being equal to a difference between the first frequency for the received signal and a first reference frequency of a first reference signal;

second FDD received signal conversion means for converting the second frequency for the received signal to a third frequency for the received signal, the third frequency for the received signal being equal to a sum of or a difference between the second frequency for the received signal output by said first FDD received signal conversion means and a second reference frequency of a second reference signal;

first TDD received signal conversion means for converting the first frequency for the received signal to a fourth frequency for the received signal, the fourth frequency for the received signal being equal to a difference between the first frequency for the received signal and a third reference frequency of a third reference signal;

second TDD received signal conversion means for converting the fourth frequency for the received signal to a fifth frequency for the received signal, the fifth frequency for the received signal being equal to a sum of or a difference between the fourth frequency for the received signal output by said first TDD received signal conversion means and a fourth reference frequency of a fourth reference signal;

modulation means for modulating a transmission signal at a first frequency for the transmission signal, the first frequency for the transmission signal being equal to the fourth reference frequency of the fourth reference signal;

selection means for selecting either of the first reference signal at the first reference frequency or the third reference signal at the third reference frequency;

transmission signal conversion means for converting the first frequency for the transmission signal to a second frequency for the transmission signal, the second frequency for the transmission signal being equal to a sum of the reference frequency for the reference signal selected by said selection means and the first frequency for the transmission signal output by said modulation means;

2-band frequency synthesizer for switching between and producing the first reference signal at the first reference frequency and the third reference signal at the third reference frequency; and system switching means for switching the received signal to said first FDD received signal conversion means when the received signal is a FDD signal, and for switching the received signal to said first TDD received signal conversion means when the received signal is a TDD signal.

9. The time division multiple access FDD/TDD dual mode wireless unit according to claim 8, further including:

a synchronous detection circuit; and frequency switching means for supplying the second reference signal at the second reference frequency to said synchronous detection means when the received signal is a FDD signal, and for supplying the fourth reference signal at the fourth reference frequency to said synchronous detection means when the received signal is a TDD signal.

10. The time division multiple access FDD/TDD dual mode wireless unit according to claim 8, further including:

a plurality of scanning antennas; and diversity switching means for switching between said plurality of scanning antennas, said diversity switching means being connected to said system switching means.

11. A time division multiple access FDD/TDD dual mode wireless unit, comprising;

first oscillation means for producing a first reference signal at a first reference frequency;

second oscillation means for producing a second reference signal at a second reference frequency;

first frequency conversion means for converting the second reference frequency of the second reference signal output by said second oscillation means to a third reference frequency of the second reference signal, the third reference frequency of the second reference signal being equal to the second reference frequency of the second reference signal multiplied or divided by n, wherein n is an integer not less than 1;

second frequency conversion means for converting the second reference frequency of the signal output by said second oscillation means to a fourth reference frequency of the second reference signal, the fourth reference frequency of the second reference signal being equal to the second reference frequency for the second reference signal multiplied or divided by m, wherein m is an integer not less than 1;

third oscillation means for producing a third reference signal at a fifth reference frequency;

first FDT received signal conversion means for converting a first frequency for a received signal to a second frequency for the received signal, the second frequency for the received signal being equal to a difference between the first frequency for the received signal and the first reference frequency of the first reference signal output by said first oscillation means;

second FDD received signal conversion means for converting the second frequency for the received signal to a third frequency for the received signal, the third frequency for the received signal being equal to a sum of or a difference between the second frequency for the received signal output by said first FDD received signal conversion means and the third reference frequency of the second reference signal output by said first frequency conversion means;

first TDD received signal conversion means for converting the first frequency for the received signal to a fourth frequency for the received eignal, the fourth frequency for the received signal being equal to a difference between the first frequency for the received signal and the fifth reference frequency of the third reference signal output by said third oscillation means;

second TDD received signal conversion means for converting the fourth frequency for the received signal to a fifth frequency for the received signal, the fifth frequency for the received signal being equal to a sum of or a difference between the fourth frequency for the received signal output by said first TDD received signal conversion means and the fourth reference frequency of the second reference signal output by said second frequency conversion means;

modulation means for modulating a transmission signal at a first frequency for the transmission signal, the first frequency for the transmission signal being equal to the fourth reference frequency of the second reference signal output by said second frequency conversion means;

selection means for selecting either the first reference signal having the first reference frequency output by said first oscillation means or the third reference signal having the fifth reference frequency output by said third oscillation means;

transmission signal conversion means for converting the first frequency for the transmission signal to a second frequency for the transmission signal, the second frequency for the transmission signal being equal to a sum of the reference frequency of the reference signal selected by said selection means and the first frequency for the transmission signal output by said modulation means; and system switching means for switching the received signal to said first FDD received signal conversion means when the received signal is a FDD signal, and switching the received signal to said first ADD received signal conversion means when the received signal is a TDD signal.

12. The time division multiple access FDD/TDD dual mode wireless unit according to claim 11 wherein a difference between the second frequency for the transmission signal output by said transmission signal conversion means and the first frequency of the received signal is $\Delta f$, the second reference frequency of the second reference signal output by said second oscillation means is fL2, the third frequency for the received signal output by said second FDD received signal conversion means is fR2, and the third frequency of the second reference signal is equal to the second reference frequency of the second reference signal multiplied by n and the fourth reference frequency of the second reference signal is equal to the second reference frequency of the second reference signal multiplied by m, ouch that a relationship between n and m satisfies the following formula:

$$fR2=|(m-n)fL2-\Delta f|$$

or the third frequency of the second reference signal is equal to the second reference frequency of the second reference signal divided by n and the fourth reference frequency of the second reference signal is equal to the second reference frequency for the second reference signal divided by m such that a relationship between n and m satisfies the following formula:

$$fR2=|\{1/m)-(1/n)\}fL2-\Delta f|.$$

13. The time division multiple access FDD/TDD dual mode wireless unit according to claim 11, further including an amplifier connected to an output of said transmission signal conversion means.

14. The time division multiple access FDD/TDD dual mode wireless unit according to claim 13, further including a 2-band switching low-pass filter connected to an input or an output of said power amplifying means.

15. The time division multiple access FDD/TDD dual mode wireless unit according to claim 11, further including:

a synchronous detection circuit; and frequency switching means for supplying the second reference signal at the third reference frequency output by said first frequency conversion means to said synchronous detection means when the received signal is a FDD signal, and for supplying the second reference signal at the fourth reference frequency output by said second frequency conversion means to said synchronous detection means when the received signal is a TDD signal.

16. The time division multiple access FDD/TDD dual mode wireless unit according to claim 11, further including:
   a plurality of scanning antennas; and
   diversity switching means for switching between said plurality of scanning antennas, said diversity switching means being connected to said system switching means.

* * * * *